United States Patent
Sakai et al.

(10) Patent No.: US 8,093,803 B2
(45) Date of Patent: Jan. 10, 2012

(54) ELECTRO-OPTICAL DEVICE, ELECTRONIC DEVICE, AND METHOD FOR MANUFACTURING ELECTRO-OPTICAL DEVICE

(75) Inventors: Shinri Sakai, Suwa (JP); Tsukasa Ota, Suwa (JP); Toru Nimura, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/712,789

(22) Filed: Feb. 25, 2010

(65) Prior Publication Data

US 2010/0237772 A1    Sep. 23, 2010

(30) Foreign Application Priority Data

Mar. 17, 2009 (JP) ................................ 2009-064000
Mar. 17, 2009 (JP) ................................ 2009-064001
Mar. 17, 2009 (JP) ................................ 2009-064002

(51) Int. Cl.
    *H05B 33/00* (2006.01)
(52) U.S. Cl. ....................................... 313/504; 313/506
(58) Field of Classification Search ........................ None
    See application file for complete search history.

(56) References Cited

U.S. PATENT DOCUMENTS

| | | | |
|---|---|---|---|
| 7,157,739 B2* | 1/2007 | Nimura et al. | 257/72 |
| 2005/0174043 A1* | 8/2005 | Kiguchi et al. | 313/503 |
| 2006/0113898 A1* | 6/2006 | Toyoda | 313/504 |
| 2009/0323171 A1* | 12/2009 | Gibson | 359/296 |

FOREIGN PATENT DOCUMENTS

| | | |
|---|---|---|
| JP | A-2001-185354 | 7/2001 |
| JP | A-2003-208979 | 7/2003 |
| JP | A-2007-087693 | 4/2007 |

OTHER PUBLICATIONS

Shimoda et al., "26.3: Multicolor Pixel Patterning of Light-Emitting Polymers by Ink-Jet Printing," 1999, pp. 376-379, SID 99 Digest, Suwa, Japan.

* cited by examiner

*Primary Examiner* — Ashok Patel
(74) *Attorney, Agent, or Firm* — Oliff & Berridge, PLC

(57) ABSTRACT

An electro-optical device includes a substrate, a partition disposed on the substrate, and a plurality of electro-optical elements disposed on the substrate. Each element includes a functional layer having an electro-optic function, with a resolution in a first direction that corresponds to an interval between the elements in the first direction. The plurality of elements constitute element arrays and are divided into a plurality of element groups. The element arrays are arranged in a direction crossing the first direction. Each group includes the corresponding electro-optical elements aligned in a second direction crossing the first direction, and each of the plurality of element regions includes at least one of the element groups and extends in a third direction crossing the first direction as viewed from the top.

18 Claims, 39 Drawing Sheets

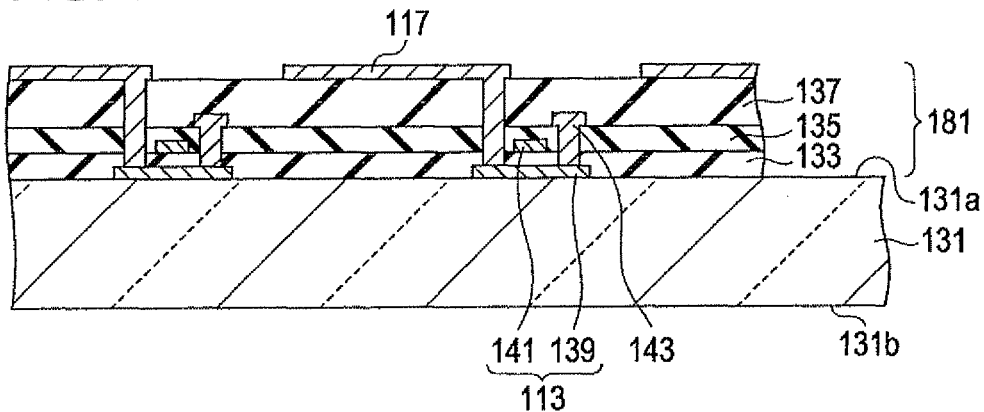
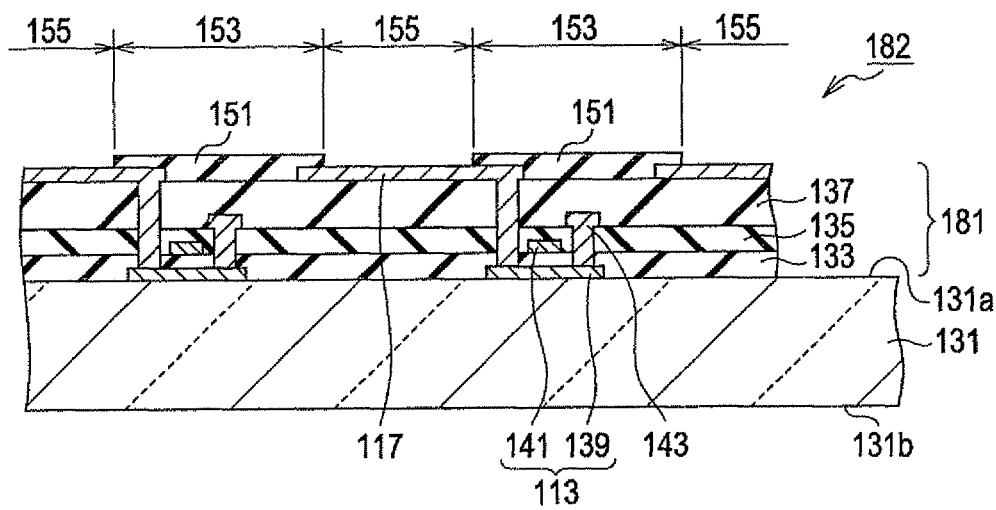
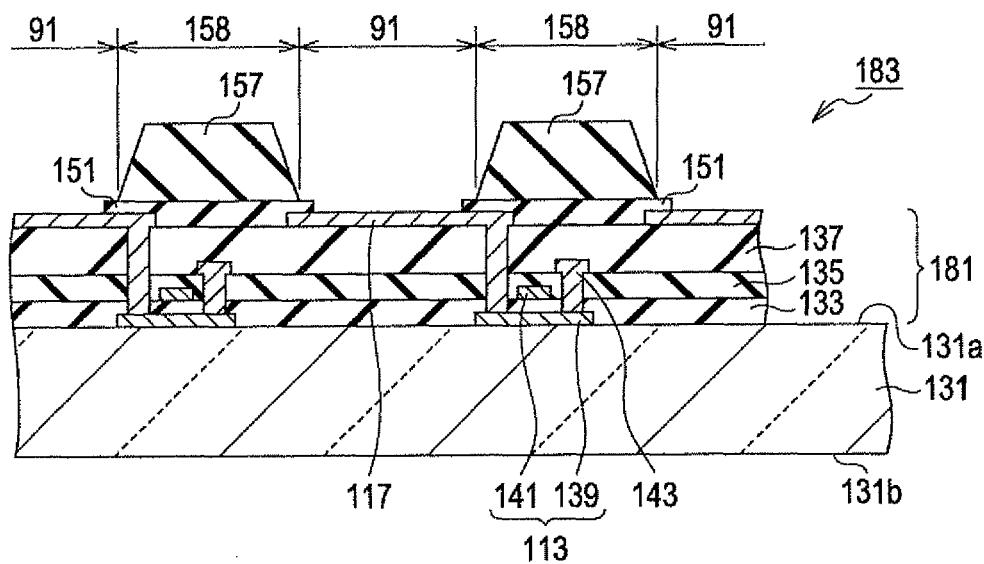

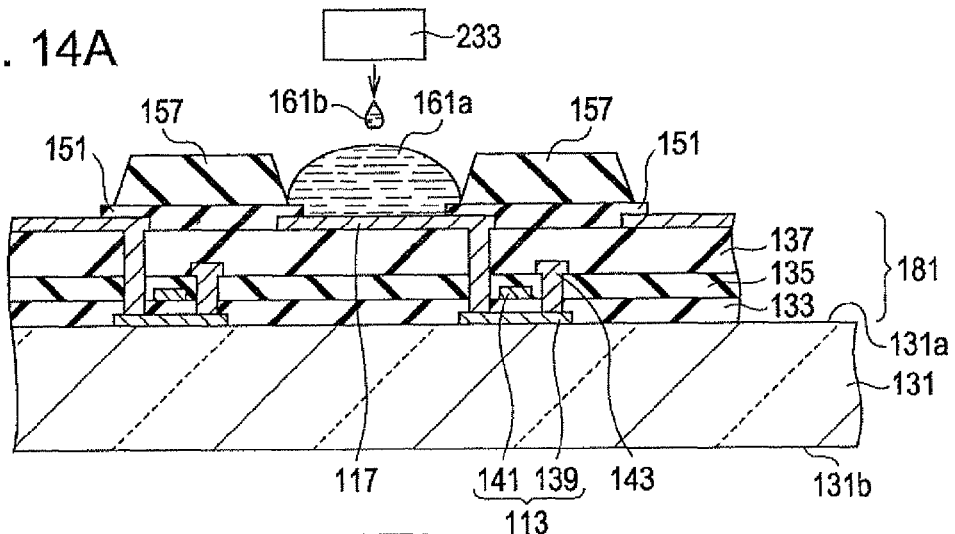
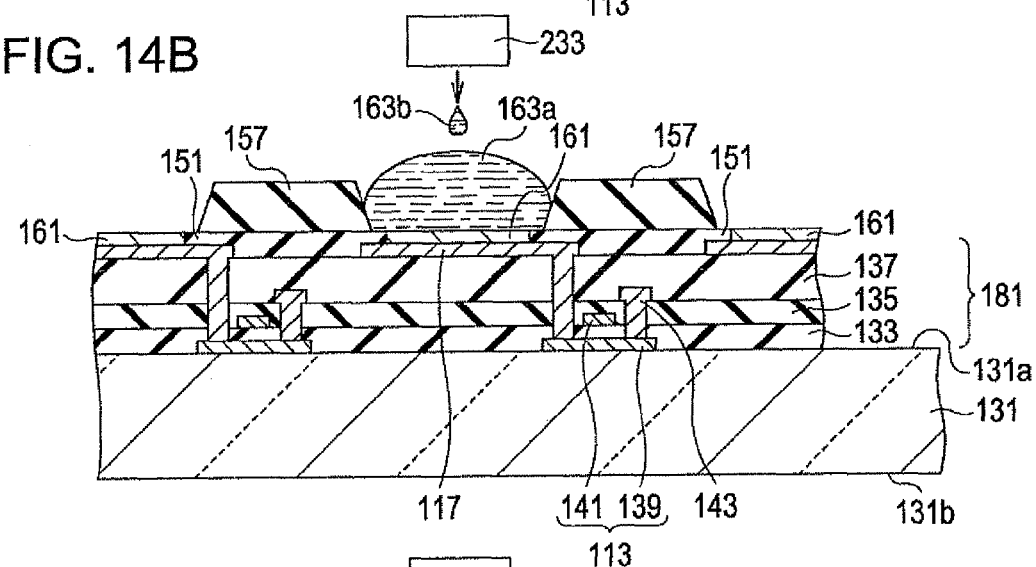
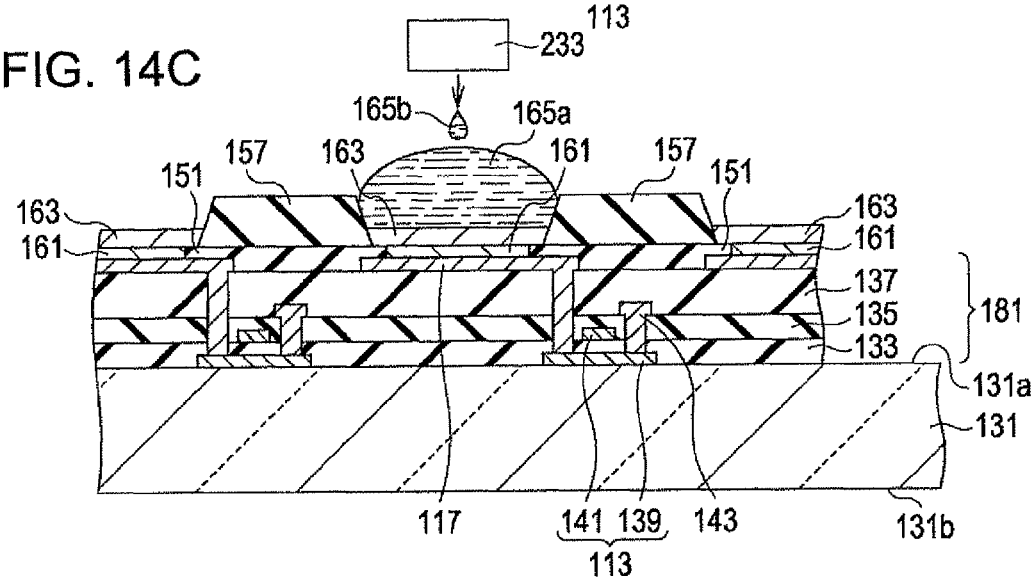

ELECTRO-OPTICAL DEVICE, ELECTRONIC DEVICE, AND METHOD FOR MANUFACTURING ELECTRO-OPTICAL DEVICE

BACKGROUND

1. Technical Field

The present invention relates to an electro-optical device, an electronic device, and a method for manufacturing an electro-optical device.

2. Related Art

Image recorders that include a light-emitting device, which is an electro-optical device, are known (see, for example, JP-A-2007-87693).

An image recorder according to JP-A-2007-87693 includes a light-emitting device including an organic electroluminescence (EL) element. This light-emitting device emits light to which a photosensitive member (photosensitive drum) is exposed.

The light-emitting device according to JPA-2007-87693 includes a plurality of organic EL elements (light-emitting elements) and a bank (partition). Each of the light-emitting elements includes an organic layer between a pair of electrodes, and the organic layer includes a light-emitting layer. The bank entirely surrounds the light-emitting elements. The light-emitting layer is disposed throughout a region surrounded by the bank. This structure of the light-emitting device allows the light emission of the light-emitting layer to be controlled for each of the light-emitting elements.

With a structure in which a plurality of light-emitting elements are surrounded by a bank, an experiment showed that the thickness of an organic layer tended to vary with the light-emitting elements. One probable reason for the variations in the thickness of an organic layer is that a fluid supplied to a depression surrounded by the bank is circulated during a drying process and is deposited in a greater thickness on the periphery of the depression.

In particular, since the light-emitting device is long and narrow, the partial pressure of solvent molecules of the fluid, as well as drying speed, differs between the central portion and the ends of the light-emitting device in the longitudinal direction. These factors further increase the variations in the thickness of the organic layer. The variations in the thickness of the organic layer between the light-emitting elements mean variations in the luminance of the light-emitting elements.

Thus, in an image recorder according to JP-A-2007-87693, the luminescence properties tend to vary with the light-emitting elements. The exposure conditions of a photosensitive member therefore tend to vary with the light-emitting elements. Thus, it is difficult to improve print quality with an image recorder according to JP-A-2007-87693.

In a light-emitting device including an organic EL element, an organic layer including a light-emitting layer functions to emit light. The organic layer is therefore also referred to as a functional layer. The term "electro-optical device" encompasses a light-emitting device. In such electro-optical devices, layers having various functions including light emission (also referred to as electro-optic functions) are also referred to as functional layers. In electro-optical devices, elements having various functions including light emission are referred to as electro-optical elements. Examples of the electro-optic functions other than light emission include a light-receiving function.

In known electro-optical devices, therefore, electro-optical elements rarely have the same electro-optical characteristics.

SUMMARY

The invention has been achieved to solve at least part of the problems described above and can be implemented in accordance with the following embodiments or aspects.

[Aspect 1] An electro-optical device that includes a substrate, a partition disposed on the substrate, the partition dividing part of a first surface of the substrate into a plurality of element regions, and a plurality of electro-optical elements disposed on the substrate, wherein each of the plurality of electro-optical elements includes a functional layer having an electro-optic function, resolution power of the electro-optic function in a first direction of the substrate corresponds to an interval between the plurality of electro-optical elements in the first direction, the plurality of electro-optical elements constitute a plurality of element arrays and are divided into a plurality of element groups, each of the element arrays includes the corresponding electro-optical elements aligned in the first direction, the plurality of element arrays are arranged in a direction crossing the first direction, each of the element groups includes the corresponding electro-optical elements aligned in a second direction crossing the first direction, and each of the plurality of element regions includes at least one of the element groups and extends in a third direction crossing the first direction as viewed from the top.

An electro-optical device according to this aspect includes a substrate, a partition, and a plurality of electro-optical elements.

A partition disposed on the substrate divides part of a first surface of the substrate into a plurality of element regions.

A plurality of electro-optical elements are disposed on the substrate. Each of the electro-optical elements includes a functional layer having an electro-optic function. Examples of the electro-optic function include a light-emitting function and a light-receiving function. The resolution power of the electro-optic function in a first direction of the substrate corresponds to an interval between the electro-optical elements in the first direction.

The electro-optical elements constitute a plurality of element arrays and are divided into a plurality of element groups. Each of the element arrays includes the corresponding electro-optical elements aligned in the first direction. The element arrays are arranged in a direction crossing the first direction.

Each of the element groups includes the corresponding electro-optical elements aligned in a second direction crossing the first direction.

Each of the element regions includes at least one of the element groups. Each of the element regions extends in a third direction crossing the first direction as viewed from the top.

In this electro-optical device, a plurality of electro-optical elements are divided by the partition into a plurality of electro-optical element units corresponding to each of the element regions. In this electro-optical device, each of the element regions is smaller than a region including all the electro-optical elements. As compared with a single region including all the electro-optical elements, therefore, the functional layers of the electro-optical elements in the element regions can easily have the same thickness. Thus, the electro-optical elements can be made to have the same characteristics.

[Aspect 2] In the electro-optical device described above, each of the element regions has a width smaller in the first direction than in the third direction.

In this aspect, since each of the element regions has a width smaller in the first direction than in the third direction, each of the element regions can be extended in the third direction.

[Aspect 3] In the electro-optical device described above, the second direction is inclined relative to a fourth direction perpendicular to the first direction.

In this aspect, the second direction is inclined relative to the fourth direction. The fourth direction is perpendicular to the first direction. This can increase the density of electro-optical elements in the first direction. This increase in the density can result in an increase in the resolution power of the electro-optic function in the first direction.

[Aspect 4] In the electro-optical device described above, the second direction is the same as the third direction.

In this aspect, since the second direction is the same as the third direction, the alignment direction of the electro-optical elements in the element groups can be the same as the extending direction of the element regions.

[Aspect 5] In the electro-optical device described above, each of the element regions includes at least two of the plurality of element groups, and the at least two element groups are arranged in the first direction.

In this aspect, since each of the element regions includes at least two of the element groups, the element regions can be expanded as compared with element regions each including only one element group.

[Aspect 6] In the electro-optical device described above, the second direction is inclined relative to a fourth direction perpendicular to the first direction, and the plurality of element groups are arranged in a fifth direction, the fifth direction crossing the second direction and being inclined relative to the first direction.

In this aspect, the second direction is inclined relative to the fourth direction. The fourth direction is perpendicular to the first direction. This can increase the density of electro-optical elements in the first direction. This increase in the density can result in an increase in the resolution power of the electro-optic function in the first direction.

In this electro-optical device, a plurality of element groups are arranged in the fifth direction. The fifth direction crosses the second direction and is inclined relative to the first direction. This can increase an interval between two adjacent element groups across adjacent element regions as compared with an interval between two adjacent element groups in each of the element regions. A region in which a partition is to be formed can therefore be easily provided between adjacent element regions. This can increase the density of electro-optical elements in the first direction.

[Aspect 7] In the electro-optical device described above, the third direction is the same as the fifth direction.

In this aspect, since the third direction is the same as the fifth direction, the array direction of the element groups in the element regions can be the same as the extending direction of the element regions.

[Aspect 8] In the electro-optical device described above, the third direction is different from the fifth direction.

[Aspect 9] In the electro-optical device described above, the plurality of electro-optical elements include a plurality of electro-optical elements aligned in a fourth direction perpendicular to the first direction across two adjacent element groups of the plurality of element groups.

In this aspect, the electro-optical elements include a plurality of electro-optical elements aligned in a fourth direction across two adjacent element groups of the element groups. The fourth direction is perpendicular to the first direction. Some of the electro-optical elements therefore overlap one another in the fourth direction. This allows the electro-optic function to be performed repeatedly in the fourth direction.

[Aspect 10] In the electro-optical device described above, each of the element regions includes at least two of the element groups and at least two of the electro-optical elements, the at least two electro-optical elements being aligned across two adjacent element groups of the at least two element groups in the fourth direction.

In this aspect, since each of the element regions includes a plurality of element groups, the element regions can be expanded as compared with element regions each including only one element group.

[Aspect 11] In the electro-optical device described above, the second direction is inclined relative to the fourth direction.

In this aspect, the second direction is inclined relative to the fourth direction. This can increase the density of electro-optical elements in the first direction. This increase in the density can result in an increase in the resolution power of the electro-optic function in the first direction.

[Aspect 12] In the electro-optical device described above, an interval in the fourth direction between at least two of the electro-optical elements aligned in the fourth direction in each of the element regions is smaller than an interval in the fourth direction between at least two of the electro-optical elements aligned in the fourth direction across two of the element regions adjoining in the first direction.

In this aspect, an interval in the fourth direction between the electro-optical elements aligned in the fourth direction is smaller in the electro-optical elements aligned in the fourth direction in each of the element regions than in the electro-optical elements aligned in the fourth direction across two adjacent element regions. This can increase an interval between two adjacent element groups across adjacent element regions as compared with an interval between two adjacent element groups in each of the element regions. A region in which a partition is to be formed can therefore be easily provided between adjacent element regions. This can increase the density of electro-optical elements in the first direction.

[Aspect 13] In the electro-optical device described above, at least two of the element groups included in each of the element regions are arranged in a fifth direction, the fifth direction crossing the second direction and being inclined relative to the first direction.

In this aspect, the element groups in each of the element regions are arranged in a fifth direction. The fifth direction crosses the second direction and is inclined relative to the first direction. This can increase an interval between two adjacent element groups across adjacent element regions as compared with an interval between two adjacent element groups in each of the element regions. A region in which a partition is to be formed can therefore be easily provided between adjacent element regions. This can increase the density of electro-optical elements in the first direction.

[Aspect 14] In the electro-optical device described above, the third direction is the same as the fifth direction.

In this aspect, since the third direction is the same as the fifth direction, the array direction of the element groups in the element regions can be the same as the extending direction of the element regions.

[Aspect 15] In the electro-optical device described above, the third direction is different from the fifth direction.

[Aspect 16] In the electro-optical device described above, the functional layer is provided for each of the element regions.

In this aspect, the functional layer can be defined for each of the element regions.

[Aspect 17] In the electro-optical device described above, each of the electro-optical elements is a light-emitting element, and the electro-optic function is a light-emitting function.

[Aspect 18] In the electro-optical device described above, the functional layer includes an organic layer formed of a material containing an organic substance.

In this aspect, the functional layer may be an organic layer having a light-emitting function.

[Aspect 19] An electronic device including any of the electro-optical devices described above.

An electronic device according to this aspect includes an electro-optical device in which electro-optical elements can be made to have the same characteristics. The electro-optical characteristics of the electronic device can therefore be made uniform among the electro-optical elements.

[Aspect 20] A method for manufacturing an electro-optical device, the electro-optical device including a substrate, a partition disposed on the substrate, the partition dividing part of a first surface of the substrate into a plurality of element regions, and a plurality of electro-optical elements disposed on the substrate, wherein each of the plurality of electro-optical elements includes a functional layer having an electro-optic function, resolution power of the electro-optic function in a first direction of the substrate corresponds to an interval between the plurality of electro-optical elements in the first direction, the plurality of electro-optical elements constitute a plurality of element arrays and are divided into a plurality of element groups, each of the element arrays includes the corresponding electro-optical elements aligned in the first direction, the plurality of element arrays are arranged in a direction crossing the first direction, each of the element groups includes the corresponding electro-optical elements aligned in a second direction crossing the first direction, and each of the plurality of element regions includes at least one of the element groups and extends in a third direction crossing the first direction as viewed from the top, the method including discharging a fluid containing a material for the functional layer into the element regions while the substrate including the partition is moved relative to a head for discharging the fluid in a direction crossing the third direction.

An electro-optical device to which a manufacturing method according to this aspect can be applied includes a substrate, a partition, and a plurality of electro-optical elements.

A partition is disposed on the substrate. The partition divides part of a first surface of the substrate into a plurality of element regions.

A plurality of electro-optical elements are disposed on the substrate. Each of the electro-optical elements includes a functional layer having an electro-optic function. Examples of the electro-optic function include a light-emitting function and a light-receiving function. The resolution power of the electro-optic function in a first direction of the substrate corresponds to an interval between the electro-optical elements in the first direction.

The electro-optical elements constitute a plurality of element arrays and are divided into a plurality of element groups. Each of the element arrays includes the corresponding electro-optical elements aligned in the first direction. The element arrays are arranged in a direction crossing the first direction.

Each of the element groups includes the corresponding electro-optical elements aligned in a second direction crossing the first direction.

Each of the element regions includes at least one of the element groups. Each of the element regions extends in a third direction crossing the first direction as viewed from the top.

A manufacturing method according to this aspect includes discharging a fluid containing a material for the functional layer into the element regions while the substrate including the partition is moved relative to a head for discharging the fluid in a direction crossing the third direction.

In an electro-optical device to which a manufacturing method according to this aspect can be applied, a plurality of electro-optical elements are divided by the partition into a plurality of electro-optical element units corresponding to each of the element regions. In this electro-optical device, each of the element regions is smaller than a region including all the electro-optical elements. The electro-optical elements can therefore be made to have the same fluid drying timing more easily in each of the element regions than in a single region including all the electro-optical elements. The functional layers of the electro-optical elements in the element regions can therefore have the same thickness easily. Thus, the electro-optical elements can be made to have the same characteristics.

BRIEF DESCRIPTION OF THE DRAWINGS

The invention will be described with reference to the accompanying drawings, wherein like numbers reference like elements.

FIGS. 12A to 12C are schematic views illustrating processes for fabricating an element substrate according to an embodiment of the invention.

FIGS. 14A to 14C are schematic views illustrating processes for fabricating an element substrate according to an embodiment of the invention.

DESCRIPTION OF EXEMPLARY EMBODIMENTS

An electrophotographic printer according to an embodiment of the invention will be described below with reference to the drawings.

Figure 1:
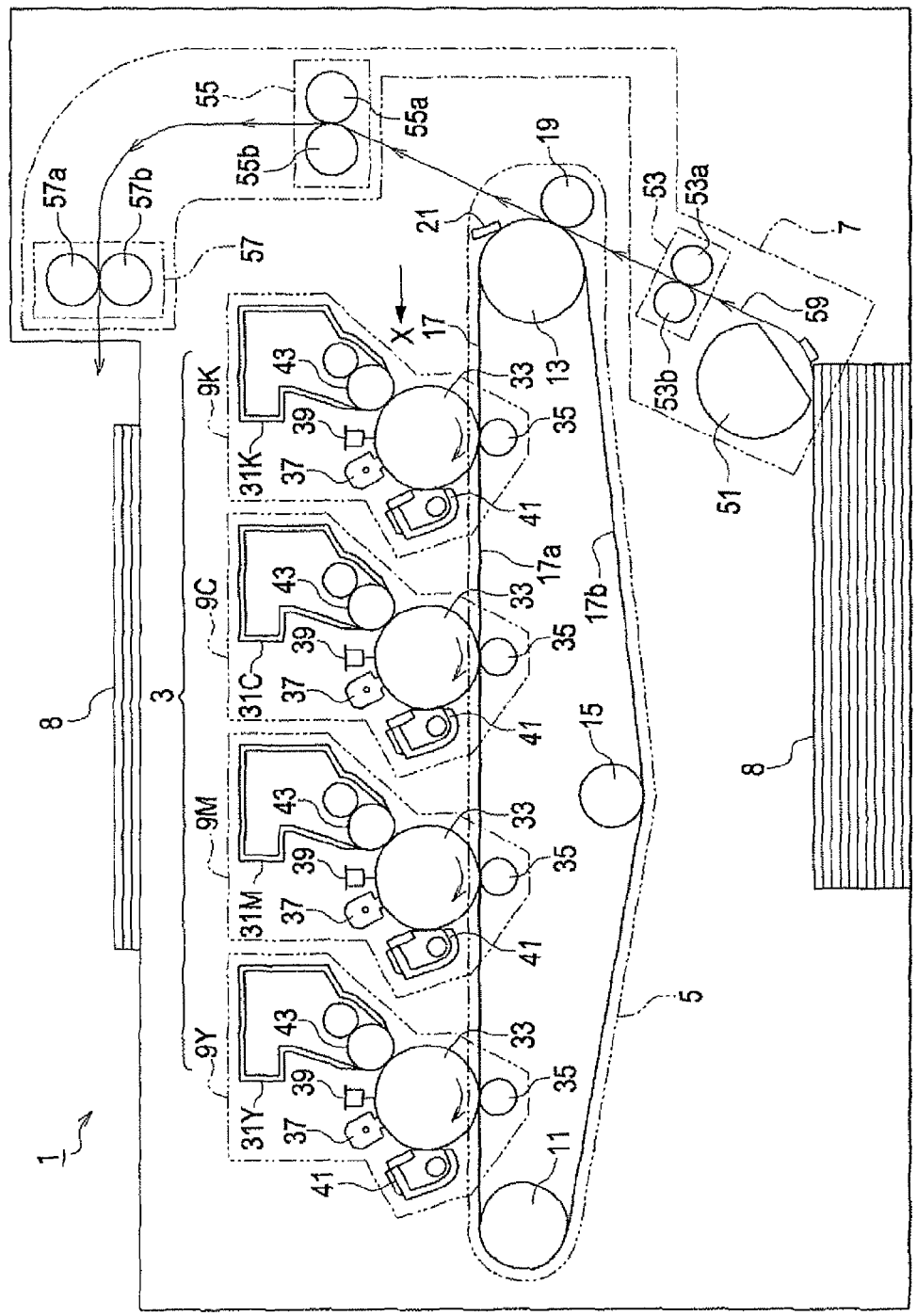
FIG. 1 is a schematic cross-sectional view of the principal structure of a printer according to an embodiment of the invention.

As illustrated in FIG. 1, a printer 1 according to the present embodiment includes an image-forming portion 3, a transfer unit 5, and a transport unit 7.

The printer 1 uses four colors, black (K), cyan (C), magenta (M), and yellow (Y), to print full-color images on recording paper 8.

When the components of the printer 1 can be identified with K, C, M, or Y, their reference numerals have the suffix K, C, M, or Y.

The image-forming portion 3 includes image-forming units 9 (9K, 9C, 9M, and 9Y). The image-forming units 9K, 9C, 9M, and 9Y are aligned in the X direction.

The transfer unit 5 includes a driving roller 11, a driven roller 13, a belt 17, and a pressure roller 19.

The driving roller 11 and the driven roller 13 are disposed apart from each other in the X direction. The belt 17 is placed on the driving roller 11, the driven roller 13, and a tension roller 15.

The driving roller 11 is rotated counterclockwise on the drawing by an actuator (not shown).

A region of the belt 17 moving from the driven roller 13 to the driving roller 11 in the X direction is referred to as an outward region 17a. A region of the belt 17 moving from the driving roller 11 to the driven roller 13 is referred to as a return region 17b.

The pressure roller 19 is disposed outside the belt 17 and faces the outer surface of the driven roller 13 with the belt 17 interposed therebetween. The belt 17 is pinched between the driven roller 13 and the pressure roller 19.

The image-forming portion 3 is disposed outside the belt 17 in the outward region 17a of the belt 17.

The image-forming units 9K, 9C, 9M, and 9Y are disposed in this order in the direction from the driven roller 13 to the driving roller 11.

Each of the image-forming units 9K, 9C, 9M, and 9Y includes a developing apparatus 31.

Each of the image-forming units 9K, 9C, 9M, and 9Y includes a photoconductive roller 33, a pressure roller 35, a charger 37, an exposure head 39, and a cleaning apparatus 41.

The photoconductive rollers 33 are disposed outside the belt 17 in the outward region 17a of the belt 17. The photoconductive rollers 33 are in contact with the outer surface of the belt 17 and are rotatable in the direction of the arrows (clockwise) with the rotation of the belt 17.

The charger 37 is disposed outside of the belt 17 and faces the outer surface of the photoconductive roller 33. The charger 37 uniformly electrifies the outer surface of the photoconductive roller 33.

The exposure head 39 is disposed outside of the belt 17 and faces the outer surface of the photoconductive roller 33. The exposure head 39 is disposed downstream of the charger 37 in the rotation direction of the photoconductive roller 33. The outer surface of the photoconductive roller 33 is selectively irradiated with light from the exposure head 39 in accordance with image information from a host computer, such as a personal computer (not shown).

Light irradiation by the exposure head 39 reduces the electrostatic potential of the outer surface of the charged photoconductive roller 33. The exposure head 39 can therefore form electrostatic latent images on the outer surface of the photoconductive roller 33.

Developing apparatuses 31K, 31C, 31M, and 31Y are disposed outside of the belt 17 and face the outer surface of the photoconductive roller 33. The developing apparatuses 31K, 31C, 31M, and 31Y are disposed between the exposure head 39 and the pressure roller 35 in the rotation direction of the photoconductive roller 33.

The developing apparatuses 31K, 31C, 31M, and 31Y contain black toner, cyan toner, magenta toner, and yellow toner, respectively.

The developing apparatuses 31K, 31C, 31M, and 31Y deposit toner on the outer surfaces of the photoconductive rollers 33 to develop electrostatic latent images as toner images.

The toner images developed on the outer surfaces of the photoconductive rollers 33 face the outer surface of the belt 17 at nip portions between the photoconductive rollers 33 and the pressure rollers 35 as the photoconductive rollers 33 rotate. Upon the application of a transfer bias voltage to the pressure rollers 35, the toner images are transferred from the photoconductive rollers 33 to the outer surface of the belt 17. The transfer bias voltage applied to the pressure rollers 35 has a polarity opposite to the charge polarity of toner.

The transport unit 7 includes a pickup roller 51, gate rollers 53, fixing rollers 55, and ejection rollers 57. The transport unit 7 transports recording paper 8 through a transport path 59.

The pickup roller 51 is disposed on the uppermost stream side of the transport path 59 and feeds recording paper 8 one by one through the transport path 59.

The transport path 59 leads from the pickup roller 51 to the ejection rollers 57 through the gate rollers 53 and the fixing rollers 55.

The transport path 59 passes through part of the transfer unit 5 between the gate rollers 53 and the fixing rollers 55. More specifically, the transport path 59 leads from the gate rollers 53 to the fixing rollers 55 through a nip portion between the belt 17 and the pressure roller 19.

Recording paper 8 fed to the transport path 59 by the pickup roller 51 is corrected for inclination by the gate rollers 53 and is fed to the nip portion between the belt 17 and the pressure roller 19.

A toner image transferred to the outer surface of the belt 17 is transported through the return region 17b of the belt 17 to the nip portion between the belt 17 and the pressure roller 19. When the toner image is brought into contact with recording paper 8 at the nip portion between the belt 17 and the pressure roller 19, a transfer bias voltage is applied to the pressure roller 19.

This allows the toner image to be transferred from the outer surface of the belt 17 to the recording paper 8.

The recording paper 8 having the toner image is fed to the fixing rollers 55.

The recording paper 8 is heated and pressurized between rollers 55a and 55b of the fixing rollers 55. The heating and pressurization fuse toner on the recording paper 8. This allows the toner image to be fixed on the recording paper 8.

The recording paper 8 having the fixed toner image is fed to the ejection rollers 57.

The recording paper 8 fed to the ejection rollers 57 is ejected from the printer 1 with the rotation of rollers 57a and 57b.

The structure of the exposure head 39 will be further described below.

Figure 2:
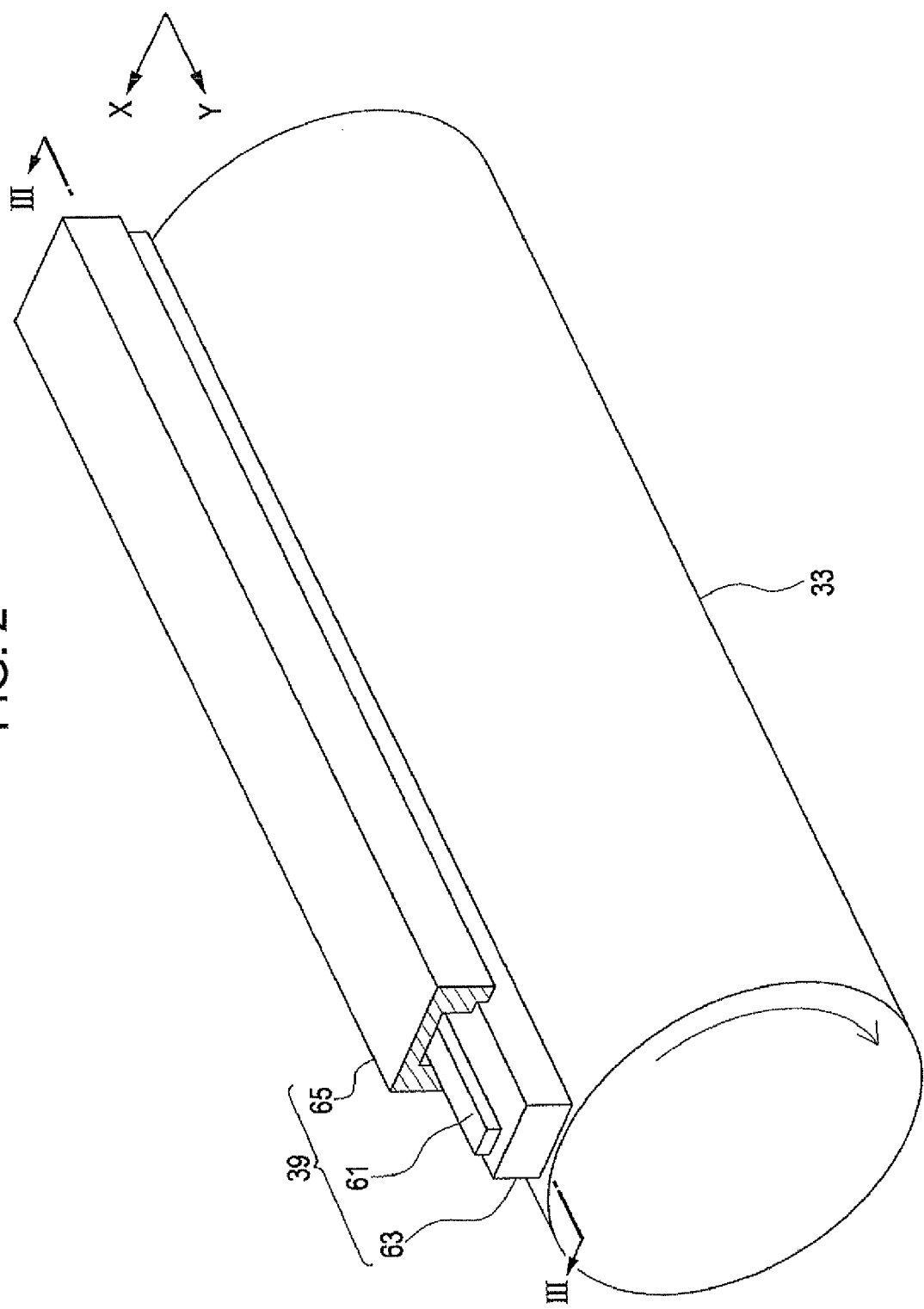
FIG. 2 is a perspective view of an exposure head and a photoconductive roller according to an embodiment of the invention.

As illustrated in FIG. 2, the exposure head 39 includes a light-emitting panel 61, an optical member 63, and a cover 65. The Y direction in the drawing refers to the longitudinal direction (the direction of the long side) of the light-emitting panel 61. The photoconductive roller 33 extends in the Y direction. In the present embodiment, the X direction is perpendicular to the Y direction.

Figure 3:
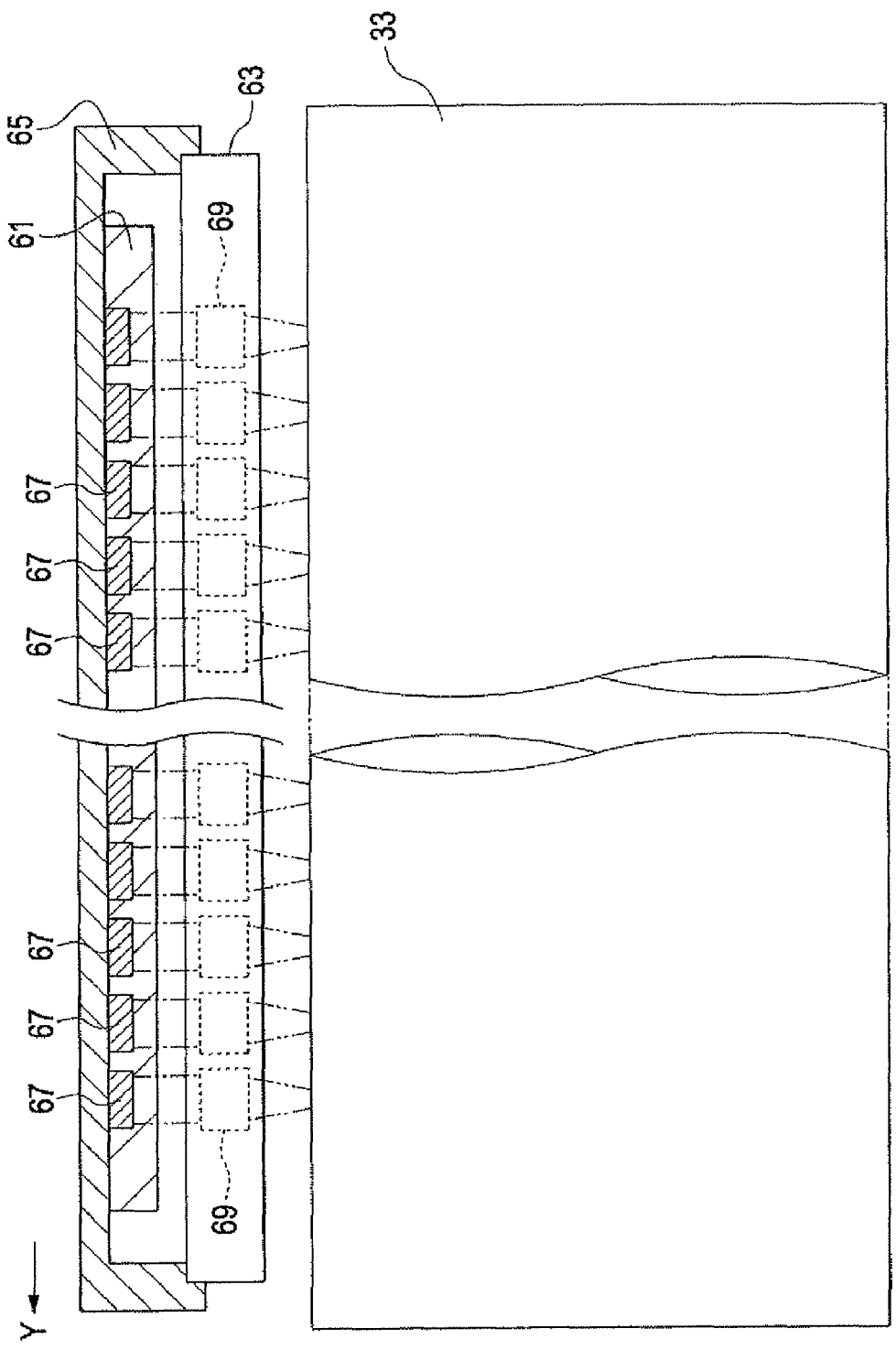
FIG. 3 is a cross-sectional view of the exposure head and the photoconductive roller taken along the line III-III in FIG. 2.

As illustrated in FIG. 3, which is a cross-sectional view taken along the line in FIG. 2, the light-emitting panel 61 according to a first embodiment is apart from the photoconductive roller 33. Thus, there is a gap between the light-emitting panel 61 and the photoconductive roller 33.

The optical member 63 is disposed between the photoconductive roller 33 and the light-emitting panel 61. The optical member 63 extends in the Y direction. The optical member 63 faces the light-emitting panel 61. The optical member 63 is apart from the photoconductive roller 33. Thus, there is a gap between the optical member 63 and the photoconductive roller 33.

The cover 65 is disposed on the light-emitting panel 61 opposite the optical member 63. The cover 65 covers the surface of the light-emitting panel 61 opposite the optical member 63.

The light-emitting panel 61 includes a plurality of light-emitting elements 67. The optical member 63 includes a plurality of lenses 69. The lenses 69 correspond to their respective light-emitting elements 67.

In the light-emitting panel 61, light emission of the light-emitting elements 67 is individually controlled. Light from the light-emitting elements 67 is converged by the lenses 69 and is applied to the photoconductive roller 33.

Figure 4:
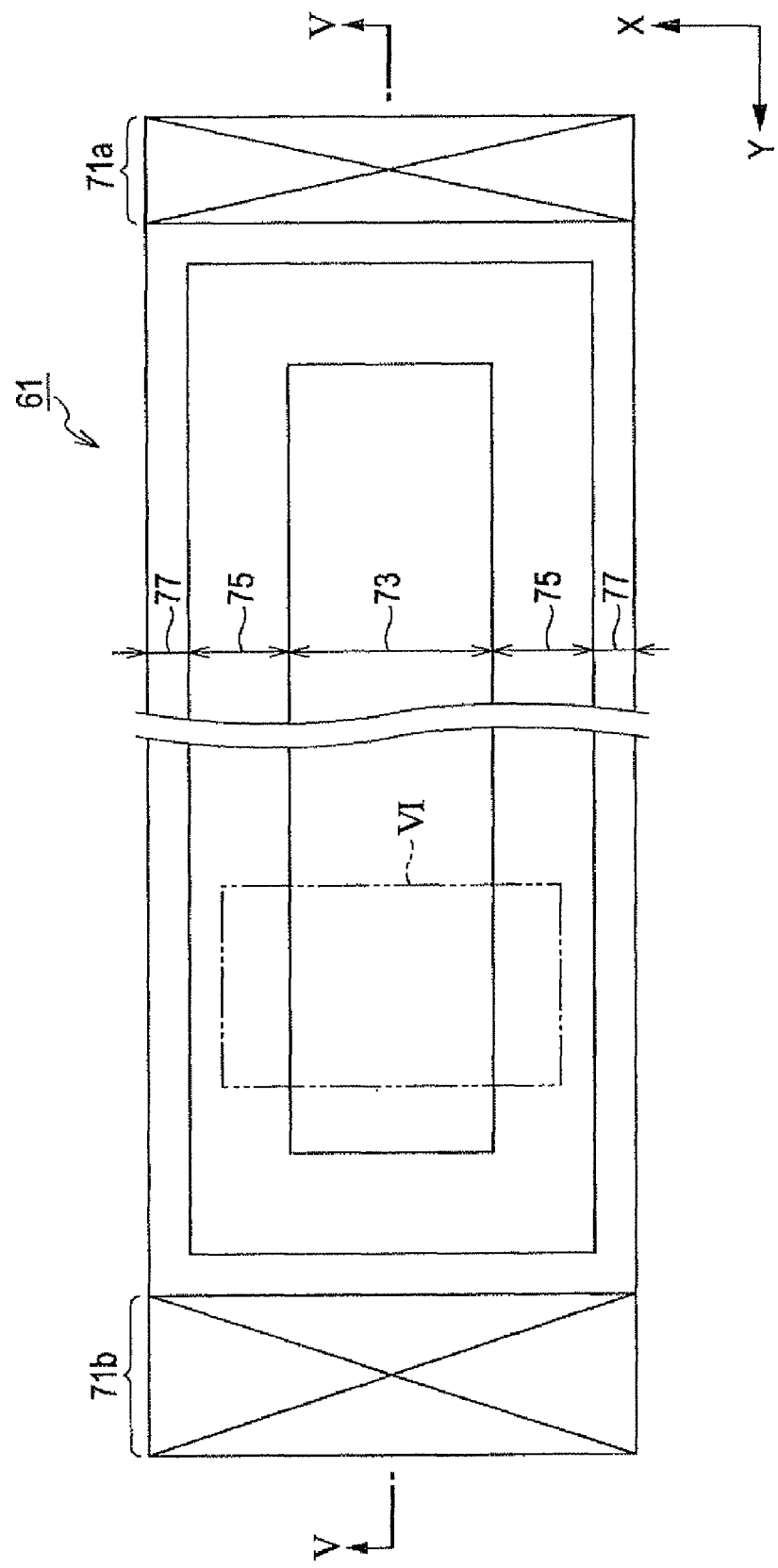
FIG. 4 is a plan view of a light-emitting panel according to an embodiment of the invention.

As illustrated in a plan view of FIG. 4, the light-emitting panel 61 includes a terminal arrangement region 71a, a terminal arrangement region 71b, an element arrangement region 73, a dummy arrangement region 75, and a sealing region 77. In FIG. 4, for the sake of clarity, these regions are hatched.

The terminal arrangement regions 71a and 71b can be provided with terminals (not shown). Examples of the terminals include electrodes to be connected to electrical wiring, such as flexible printed circuits (FPCs).

The terminal arrangement region 71a is disposed at one end of the light-emitting panel 61 in the Y direction, and the terminal arrangement region 71b is disposed at the other end of the light-emitting panel 61.

The element arrangement region 73 can be provided with the light-emitting elements 67 (see FIG. 3). The element arrangement region 73 is disposed between the terminal arrangement regions 71a and 71b in the Y direction.

The dummy arrangement region 75 can be provided with dummy regions described below. The dummy arrangement region 75 is disposed between the terminal arrangement regions 71a and 71b in the Y direction. The dummy arrangement region 75 is disposed outside the element arrangement region 73. The dummy arrangement region 75 surrounds the element arrangement region 73.

The sealing region 77 can be provided with a sealing member described below. The sealing region 77 is disposed between the terminal arrangement regions 71a and 71b in the Y direction. The sealing region 77 is disposed outside the dummy arrangement region 75. The sealing region 77 surrounds the dummy arrangement region 75.

Thus, the element arrangement region 73 is surrounded by the dummy arrangement region 75 and the sealing region 77.

Figure 5:
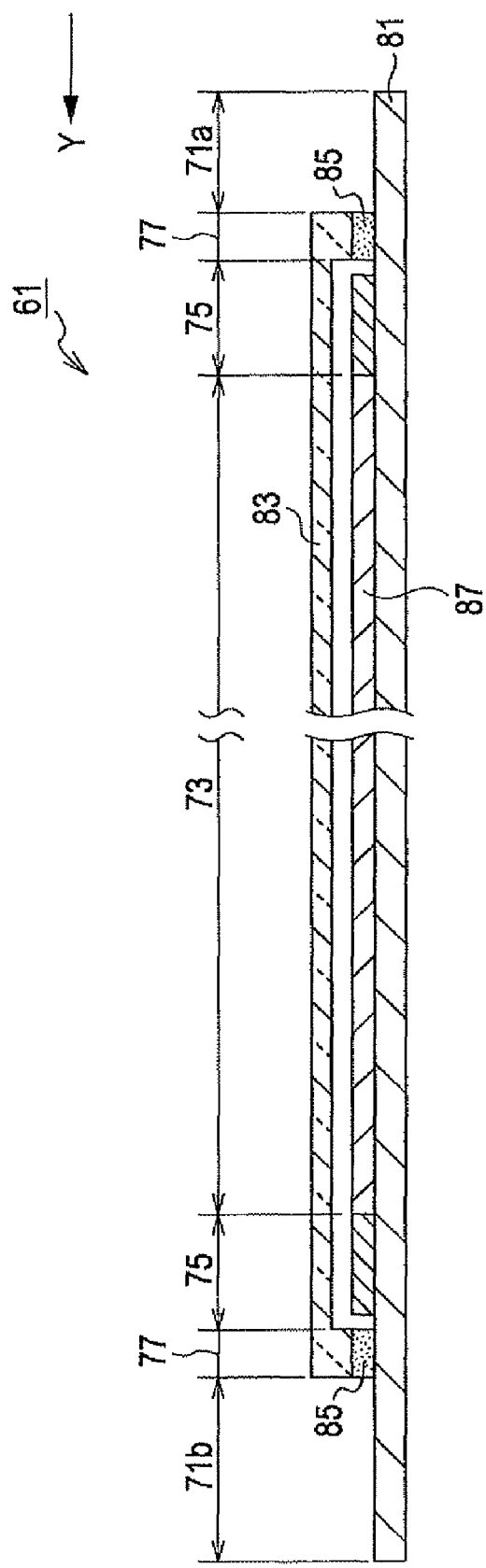
FIG. 5 is a cross-sectional view of the light-emitting panel taken along the line V-V in FIG. 4.

As illustrated in FIG. 5, which is a cross-sectional view taken along the line V-V in FIG. 4, the light-emitting panel 61 includes an element substrate 81, a sealing substrate 83, and a sealing member 85.

The element substrate 81 includes an organic layer 87. The organic layer 87 is formed of a material containing an organic compound and includes a light-emitting sublayer described below. The light-emitting sublayer emits light when an electric current flowing through the organic layer 87 is applied. The organic layer 87 has a light-emitting function and is also referred to as a functional layer. In the present embodiment, the photoconductive rollers 33 are irradiated with light from the light-emitting sublayer.

The light-emitting panel 61 is one type of organic electroluminescent (EL) devices.

The sealing substrate 83 faces the organic layer 87 of the element substrate 81.

The sealing member 85 is disposed in the sealing region 77. The sealing member 85 is disposed in the sealing region 77 between the element substrate 81 and the sealing substrate 83. In the present embodiment, the sealing member 85 is pinched between the element substrate 81 and the sealing substrate 83.

The organic layer 87 is disposed in a region surrounded by the sealing region 77. The organic layer 87 is sealed with the sealing member 85 between the element substrate 81 and the sealing substrate 83.

Figure 6:
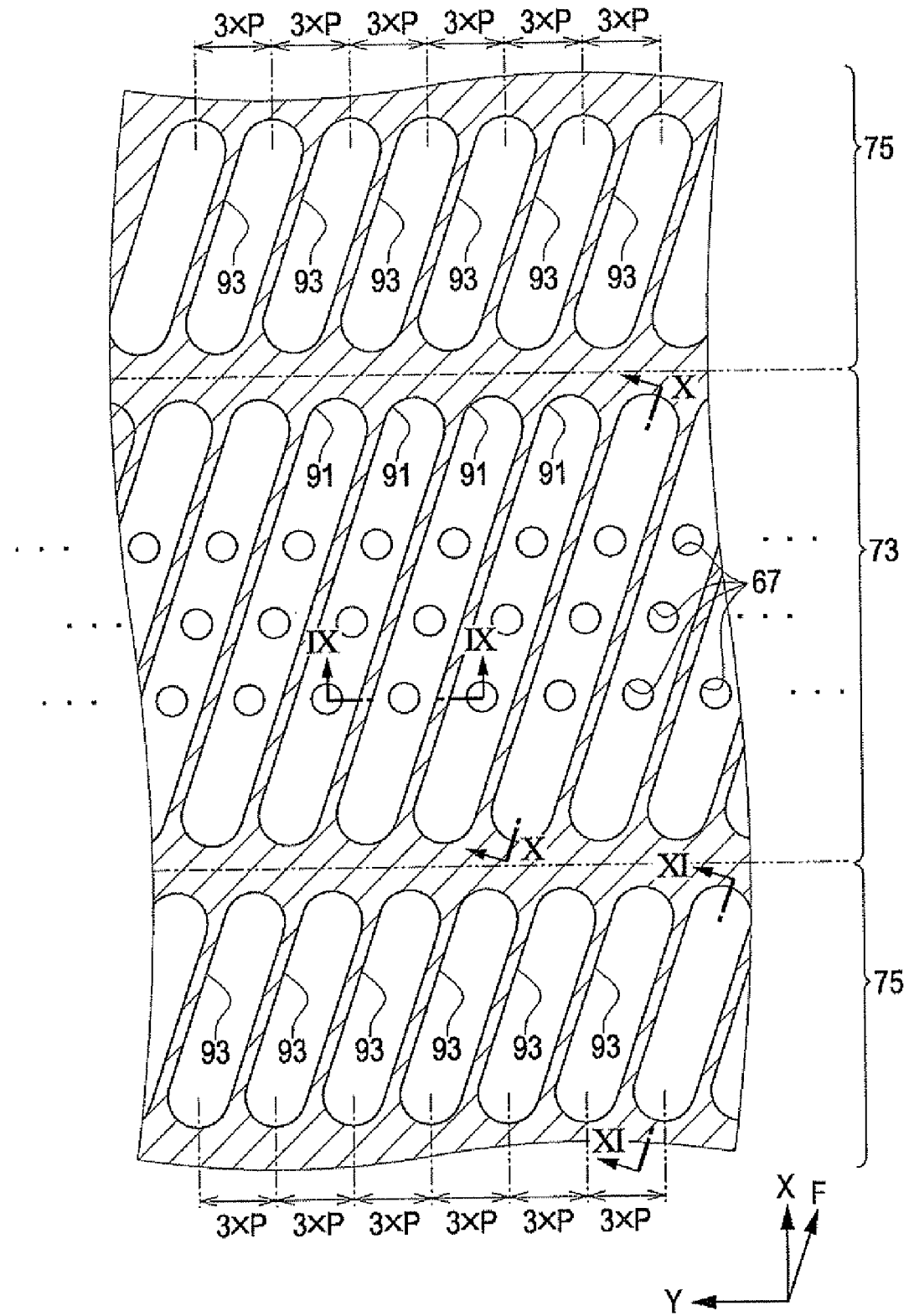
FIG. 6 is an enlarged view of a portion VI in the light-emitting panel illustrated in FIG. 4.

As illustrated in FIG. 6, which is an enlarged view of a portion VI in FIG. 4, the element arrangement region 73 includes a plurality of element regions 91.

The dummy arrangement region 75 includes a plurality of dummy regions 93. In FIG. 6, for the sake of clarity, the outside of the element regions 91 and the outside of the dummy regions 93 are hatched.

The light-emitting elements 67 are disposed in the element regions 91. Each of the element regions 91 includes a plurality of light-emitting elements 67. In the present embodiment, each of the element regions 91 includes three light-emitting elements 67.

Figure 7:
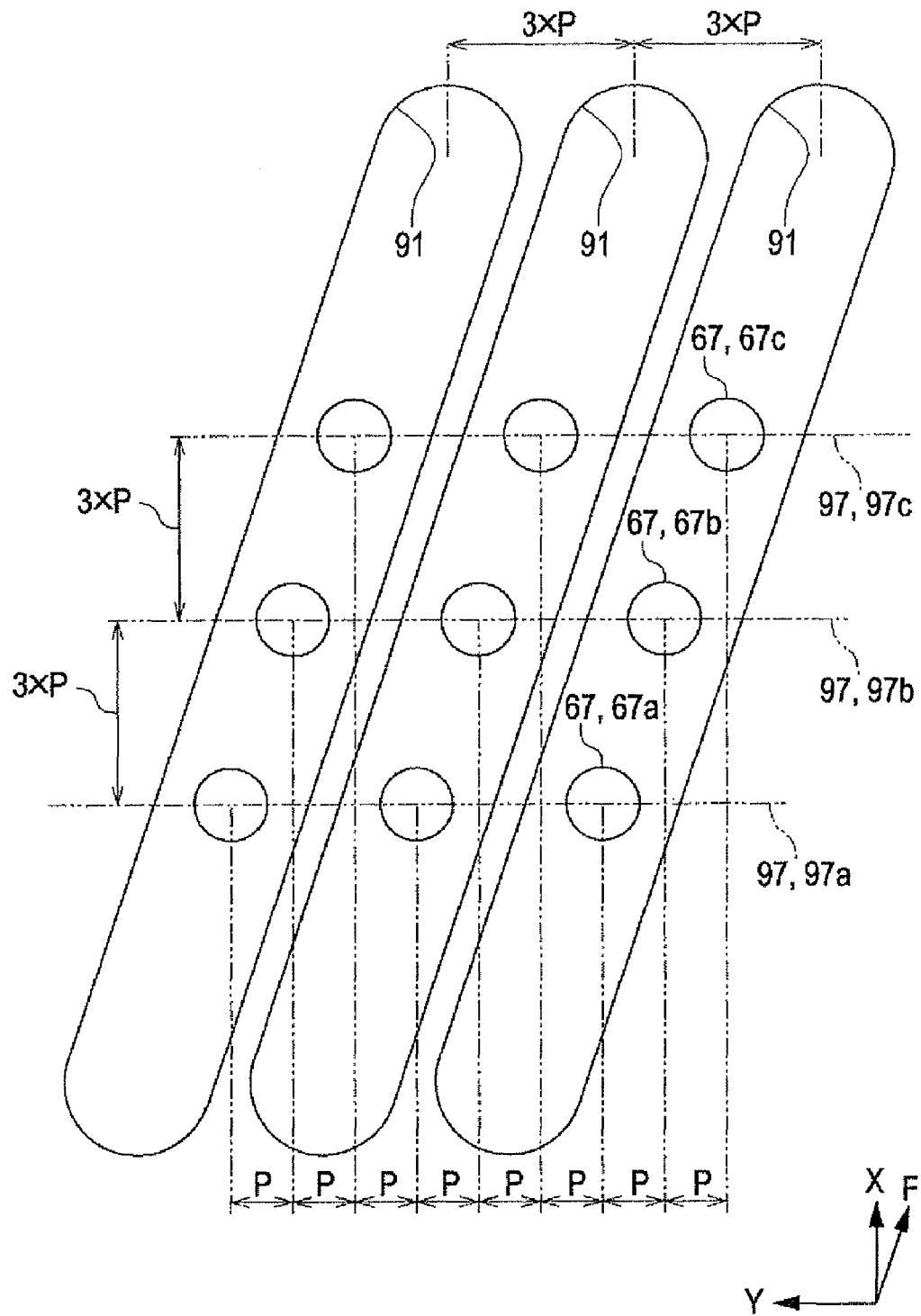
FIG. 7 is a plan view of element regions and light-emitting elements in the structure (1) of a light-emitting panel according to a first embodiment of the invention.

As illustrated in FIG. 7, three light-emitting elements 67 in each element region 91 are referred to as light-emitting elements 67a, 67b, and 67c. The terms "a light-emitting element 67", "a light-emitting element 67a", "a light-emitting element 67b", and "a light-emitting element 67c" are appropriately used herein.

In the present embodiment, a plurality of light-emitting elements 67a are aligned in the Y direction. Likewise, a plurality of light-emitting elements 67b are aligned in the Y direction, and a plurality of light-emitting elements 67c are aligned in the Y direction.

The light-emitting elements 67a aligned in the Y direction constitute one element array 97. Likewise, the light-emitting elements 67b aligned in the Y direction constitute one element array 97, and the light-emitting elements 67c aligned in the Y direction constitute one element array 97.

These three element arrays 97 are referred to as an element array 97a, an element array 97b, and an element array 97c. The terms "an element array 97", "an element array 97a", "an element array 97b", and "an element array 97c" are appropriately used herein.

The light-emitting elements 67a aligned in the Y direction constitute the element array 97a. Likewise, the light-emitting elements 67b aligned in the Y direction constitute the element array 97b, and the light-emitting elements 67c aligned in the Y direction constitute the element array 97c. These three element arrays 97 are arranged in the X direction, which is substantially perpendicular to the Y direction.

In each element region 91, the light-emitting elements 67a, 67b, and 67c are aligned in a second direction, which is the same as the F direction in the drawing. In the present embodiment, the element regions 91 are provided such that the three light-emitting elements 67a, 67b, and 67c aligned in the F direction are disposed in each of the element regions 91. In the present embodiment, therefore, the element regions 91 extend in the F direction. The F direction crosses both the X direction and the Y direction.

In each element region 91, the distances between the light-emitting element 67a and the light-emitting element 67b are P in the Y direction and 3×P in the X direction. In each element region 91, the distances between the light-emitting element 67b and the light-emitting element 67c are P in the Y direction and 3×P in the X direction. In each element region 91, the distances between the light-emitting element 67a and the light-emitting element 67c are 2×P in the Y direction and 6×P in the X direction.

The distance between two adjacent light-emitting elements 67a in the Y direction is 3×P. Likewise, the distance between two adjacent light-emitting elements 67b in the Y direction is 3×P, and the distance between two adjacent light-emitting elements 67c in the Y direction is 3×P.

Thus, in the element array 97a, a plurality of light-emitting elements 67a are aligned in the Y direction at intervals of 3×P. Likewise, in the element array 97b, the light-emitting elements 67b are aligned in the Y direction at intervals of 3×P, and in the element array 97c, the light-emitting elements 67c are aligned in the Y direction at intervals of 3×P.

The element arrays 97a, 97b, and 97c are disposed in the X direction at intervals of 3×P.

The length P depends on the printing resolution of the printer 1. For example, for the printing resolution of 600 dots per inch (dpi), the length P is approximately 0.042 mm. In the printer 1, the length P that depends on printing resolution is considered as the resolution power of the light-emitting panel 61 in the Y direction.

In the present embodiment, although the distances between the element array 97a and the element array 97b and between the element array 97b and the element array 97c in the X direction are 3×P, these distances are not limited to 3×P and may be any value.

As described above, in the present embodiment, the element regions 91 are provided such that the three light-emitting elements 67a, 67b, and 67c aligned in the F direction are disposed in each of the element regions 91. Thus, the element regions 91 are disposed in the Y direction at intervals of 3×P.

In the present embodiment, the dummy regions 93 illustrated in FIG. 6 extend in the F direction. The dummy regions 93 are disposed in the Y direction at intervals of 3×P. Thus, the distance between the element regions 91 in the Y direction is the same as the distance between the dummy regions 93 in the Y direction.

In the element arrangement region 73 and parts of the dummy arrangement region 75 on the opposite sides of the element arrangement region 73 in the X direction, the element region 91 and the dummy regions 93 are aligned in the F direction. The element region 91 is disposed between two dummy regions 93 in the F direction. From another perspective, in parts of the dummy arrangement region 75 on the opposite sides of the element arrangement region 73 in the X direction, the dummy regions 93 are disposed in correspondence with the element region 91.

Figure 8:
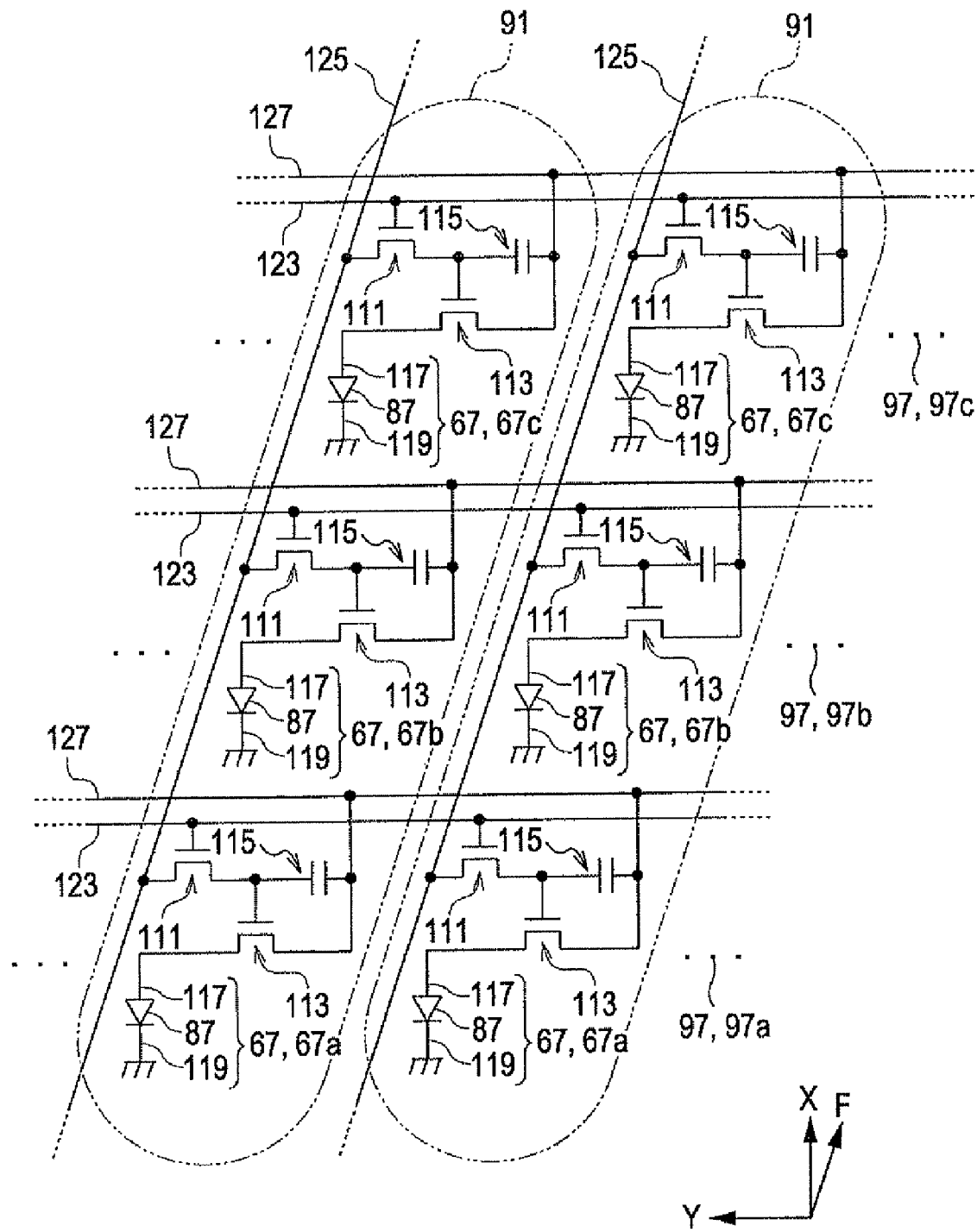
FIG. 8 is a circuit diagram of a light-emitting panel according to an embodiment of the invention.

As illustrated in a circuit diagram of FIG. 8, the light-emitting panel 61 includes a select transistor 111, a drive transistor 113, and a capacitance element 115 for each of the light-emitting elements 67. Each of the light-emitting elements 67 include a pixel electrode 117, an organic layer 87, and a common electrode 119. The select transistor 111 and the drive transistor 113 are composed of thin film transistor (TFT) elements.

The light-emitting panel 61 includes a plurality of scanning lines 123, a plurality of signal lines 125, and a plurality of power supply lines 127.

The scanning lines 123 extending in the Y direction are disposed in the X direction at certain intervals.

The signal lines 125 extending in the F direction are disposed in the Y direction at certain intervals.

The power supply lines 127 extending in the Y direction and parallel to the scanning lines 123 are disposed in the X direction at certain intervals.

The light-emitting elements 67 are disposed in correspondence with the intersections of the scanning lines 123 and the signal lines 125. The scanning lines 123 and the power supply lines 127 are disposed along the corresponding element arrays 97. The signal lines 125 are disposed along the corresponding element regions 91.

The gate electrode of the select transistor 111 is electrically connected to the corresponding scanning line 123. The source electrode of the select transistor 111 is electrically connected to the corresponding signal line 125. The drain electrode of the select transistor 111 is electrically connected to the gate electrode of the drive transistor 113 and one electrode of the capacitance element 115.

The other electrode of the capacitance element 115 and the source electrode of the drive transistor 113 are electrically connected to the corresponding power supply lines 127.

The drain electrode of the drive transistor 113 is electrically connected to the pixel electrode 117. The pixel electrode 117 and the common electrode 119 constitute a pair of electrodes. The pixel electrode 117 functions as an anode, and the common electrode 119 functions as a cathode.

The common electrode 119 is shared among the light-emitting elements 67 in the element arrangement region 73 (see FIG. 6).

The organic layer 87 is disposed between the pixel electrode 117 and the common electrode 119.

When the scanning line 123 connected to the select transistor 111 receives a selection signal, the select transistor 111 is turned on. At the same time, a data signal supplied from the signal line 125 connected to the select transistor 111 turns on the drive transistor 113. When the capacitance element 115 maintains the electric potential of the data signal for a certain period of time, the drive transistor 113 can maintain the gate potential for a certain period of time. Thus, the drive transistor 113 remains in the ON state for a certain period of time. The data signal has an electric potential in response to the gray scale in printing.

While the drive transistor 113 remains in the ON state, an electric current in response to the gate potential of the drive transistor 113 flows from the power supply line 127 to the common electrode 119 through the pixel electrode 117 and the organic layer 87. The light-emitting sublayer in the organic layer 87 emits light at a luminance in response to the electric current passing through the organic layer 87. Thus, the light-emitting panel 61 can achieve gradient light emission.

The light-emitting panel 61 is an organic EL device having a bottom emission structure in which the light-emitting sublayer in the organic layer 87 emits light through the element substrate 81 (see FIG. 5).

The structures of the element substrate 81 and the sealing substrate 83 will be described in detail below.

Figure 9:
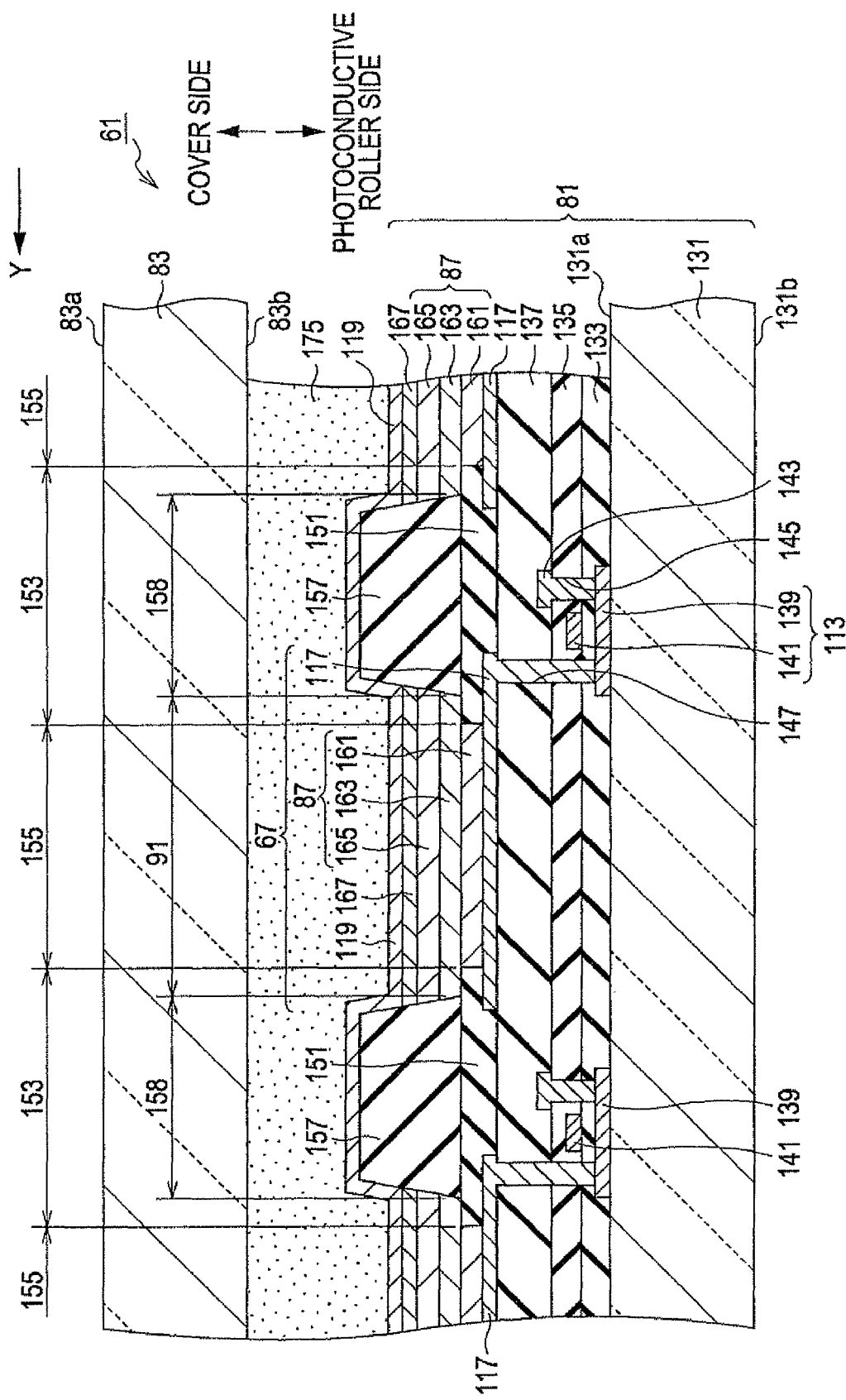
FIG. 9 is a cross-sectional view of the light-emitting panel taken along the line IX-IX in FIG. 6.

As illustrated in FIG. 9, which is a cross-sectional view taken along the line IX-IX in FIG. 6, the element substrate 81 includes a substrate 131. For the sake of clarity, the select transistors 111, the capacitance elements 115, the signal lines 125, and the power supply lines 127 are omitted in FIG. 9.

The substrate 131 may be formed of a transparent material, such as glass or quartz. The substrate 131 has a first surface 131a and a second surface 131b on the opposite sides. The first surface 131a faces the sealing substrate 83 or the cover 65. The second surface 131b faces the photoconductive roller 33.

The first surface 131a of the substrate 131 is overlaid with a gate-insulating film 133, an insulating film 135, and an insulating film 137 in this order.

A semiconductor layer 139 corresponding to the drive transistor 113 of each of the light-emitting elements 67 is disposed on the first surface 131a of the substrate 131. The semiconductor layer 139 is overlaid with the gate-insulating film 133. The gate-insulating film 133 may be formed of silicon oxide.

A gate electrode 141 is disposed on the gate-insulating film 133 on top of the semiconductor layer 139. The gate electrode 141 may be formed of a metal, such as aluminum, copper, molybdenum, tungsten, or chromium, or an alloy thereof. The gate electrode 141 is overlaid with an insulating film 135.

A source electrode 143 is disposed on the insulating film 135 on top of a source region (not shown) of the semiconductor layer 139. The source electrode 143 is connected to the source region (not shown) of the semiconductor layer 139 via a contact hole 145 formed in the insulating film 135 and the gate-insulating film 133. The source electrode 143 may be formed of a metal, such as aluminum, copper, molybdenum, tungsten, or chromium, or an alloy thereof. The source electrode 143 is overlaid with the insulating film 137.

A pixel electrode 117 is disposed on the insulating film 137. The pixel electrode 117 is connected to a drain region (not shown) of the semiconductor layer 139 via a contact hole 147 formed in the insulating film 137, the insulating film 135, and the gate-insulating film 133. The pixel electrode 117 may be formed of a transparent material, such as indium tin oxide (ITO) or indium zinc oxide.

The insulating films 135 and 137 may be formed of silicon oxide, silicon nitride, or an acrylic resin.

An insulating film (a first partition) 151 for separating light-emitting elements 67 is disposed throughout a region (a first-partition-forming region) 153 between adjacent pixel electrodes 117. The insulating film 151 may be formed of a transparent material, such as silicon oxide, silicon nitride, or an acrylic resin. In the present embodiment, the insulating film 151 is formed of silicon oxide.

The insulating film 151 is formed throughout the element arrangement region 73 (see FIG. 6) in a grid-like fashion as viewed from the top. Thus, the element arrangement region 73 is divided into a plurality of regions 155 by the insulating film 151. The insulating film 151 surrounds the individual light-emitting elements 67 as viewed from the top. From another perspective, the insulating film 151 has openings in the regions 155 corresponding to the pixel electrodes 117.

An insulating film (a second partition) 157 for separating the element regions 91 is disposed on the insulating film 151.

The insulating film 157 surrounds the individual element regions 91 as viewed from the top. From another perspective, the insulating film 157 has openings in regions corresponding to the element regions 91.

The insulating film 157 may be formed of an organic material, such as an acrylic resin or a polyimide resin, that contains a light-absorbing material, such as carbon black or chromium. In the present embodiment, the insulating film 157 is formed of an acrylic resin.

Figure 10:
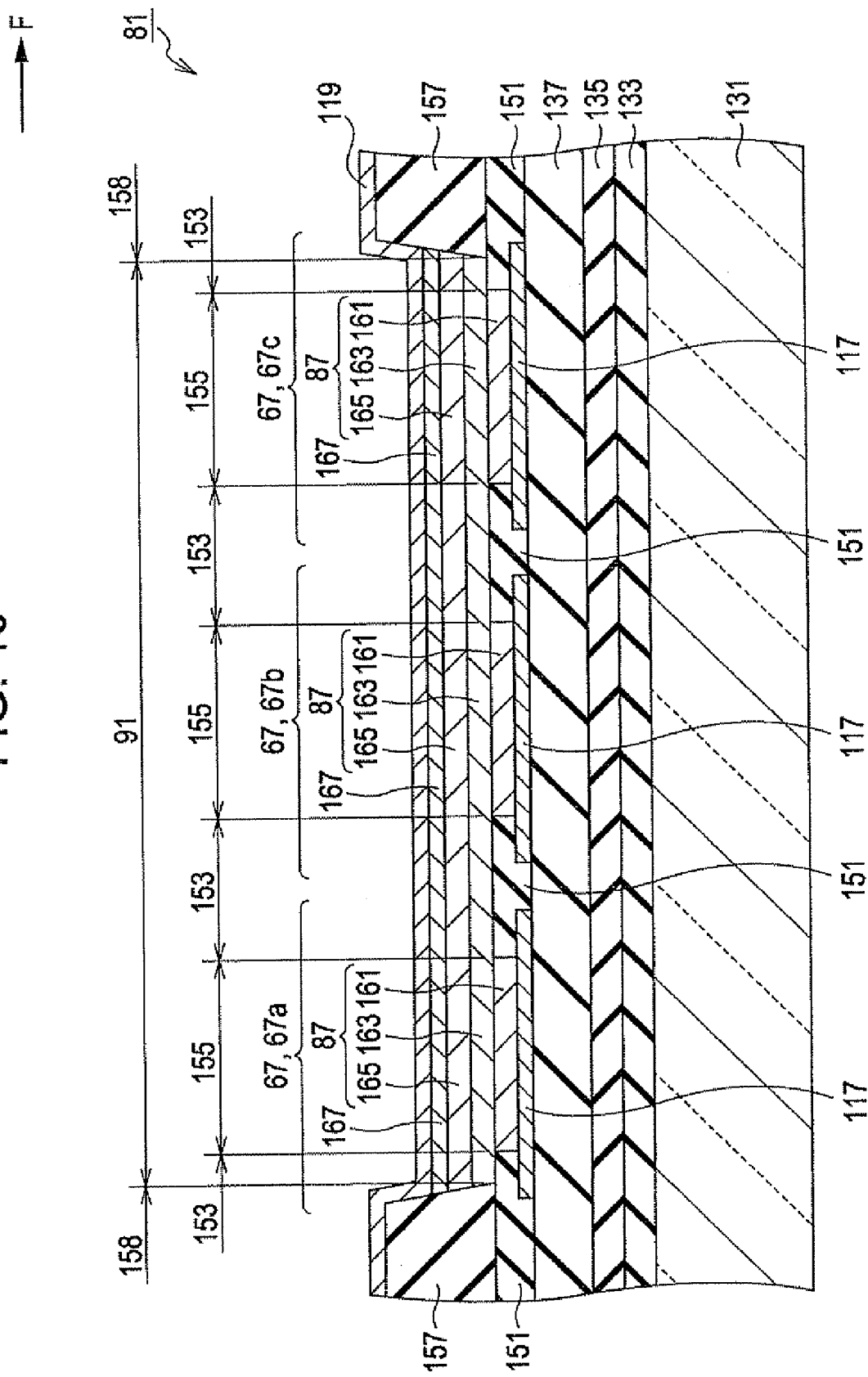
FIG. 10 is a cross-sectional view of the light-emitting panel taken along the line X-X in FIG. 6.

As illustrated in FIG. 10, which is a cross-sectional view taken along the line X-X in FIG. 6, the insulating film 157 surrounds the three light-emitting elements 67a, 67b, and 67c in each of the element regions 91. The element regions 91 are divided by the insulating film 157. Thus, each of the element regions 91 is defined and surrounded by the insulating film 157.

The three light-emitting elements 67a, 67b, and 67c in the element regions 91 are divided by the insulating film 151.

As illustrated in FIG. 9, the organic layers 87 are disposed on the pixel electrodes 117 in the element region 91 surrounded by the insulating film 157. Each of the organic layers 87 includes a hole-injection sublayer 161, a hole-transport sublayer 163, and a light-emitting sublayer 165.

The hole-injection sublayer 161 is formed of an organic material and is disposed on the pixel electrode 117 in the element region 91 surrounded by the insulating film 157.

The organic material of the hole-injection sublayer 161 may be a mixture of a polythiophene derivative, such as poly(3,4-ethylenedioxythiophene) (PEDOT), and poly(styrene sulfonate) (PSS). The organic material of the hole-injection sublayer 161 may also be polystyrene, polypyrrole, polyaniline, polyacetylene, or a derivative thereof.

The hole-transport sublayer 163 is formed of an organic material and is disposed on the hole-injection sublayer 161 in the element region 91 surrounded by the insulating film 157.

The organic material of the hole-transport sublayer 163 may contain a triphenylamine polymer, such as poly(9,9'-dioctylfluorene-co-N-(4-butylphenyl)diphenylamine) (TFB) having the following formula 1 (a compound 1).

[Formula 1]

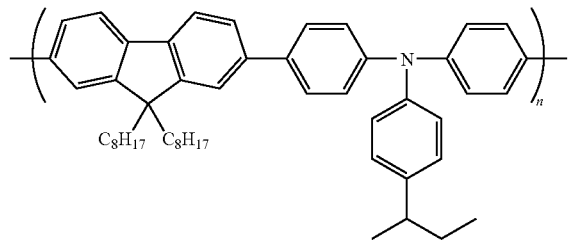

Compound 1

The light-emitting sublayer 165 is formed of an organic material and is disposed on the hole-transport sublayer 163 in the element region 91 surrounded by the insulating film 157.

The organic material of the light-emitting sublayer 165 may be polydioctylfluorene (F8) having the following formula 2 (a compound 2).

[Formula 2]

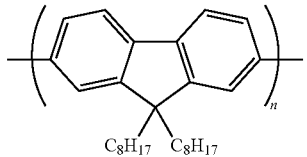

Compound 2

The organic material of the light-emitting sublayer 165 may also be a mixture of the compound 1 (TFB), the compound 2 (F8), and a compound 3 (poly(9,9-dioctylfluorene-co-benzothiadiazole), F8ET) having the following formula 3.

[Formula 3]

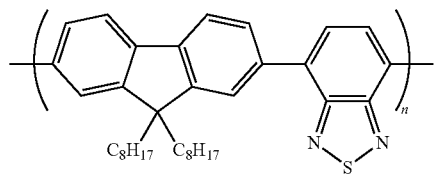

Compound 3

As illustrated in FIG. 9, an electron-injection layer 167 is disposed on the organic layer 87 in the element region 91 surrounded by the insulating film 157. The electron-injection layer 167 may be formed of calcium or an alloy containing magnesium and silver. In the present embodiment, the electron-injection layer 167 is formed of an alloy containing magnesium and silver.

The common electrode 119 is disposed on the electron-injection layer 167. The common electrode 119 may be formed of a metal, such as gold, silver, copper, or aluminum, or an alloy thereof. The common electrode 119 covers the electron-injection layer 167 and the insulating film 157 throughout the element arrangement region 73 (see FIG. 6).

Although the organic layer 87 and the electron-injection layer 167 are entirely disposed in the element region 91 surrounded by the insulating film 157 in the present embodiment, at least one (sub)layer of the organic layer 87 and the electron-injection layer 167 may be partly or entirely disposed on the top surface of the insulating film 157.

In the light-emitting panel 61, a light-emitting region in each of the light-emitting elements 67 is a region in which the pixel electrode 117, the organic layer 87, and the common electrode 119 overlap one another in each of the regions 155 and does not overlap the insulating film 151 or the insulating film 157 as viewed from the top. The light-emitting region thus defined is not necessarily the same as the actual light-emitting region of the light-emitting elements 67. In the present embodiment, the light-emitting regions (effective regions) of the light-emitting elements 67 are defined by the regions 155.

The light-emitting element 67 in each of the regions 155 can be composed of the pixel electrode 117 to the common electrode 119. Thus, in the light-emitting panel 61, one light-emitting element 67 includes one pixel electrode 117, the organic layer 87 corresponding to the pixel electrode 117, the electron-injection layer 167 corresponding to the pixel electrode 117, and (part of) the common electrode 119 corresponding to the pixel electrode 117.

Figure 11:
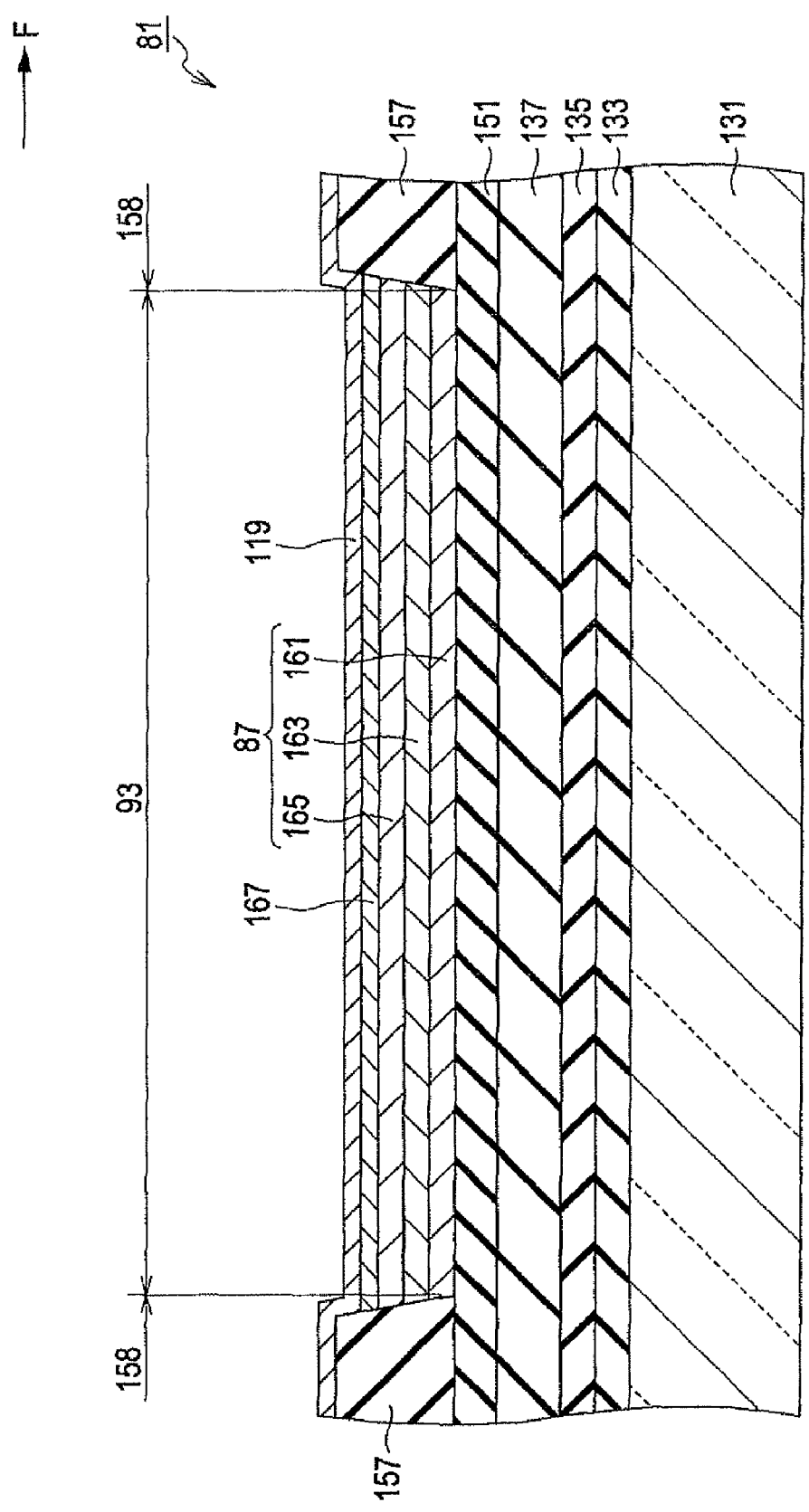
FIG. 11 is a cross-sectional view of the light-emitting panel taken along the line XI-XI in FIG. 6.

In the light-emitting panel 61, as illustrated in FIG. 11, which is a cross-sectional view taken along the line XI-XI in FIG. 6, each of the dummy regions 93 is surrounded by the insulating film 157. The dummy regions 93 are divided by the insulating film 157. Thus, each of the dummy regions 93 is defined and surrounded by the insulating film 157.

From another perspective, the insulating film 157 has openings in regions corresponding to the dummy regions 93. The insulating film 157 surrounds the individual dummy regions 93 as viewed from the top. Thus, the insulating film 157 is formed circularly around the individual dummy regions 93.

The dummy regions 93 include the organic layer 87, the electron-injection layer 167, and the common electrode 119. In the present embodiment, the dummy regions 93 include no pixel electrode 117.

The insulating film 151 is formed throughout the dummy regions 93. The organic layers 87 in the dummy regions 93 are disposed on the insulating film 151. The light-emitting sublayer 165 therefore has no function in the dummy regions 93.

In the present embodiment, the dummy arrangement region 75 (see FIG. 4) is a region in which the light-emitting sublayer 165 has no function. "The light-emitting sublayer 165 has no function", as used herein, encompasses the case in which light emitted by the light-emitting sublayer 165 cannot be used in exposure of the exposure head 39, in display of a display apparatus, or as a light source of a lighting apparatus, as well as the case in which the light-emitting sublayer 165 does not emit light.

The sealing substrate 83 may be formed of a transparent material, such as glass or quartz. As illustrated in FIG. 9, the sealing substrate 83 has an outward surface 83a facing the cover 65 and an inward surface 83b facing the photoconductive roller 33.

The common electrode 119 of the element substrate 81 and the inward surface 83b of the sealing substrate 83 are bonded together with an adhesive 175. Although the common electrode 119 of the element substrate 81 and the inward surface 83b of the sealing substrate 83 are bonded together with the adhesive 175 in the present embodiment, a space surrounded by the element substrate 81, the inward surface 83b of the sealing substrate 83, and the sealing member 85 may be filled with an inert gas, such as nitrogen. In this case, the inward surface 83b of the sealing substrate 83 may be provided with a degasser for absorbing moisture and/or oxygen.

In the light-emitting panel 61, the sealing member 85 illustrated in FIG. 5 is pinched between the element substrate 81 and the inward surface 83b of the sealing substrate 83 illustrated in FIG. 9. Thus, in the light-emitting panel 61, the light-emitting elements 67 and the adhesive 175 are sealed with the element substrate 81, the sealing substrate 83, and the sealing member 85. The sealing member 85 may be disposed between the inward surface 83b and the common electrode 119.

A method for manufacturing the light-emitting panel 61 will be described below.

A method for manufacturing the light-emitting panel 61 mainly involves a process for manufacturing the element substrate 81 and a process for fabricating the light-emitting panel 61.

In the process for manufacturing the element substrate 81, as illustrated in FIG. 12A, a drive element layer 181 is first formed on the first surface 131a of the substrate 131. The drive element layer 181 includes the select transistor 111 (see FIG. 8), the drive transistor 113, the capacitance element 115 (see FIG. 8), the scanning lines 123 (see FIG. 8), the signal lines 125 (see FIG. 8), the power supply lines 127 (see FIG. 8), the pixel electrode 117, the gate-insulating film 133, the insulating film 135, and the insulating film 137.

As illustrated in FIG. 12B, the insulating film 151 is formed in the region 153. The insulating film 151 is formed as follows: first, a silicon oxide film is formed on the pixel electrodes 117 and the insulating film 137, for example, by CVD. The silicon oxide film is then patterned, for example, by photolithography and etching. Thus, the insulating film 151 having openings in the regions 155 is formed.

The substrate 131 on which the drive element layer 181 and the insulating film 151 are formed is referred to as a substrate 182.

As illustrated in FIG. 12C, the insulating film 157 is formed in a region 158. The insulating film 157 is formed as follows: first, a film formed of an acrylic resin containing a negative photosensitive substance is formed on the pixel electrodes 117 and the insulating film 151, for example, by spin coating or printing. The resin film is then patterned, for example, by photolithography. Thus, the insulating film 157 having openings in the element regions 91 and the dummy regions 93 (see FIG. 11) is formed.

The substrate 131 on which the drive element layer 181 to the insulating film 157 are formed is referred to as a substrate 183.

Figure 13A:
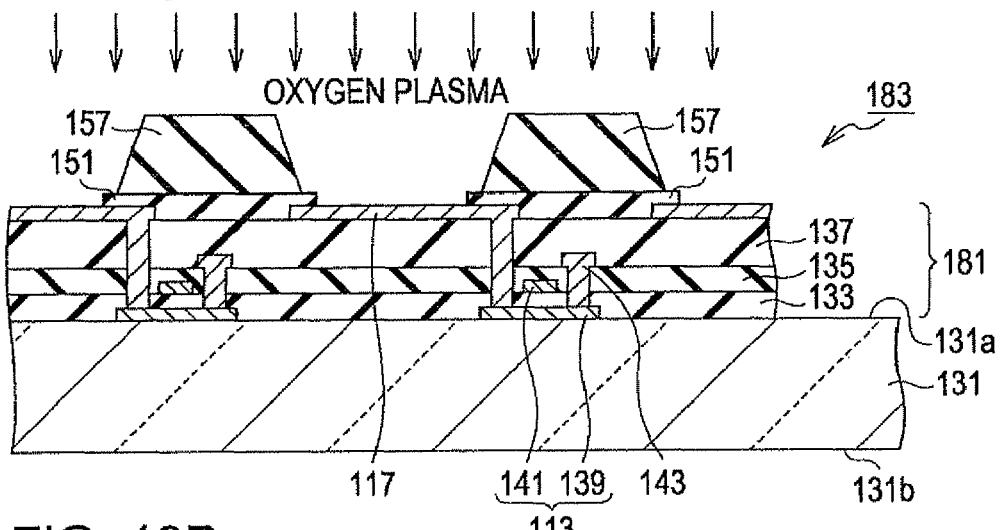
FIGS. 13A to 13C are schematic views illustrating processes for fabricating an element substrate according to an embodiment of the invention.

As illustrated in FIG. 13A, the substrate 183 is then subjected to an oxygen plasma treatment. The oxygen plasma treatment imparts an affinity for fluids 161a, 163a, and 165a described below to the pixel electrodes 117 and the insulating film 151. In the present embodiment, plasma is generated in a processing chamber at a predetermined degree of vacuum while a processing gas is introduced into the processing chamber. In the present embodiment, the processing gas is an oxygen-containing gas.

In the present embodiment, the conditions for the oxygen plasma treatment are as follows: the internal pressure of the processing chamber is approximately 133 Pa (1 Torr); the flow rate of oxygen is approximately 500 standard cubic centimeters per minute (sccm); the plasma radiation intensity is 1 W/cm$^2$; and the treatment time is 1 minute.

Figure 13B:
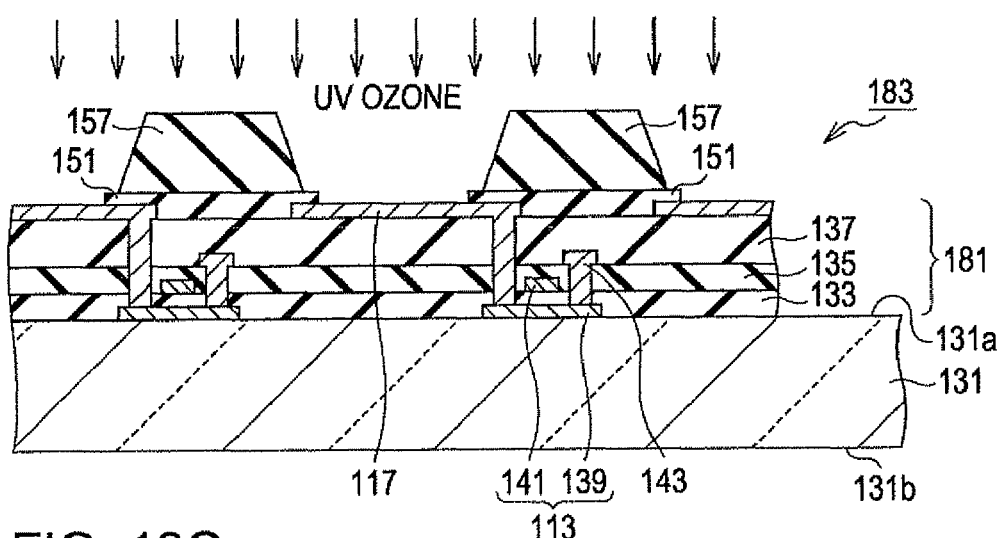

After the oxygen plasma treatment of the substrate 183, as illustrated in FIG. 13B, the substrate 183 is subjected to a UV ozone treatment. This improves the lyophilicity of the pixel electrodes 117 and the insulating film 151. In the present embodiment, ultraviolet rays are generated in a processing chamber in which the substrate 183 is placed while an oxygen-containing gas is introduced into the processing chamber.

In the UV ozone treatment of the substrate 183, a processing gas is introduced into the processing chamber in which the substrate 183 is placed while a low-pressure mercury lamp is on. In the present embodiment, the processing gas contains oxygen. Ultraviolet rays having a wavelength of approximately 185 nm decompose oxygen into ozone. Thus, the substrate 183 is exposed to UV rays and ozone.

Figure 13C:
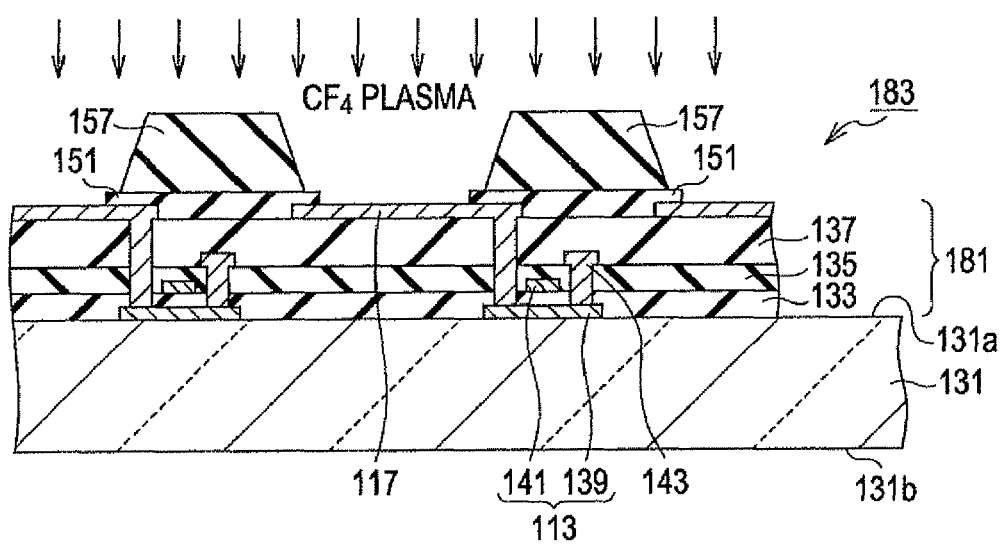

After the UV ozone treatment of the substrate 183, as illustrated in FIG. 13C, the substrate 183 is subjected to a CF$_4$ plasma treatment. The CF$_4$ plasma treatment imparts repellency to the fluids 161a, 163a, and 165a described below to the insulating film 157. In the present embodiment, plasma is generated in a processing chamber at a predetermined degree of vacuum while a processing gas is introduced into the processing chamber. In the present embodiment, the processing gas is a gas containing a fluorine compound, that is, CF$_4$ gas.

In the present embodiment, the conditions for the CF$_4$ plasma treatment are as follows: the internal pressure of the processing chamber is approximately 133 Pa (1 Torr), the flow rate of CF$_4$ gas is approximately 900 sccm; the plasma radiation intensity is 1 W/cm$^2$; and the treatment time is 30 minutes.

The processing gas is not limited to CF$_4$ gas and may be a halogen gas, such as SF$_6$ or CHF$_3$, or a fluorine gas.

After the CF$_4$ plasma treatment of the substrate 183, as illustrated in FIG. 14A, the fluid 161a is applied to the regions surrounded by the insulating film 157 (the element regions 91 and the dummy regions 93). The fluid 161a contains an organic material for the hole-injection sublayer 161. The fluid 161a may be applied by an ink jet method using a droplet discharge head 233.

A technique for discharging the fluid 161a as a droplet 161b from the droplet discharge head 233 is called an ink jet technique. A method for applying the fluid 161a to a predetermined portion by the ink jet technique is called an ink jet method. The ink jet method is one type of coating.

Figure 15:
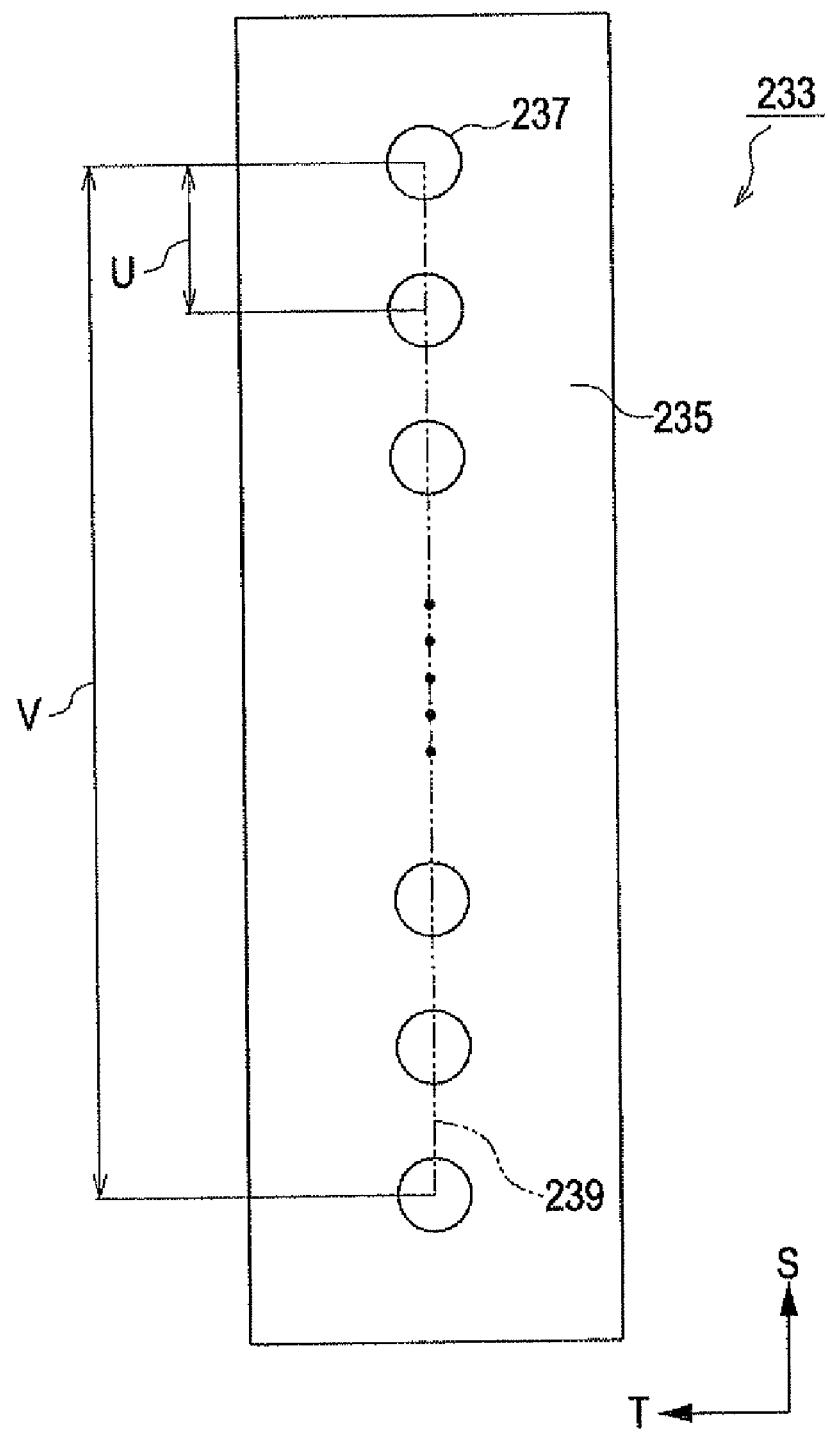
FIG. 15 is a bottom plan view of a droplet discharge head that can be used in the processes for fabricating an element substrate according to an embodiment of the invention.

In the present embodiment, as illustrated in a bottom plan view of the droplet discharge head 233 in FIG. 15, the droplet discharge head 233 has a plurality of nozzles 237 on the bottom 235. In FIG. 15, for the sake of clarity, the nozzles 237 are enlarged.

The nozzles 237 are disposed in the S direction at intervals of U. The nozzles 237 constitute an array of nozzles 239 having a length of V. In the droplet discharge head 233, discharge of the droplet 161b can be controlled for each of the nozzles 237. The length V of the array of nozzles 239 is equal to or more than the length of the element region 91 in the F direction. In the present embodiment, the length V is more than the length of the element region 91 in the F direction.

In the present embodiment, when the fluid 161a (see FIG. 14A) is applied to the regions surrounded by the insulating film 157, the S direction of the droplet discharge head 233 (see FIG. 15) is adjusted to the F direction in FIG. 6.

Preferably, while the droplet discharge head 233 is moved relative to the substrate 183 in the Y direction, the droplet 161b is discharged from the nozzles 237 of the droplet discharge head 233 into the regions surrounded by the insulating film 157.

When the S direction of the droplet discharge head 233 (see FIG. 15) is adjusted to the F direction in FIG. 6, the discharge timing of the fluid 161a is substantially the same among the nozzles 237 and is therefore easy to control. In addition, the droplet 161b can be placed along the edges of the element region 91 in the direction of the long side (the F direction) with a high degree of precision, achieving stable application of the fluid 161a. Although the S direction of the droplet discharge head 233 (see FIG. 15) is adjusted to the F direction in FIG. 6 in the present embodiment, the S direction of the droplet discharge head 233 (see FIG. 15) may be adjusted to the X direction in FIG. 6. If the S direction of the droplet discharge head 233 (see FIG. 15) is adjusted to the X direction in FIG. 6, the same head structure can be adopted in the manufacture of a light-emitting panel of another substrate design (for example, having a different F direction), allowing simplification of the droplet discharge head 233.

In order to move the droplet discharge head 233 relative to the substrate 183, the substrate 183 may be moved in the Y direction, the droplet discharge head 233 may be moved in the Y direction, or both the droplet discharge head 233 and the substrate 183 may be moved.

The droplet discharge head 233 may be moved relative to the substrate 183 continuously or intermittently.

As illustrated in FIG. 14A, the fluid 161a placed in each of the element regions 91 and the dummy regions 93 is stemmed by the insulating film 157. Thus, the insulating film 157 can function as a partition (bank) to restrict the fluid 161a in each of the element regions 91 and the dummy regions 93.

Each of the element regions 91 and the dummy regions 93 is surrounded by the partition of the insulating film 157.

The fluid 161a in each of the element regions 91 and the dummy regions 93 is dried by vacuum drying and is fired to form the hole-injection sublayer 161 illustrated in FIG. 14B. The fluid 161a may be a mixture of PEDOT and PSS dissolved or dispersed in a solvent. Examples of the solvent include diethylene glycol, isopropyl alcohol, and n-butanol. The vacuum drying is drying under reduced pressure and is also called reduced-pressure drying. The fluid 161a is fired at an environmental temperature of approximately 200° C. for approximately 10 minutes.

As illustrated in FIG. 14B, the fluid 163a is then applied to the regions surrounded by the insulating film 157 (the element regions 91 and the dummy regions 93). The fluid 163a contains an organic material for the hole-transport sublayer 163. The fluid 163a is applied by discharging the fluid 163a as a droplet 163b from the droplet discharge head 233.

The hole-injection sublayer 161 is coated with the fluid 163a. The fluid 163a may be TFB dissolved or dispersed in a solvent. The solvent may be cyclohexylbenzene.

Also in the application of the fluid 163a, preferably, the S direction of the droplet discharge head 233 (see FIG. 15) is adjusted to the F direction in FIG. 6, and the droplet 163b is discharged while the droplet discharge head 233 is moved relative to the substrate 183 in the Y direction.

The fluid 163a is dried by vacuum drying and is then fired in an inert gas to form the hole-transport sublayer 163 illustrated in FIG. 14C. The fluid 163a is fired at an environmental temperature of approximately 130° C. for approximately 1 hour.

As illustrated in FIG. 14C, the fluid 165a is then applied to the regions surrounded by the insulating film 157 (the element regions 91 and the dummy regions 93). The fluid 165a contains an organic material for the light-emitting sublayer 165. The fluid 165a is applied by discharging the fluid 165a as a droplet 165b from the droplet discharge head 233. The hole-transport sublayer 163 is coated with the fluid 165a. The fluid 165a may be F8 dissolved or dispersed in a solvent or a mixture of F8BT, TFB, and F8 dissolved or dispersed in a solvent. The solvent may be cyclohexylbenzene.

Also in the application of the fluid 165a, preferably, the S direction of the droplet discharge head 233 (see FIG. 15) is adjusted to the F direction in FIG. 6, and the droplet 165b is discharged while the droplet discharge head 233 is moved relative to the substrate 183 in the Y direction.

The fluid 165a is dried by vacuum drying and is then fired in an inert gas to form the light-emitting sublayer 165 illustrated in FIGS. 10 and 11. The fluid 165a is fired at an environmental temperature of approximately 130° C. for approximately 1 hour.

A film, for example, formed of calcium is then formed as the electron-injection layer 167 illustrated in FIGS. 10 and 11 by vapor deposition in the regions surrounded by the insulating film 157 (the element regions 91 and the dummy regions 93). The electron-injection layer 167 may be formed while the insulating film 157 is covered with a mask.

A film, for example, formed of aluminum is then formed as the common electrode 119 illustrated in FIGS. 10 and 11 by vapor deposition using a mask. The element substrate 81 is thus fabricated.

In a process for fabricating the light-emitting panel 61, as illustrated in FIG. 5, the element substrate 81 and the sealing substrate 83 are bonded together with the adhesive 175 (see FIG. 9) and the sealing member 85.

As illustrated in FIG. 9, the element substrate 81 and the sealing substrate 83 are bonded together while the first surface 131a of the substrate 131 faces the inward surface 83b of the sealing substrate 83. The light-emitting panel 61 is thus fabricated.

In the present embodiment, the printer 1 corresponds to an image recorder, the light-emitting panel 61 corresponds to a light-emitting device serving as an exposure apparatus, the substrate 182 corresponds to a substrate, and the insulating film 157 (the second partition) corresponds to a partition. The Y direction corresponds to the first direction, the F direction corresponds to the second direction and the third direction, and the X direction corresponds to the fourth direction.

In the light-emitting panel 61 according to the present embodiment, each of the element regions 91 includes three light-emitting elements 67 surrounded by the insulating film 157. Thus, each of the element regions 91 is smaller than a region including all the light-emitting elements 67.

In the fabrication of the light-emitting panel 61 according to the present embodiment, the fluids 161a, 163a, and 165a are applied to each of the element regions 91. The fluids 161a, 163a, and 165a are stemmed by the corresponding element regions 91.

In contrast, when all the light-emitting elements 67 are included in a single element region as in the element arrangement region 73 (see FIG. 4), the fluids 161a, 163a, and 165a are sequentially applied in the element arrangement region 73.

In such a case, the landing timing of the droplets 161b, 163b, and 165b may vary greatly in the element arrangement region 73.

Drying of the fluids 161a, 163a, and 165a in the element region proceeds from the outer portion to the inside of the element region. In the drying of the fluids 161a, 163a, and 165a, there is a time lag with respect to the start and end of drying (drying timing) between the outer portion and the central portion of the element region. Variations in landing timing and a lag with respect to drying timing tend to cause variations in the thicknesses of the sublayers of the organic layer 87 in the element arrangement region 73.

Variations in the thicknesses of the sublayers of the organic layer 87 increase with an increase in the area of the element arrangement region 73.

In the present embodiment, each of the element regions 91 can be smaller than the region including all the light-emitting elements 67. This can reduce variations in landing timing and the lag with respect to drying timing of the droplets 161b, 163b, and 165b in each of the element regions 91. Thus, each of the sublayers of the organic layer 87 in each of the element regions 91 can easily have the same thickness. Thus, the light-emitting elements 67 can be made to have the same luminescence properties.

In the present embodiment, the light-emitting elements 67 in each of the element region 91 are aligned in the F direction. The F direction is inclined relative to the X direction. This can increase the density of light-emitting elements 67 in the Y direction. In the light-emitting panel 61, therefore, the resolution power of the light-emitting function in the Y direction can be increased.

In the present embodiment, the element regions 91 extend in the F direction. Thus, the alignment direction of the light-emitting elements 67 in the element regions 91 is the same as the extending direction of the element regions 91. The element regions 91 can therefore be aligned efficiently. This can increase the density of element regions 91 and further increase the density of light-emitting elements 67.

Figure 16:
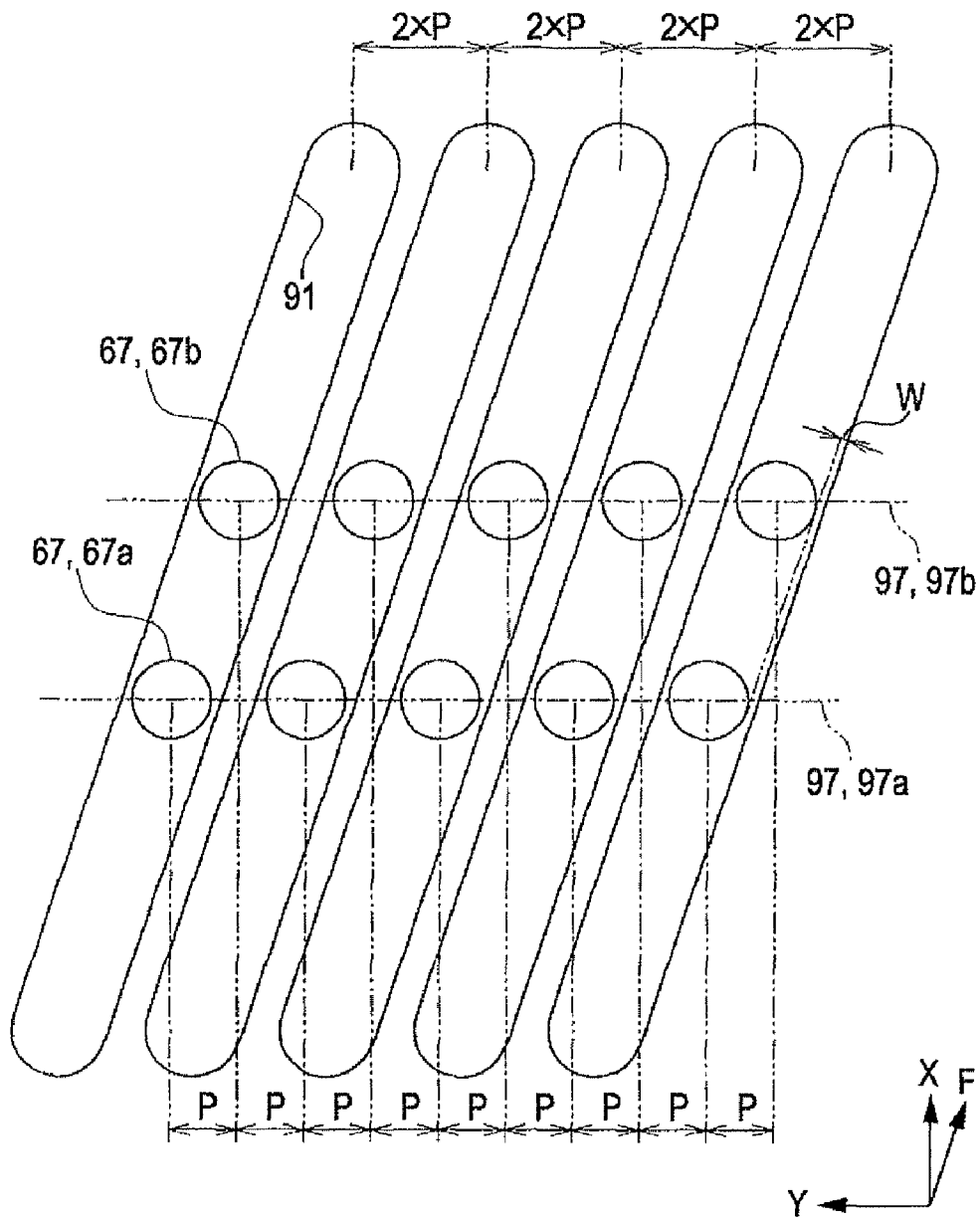
FIG. 16 is a plan view of element regions and light-emitting elements in the structure (2) of a light-emitting panel according to a first embodiment of the invention.

As illustrated in FIG. 7, although three light-emitting elements 67 (67a, 67b, and 67c) are aligned in each element region 91 in the light-emitting panel 61 according to the present embodiment (hereinafter referred to as a structure (1)), the light-emitting panel 61 may have another structure. As illustrated in FIG. 16, each element region 91 may include two light-emitting elements 67 (67a and 67b) (hereinafter referred to as a structure (2)). The structure (2) includes two element arrays 97 (97a and 97b). In the structure (2), a plurality of element regions 91 are disposed in the Y direction at intervals of 2×P.

The structure (2) can have the same advantages as the structure (1). The number of light-emitting elements 67 in each element region 91 may be any value of two or more.

The intervals between the element regions 91 in the Y direction are 2×P in the structure (2) and 3×P in the structure (1). The interval between the element regions 91 in the Y direction is smaller in the structure (2) than in the structure (1). The gap W between the light-emitting elements 67 and the insulating film 157 (see FIG. 9) is smaller in the structure (2) than in the structure (1). Thus, an increase in the density of light-emitting elements 67 in the Y direction, that is, an improvement in the printing resolution of the printer 1 is more difficult to achieve with the structure (2) than with the structure (1). Thus, the number of light-emitting elements 67 in each element region 91 is more preferably at least three.

Figure 17:
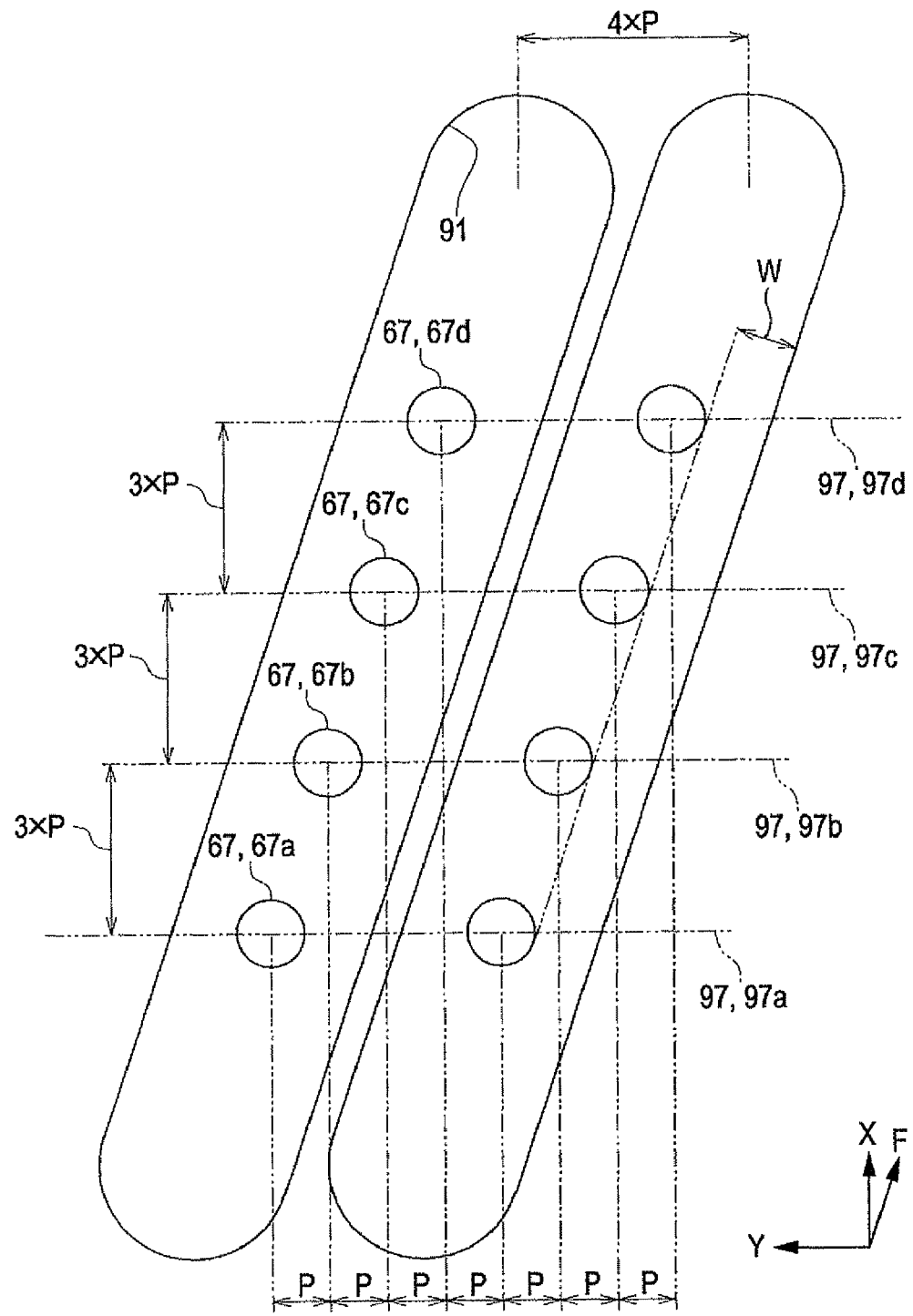
FIG. 17 is a plan view of element regions and light-emitting elements in the structure (3) of a light-emitting panel according to a first embodiment of the invention.

For example, as illustrated in FIG. 17, in a structure in which four light-emitting elements 67 (67a, 67b, 67c, and 67d) are disposed in each element region 91 (hereinafter referred to as a structure (3)), the interval between the element regions 91 in the Y direction can be 4×P. Thus, the gap W can be greater in the structure (3) than in the structure (1). Consequently, the printing resolution of the printer 1 can be improved more easily in the structure (3) than in the structure (1).

Figure 18:
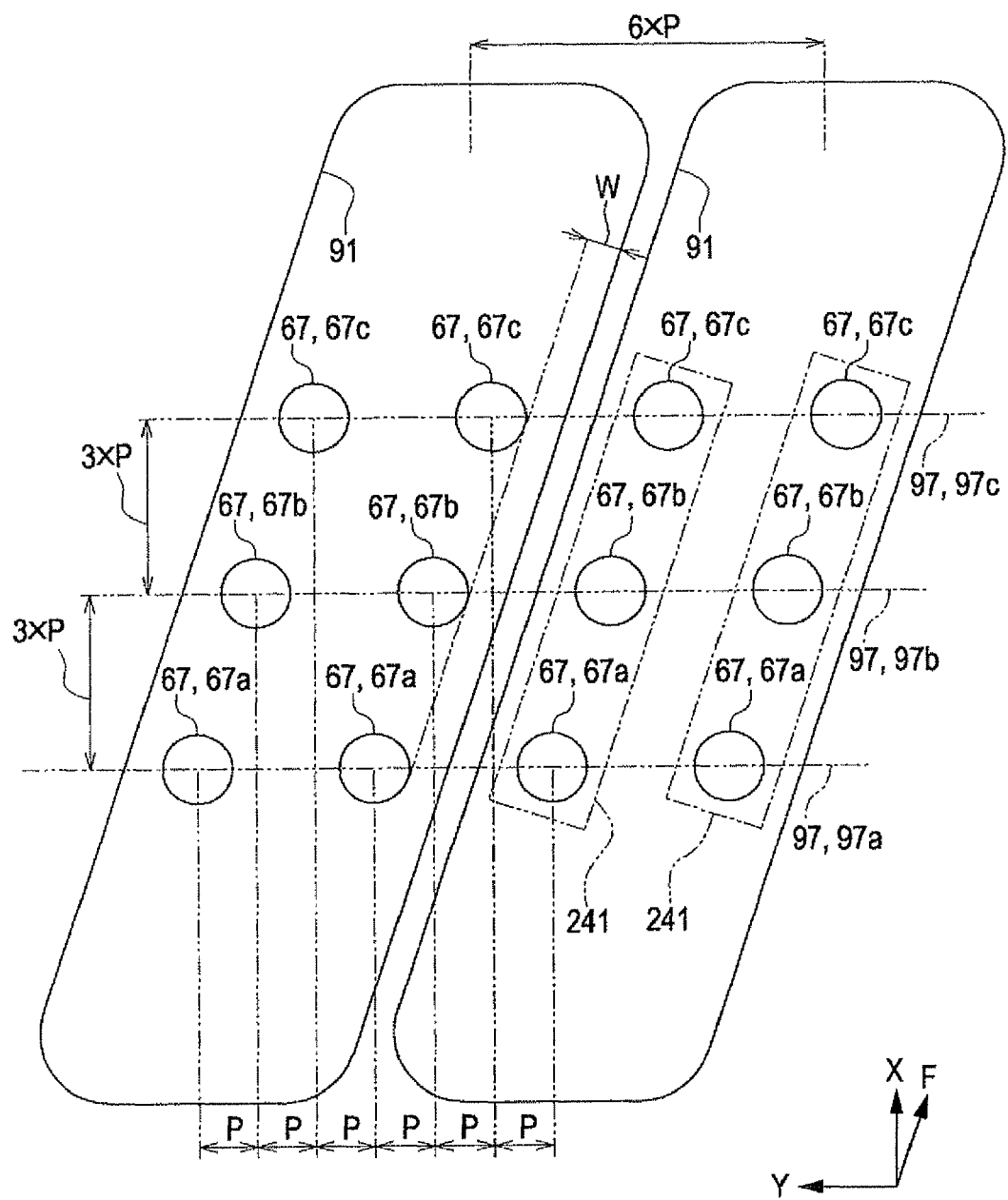
FIG. 18 is a plan view of element regions and light-emitting elements in the structure (4) of a light-emitting panel according to a first embodiment of the invention.

As illustrated in FIG. 18, in a structure in which four or more light-emitting elements 67 are disposed in each element region 91, each of the element regions 91 can include a plurality of element groups 241, one element group 241 consisting of a line of light-emitting elements 67 in the F direction.

In FIG. 18, each of the element regions 91 include two element groups 241. Each of the element groups 241 includes three light-emitting elements 67a, 67b, and 67c.

The structure in which each element region 91 includes two element groups 241 each consisting of a line of three light-emitting elements 67a, 67b, and 67c in the F direction (hereinafter referred to as a structure (4)) can have the same advantages as the structure (1). The structure (4) can have substantially the same gap W as the structure (1). Also in the structures (1), (2), and (3) (see FIGS. 7, 16, and 17), a line of light-emitting elements 67 in the F direction constitute one element group 241. In the structures (1), (2), and (3), each of the element regions 91 includes one element group 241.

The element region 91 can have a greater width in the structure (4) than in the structure (1). An increase in the width of the element region 91 means that the amounts of the fluids 161a, 163a, and 165a in the element region 91 can be increased.

This is advantageous to improvement in the printing resolution of the printer 1 or an increase in the density of light-emitting elements 67.

The width of the element region 91 decreases with an increase in the density of light-emitting elements 67. Thus, an increase in the density of light-emitting elements 67 and an increase in the area of the element region 91 are mutually contradictory. A decrease in the area of the element region 91 results in decreases in the amounts of the fluids 161a, 163a, and 165a in the element region 91. Decreases in the amounts of the fluids 161a, 163a, and 165a result in decreases in the thicknesses of the hole-injection sublayer 161, the hole-transport sublayer 163, and the light-emitting sublayer 165 formed by a single discharge of the fluids.

With an increase in the density of light-emitting elements 67, the fluids must be discharged a larger number of times to achieve desired thicknesses of the sublayers of the organic layer 87 by a coating method, such as an ink jet method.

Depending on the area of the element region 91, it may be difficult to achieve desired thicknesses of the sublayers of the organic layer 87.

Since the area of the element region 91 is greater in the structure (4) than in the structure (1), the amounts of the fluids 161a, 163a, and 165a applied to the element region 91 can be greater in the structure (4) than in the structure (1). With the structure (4), therefore, the density of light-emitting elements 67 can be increased while achieving desired thicknesses of the hole-injection sublayer 161, the hole-transport sublayer 163, and the light-emitting sublayer 165.

From another perspective, the structure (4) can shorten the time to apply the fluids 161a, 163a, and 165a.

When the structure (1) and the structure (4) are substantially equivalent in the density of light-emitting elements 67, the amount of fluid to be applied to the element region 91 by a single coating process can be greater in the structure (4) than in the structure (1), because the area of the element region 91 is greater in the structure (4) than in the structure (1). The thicknesses of the hole-injection sublayer 161, the hole-transport sublayer 163, and the light-emitting sublayer 165 formed in the element region 91 by a single coating process can be greater in the structure (4) than in the structure (1).

In other words, in order to form the hole-injection sublayer 161, the hole-transport sublayer 163, and the light-emitting sublayer 165 having the same thicknesses as the structure (4), the numbers of coating processes of the fluids 161a, 163a, and 165a are greater in the structure (1) than in the structure (4).

Consequently, predetermined thicknesses of the hole-injection sublayer 161, the hole-transport sublayer 163, and the light-emitting sublayer 165 can be achieved by a smaller number of coating processes in the structure (4) than in the structure (1). Thus, the time to form the hole-injection sublayer 161, the hole-transport sublayer 163, and the light-emitting sublayer 165 having the predetermined thicknesses can be shorter in the structure (4) than in the structure (1).

From still another perspective, the proportion of solvent in the fluids 161a, 163a, and 165a can be increased in the structure (4).

As described above, since the area of the element region 91 is greater in the structure (4) than in the structure (1), the amount of fluid to be applied per unit area is greater in the structure (4) than in the structure (1). Thus, the hole-injection sublayer 161, the hole-transport sublayer 163, and the light-emitting sublayer 165 having substantially the same thicknesses as in the structure (1) can be formed with amounts of fluids 161a, 163a, and 165a sufficiently smaller than the saturating amounts of fluids 161a, 163a, and 165a in the element region 91. Because a solvent can therefore be added to the fluids 161a, 163a, and 165a up to the saturating amounts of fluids 161a, 163a, and 165a in the element region 91, the proportions of solvents in the fluids 161a, 163a, and 165a can be increased.

Increases in the proportions of solvents in the fluids 161a, 163a, and 165a are advantageous to the ink jet method. This is because the viscosities of the fluids 161a, 163a, and 165a can be decreased.

High viscosities of the fluids 161a, 163a, and 165a may result in variations in the discharge rate and landing position of the droplets 161b, 163b, and 165b from the droplet discharge head 233. Thus, high viscosities of the fluids 161a, 163a, and 165a make the discharge control of the droplet discharge head 233 difficult.

The viscosities of the fluids 161a, 163a, and 165a can be smaller in the structure (4) than in the structure (1). In the structure (4), therefore, it is easy to control the discharge from the droplet discharge head 233. This allows each of the hole-injection sublayer 161, the hole-transport sublayer 163, and the light-emitting sublayer 165 of the light-emitting elements 67 to have a predetermined thickness more easily in the structure (4) than in the structure (1). Thus, with the structure (4), the light-emitting elements 67 can easily have the same luminance, and the print quality can be easily improved.

Although three light-emitting elements 67 constitute one element group 241 in the structure (4), the number of light-emitting elements 67 constituting one element group 241 is not limited to three and may be any value of at least two. However, an excessively large number of light-emitting elements 67 constituting one element group 241 result in differences in the thicknesses of the hole-injection sublayer 161, the hole-transport sublayer 163, and the light-emitting sublayer 165 between light-emitting elements 67 at the ends and light-emitting elements 67 at the central portion of the element group 241 in the F direction. Thus, it is desirable that the number of light-emitting elements 67 constituting one element group 241 be such that there is no significant difference in the thicknesses of the sublayers between light-emitting elements 67 at the ends and light-emitting elements 67 at the central portion of the element group 241 in the F direction.

The number of element groups 241 in each element region 91 is not limited to two and may be any value of three or more. However, an excessively large number of element groups 241 in one element region 91 result in differences in the thicknesses of the hole-injection sublayer 161, the hole-transport sublayer 163, and the light-emitting sublayer 165 between element groups 241 at the ends and element groups 241 at the central portion in the Y direction. Thus, it is desirable that the number of element groups 241 in each element region 91 be such that there is no significant difference in the thicknesses of the sublayers between element groups 241 at the ends and element groups 241 at the central portion in the Y direction.

Figure 19:
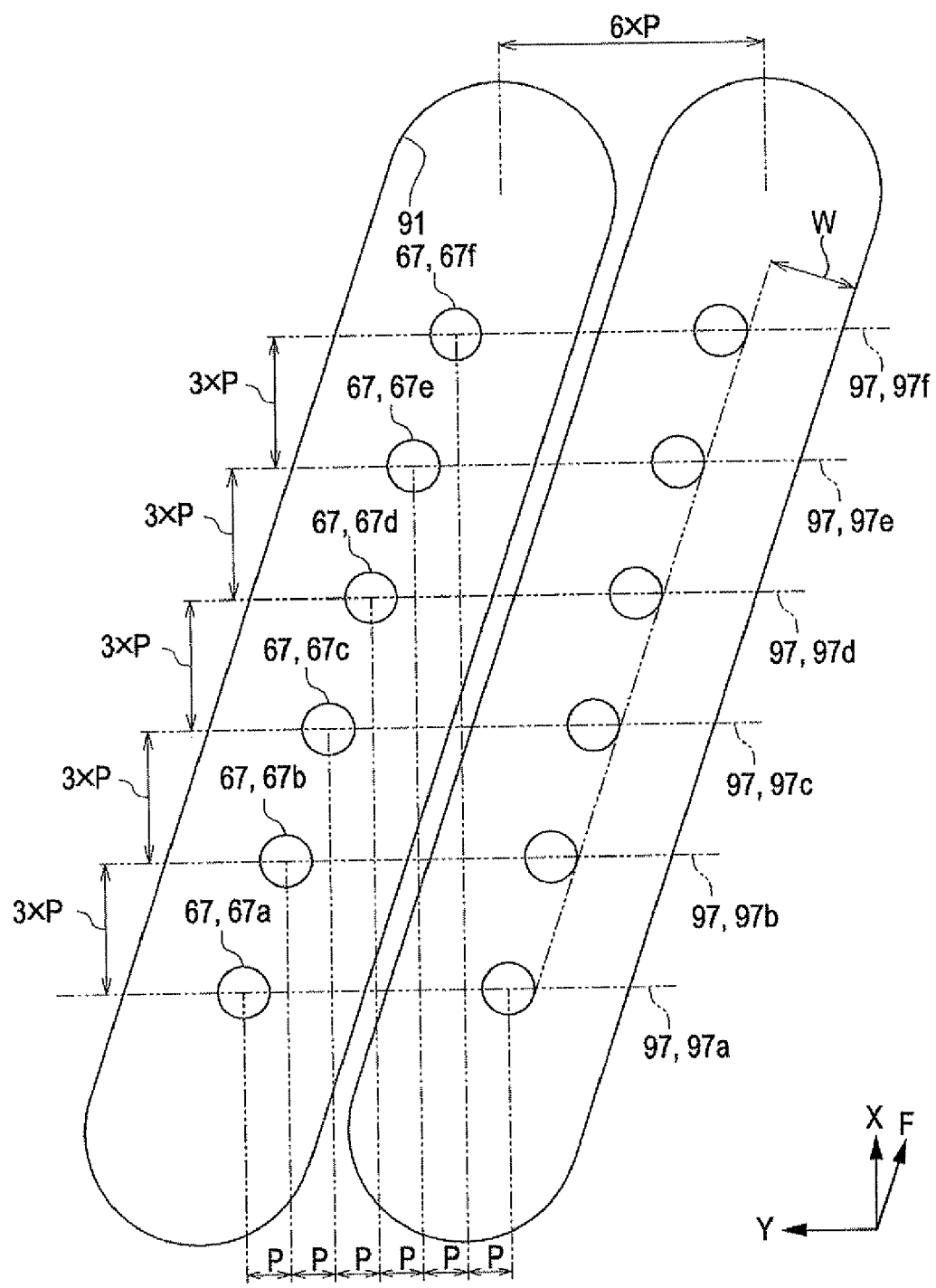
FIG. 19 is a plan view of element regions and light-emitting elements in the structure (5) of a light-emitting panel according to a first embodiment of the invention.

As described above, the gap W can be greater in the structure (3) (see FIG. 17) than in the structure (1). In the structure (3), as illustrated in FIG. 19, the number of light-emitting elements 67 in each of the element regions 91 can be increased to further increase the gap W. In FIG. 19, each of the element regions 91 includes six light-emitting elements 67 (hereinafter referred to as a structure (5)).

In a functional layer formed by coating, the thickness of the functional layer may be vary at the ends of the insulating film 157 under the influence of the insulating film 157. In order to eliminate the influence of the insulating film 157 and achieve the same thickness and luminance distribution in the light-emitting regions of the light-emitting elements 67, the gap W is preferably increased. An increase in the gap W allows a uniform film to be formed across a plurality of light-emitting elements 67.

In addition, the density of light-emitting elements 67 can be increased in proportion to an increase in the gap W.

However, the length of the element group 241 in the F direction of the element region 91 is greater in the structure (5) than in the structure (3). In other words, in the structure (3), the length of the element group 241 in the F direction of the element region 91 increases with an increase in the number of light-emitting elements 67 in the element region 91.

In the case that the element region 91 is long and narrow, a fluid on the element region 91 tends to flow in the longitudinal direction of the element region 91 during drying, causing a difference in the film thickness between the ends and the central portion in the longitudinal direction of the element region 91. This difference tends to increase with the ratio of the length in the longitudinal direction to the length in the transverse direction of the element region 91.

When the area of the element region 91 in the structure (3) is the same as that in the structure (5), as the number of light-emitting elements 67 in one element group 241 increases, the ends of the element group 241 approach the ends of the element region 91 in the F direction (the longitudinal direction) more closely in the structure (5) than in the structure (3). Thus, the structure (5) is more likely to have variations in the film thickness in the longitudinal direction. In other words, in the case that the element region 91 is long and narrow, the difference in the thicknesses of the hole-injection sublayer 161, the hole-transport sublayer 163, and the light-emitting sublayer 165 of the light-emitting element 67 between the ends and the central portion of the element group 241 in the longitudinal direction of the element region 91 increases with the gap between the ends of the element group 241 and the ends of the element region 91 in the longitudinal direction of the element region 91.

Even when the length of the element region 91 in the longitudinal direction of the element region 91 is increased in accordance with an increase in the length of the element group 241 in the longitudinal direction, a high ratio of the length of the element group 241 to the length of the element region 91 in the longitudinal direction of the element region 91 also results in large variations in the thicknesses of the sublayers. (However, the center of the element group 241 in the longitudinal direction of the element region 91 is located substantially at the center of the element region 91 in the longitudinal direction.)

It is desirable that the gap between the ends of the element group 241 and the ends of the element region 91 in the longitudinal direction of the element region 91 be sufficiently large to reduce the influence of variations in film thickness in the longitudinal direction of the element region 91. For example, the gap is effectively at least three times the length of the element group 241 in the longitudinal direction of the element region 91.

As described above, a small gap between the ends of the element group 241 and the ends of the element region 91 in the longitudinal direction of the element region 91 tends to result in variations in the luminance of the light-emitting elements 67. Thus, it is difficult to improve the print quality of the printer 1.

Thus, the structure (4) (see FIG. 18) is preferably employed to improve the print quality of the printer 1. In the structure (4), as compared with the structure (5) (see FIG. 19), the gap between the ends of the element group 241 and the ends of the element region 91 in the F direction (the longitudinal direction) of the element region 91 can be increased, and the length of the element region 91 in the F direction can be decreased. Consequently, the structure (4) can improve the print quality of the printer 1.

Figure 20:
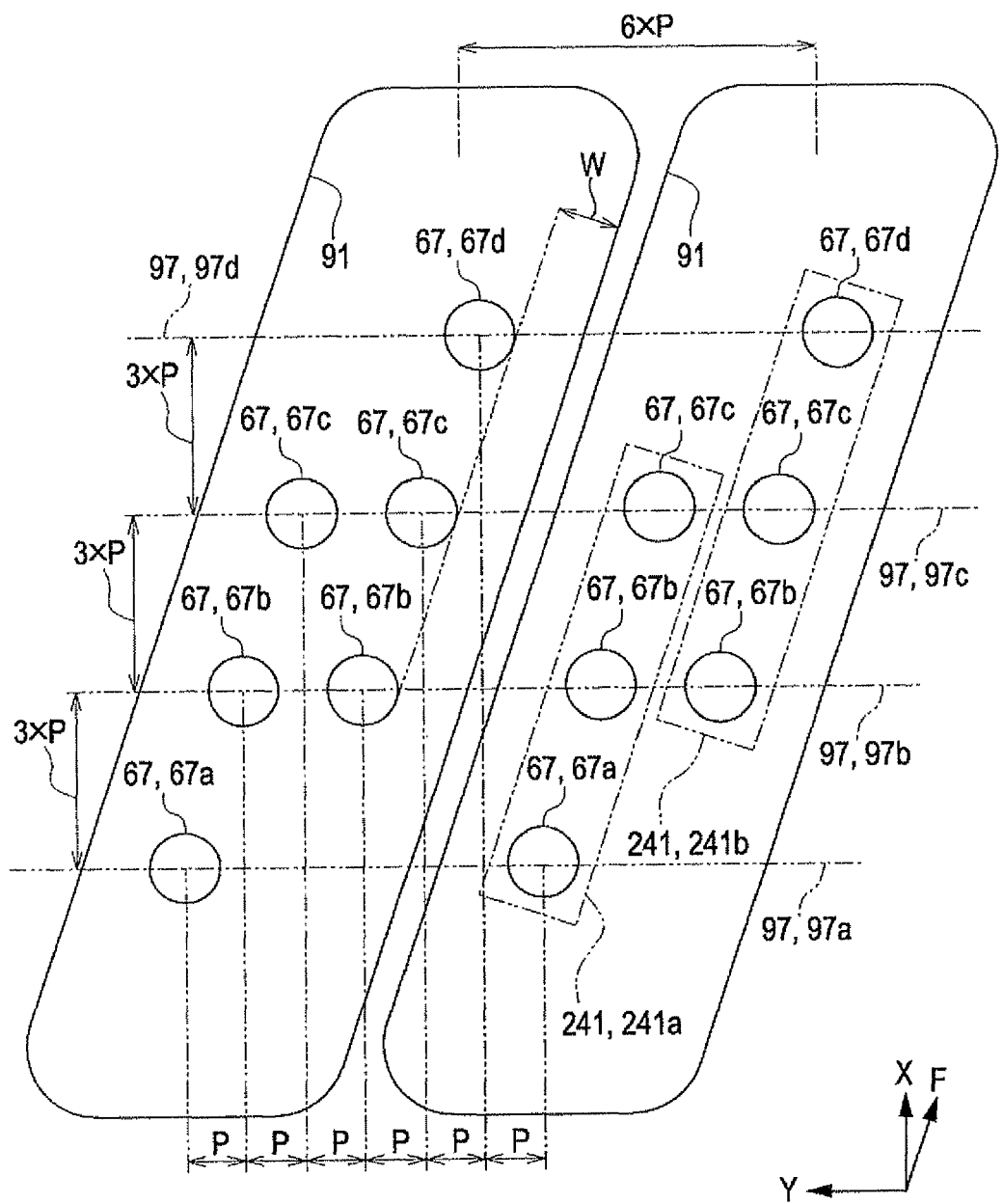
FIG. 20 is a plan view of element regions and light-emitting elements in the structure (6) of a light-emitting panel according to a first embodiment of the invention.

In the structure (4), as illustrated in FIG. 20, preferably, a plurality of element groups 241 in the element region 91 are moved relative to each other in the X direction to improve the print quality of the printer 1.

In FIG. 20, each element region 91 includes two element groups 241 (241a and 241b). One element group 241a includes a line of three light-emitting elements 67a, 67b, and 67c in the F direction. The other element group 241b includes a line of three light-emitting elements 67b, 67c, and 67d in the F direction.

The distance between the light-emitting element 67a in the element group 241a and the light-emitting element 67b in the element group 241b is 3×P in the X direction. Thus, the distance between the element group 241a and the element group 241b is considered as 3×P in the X direction.

The distance between the light-emitting element 67a in the element group 241a and the light-emitting element 67b in the element group 241b is 3×P in the Y direction. Thus, the distance between the element group 241a and the element group 241b is considered as 3×P in the Y direction.

The structure illustrated in FIG. 20 is referred to as a structure (6).

The structure (4) includes three element arrays 97 (97a, 97b, and 97c), whereas the structure (6) includes four element arrays 97 (97a, 97b, 97c, and 97d).

The element array 97a in the structure (6) includes a plurality of light-emitting elements 67a in the Y direction at intervals of 6×P.

The element array 97b includes two light-emitting elements 67b in the Y direction at intervals of 2×P in each element region 91. In the element array 97b, a pair of light-emitting elements 67b in the Y direction in each element region 91 are aligned in the Y direction at intervals of 6×P.

The element array 97c includes two light-emitting elements 67c in each element region 91 in the Y direction at intervals of 2×P. The element array 97c includes a plurality of pairs of light-emitting elements 67c in the Y direction at intervals of 6×P.

The element array 97d includes a plurality of light-emitting elements 67d in the Y direction at intervals of 6×P.

In the element group 241a, the distances between the light-emitting element 67a and the light-emitting element 67b are P in the Y direction and 3×P in the X direction. In the element group 241a, the distances between the light-emitting element 67b and the light-emitting element 67c are P in the Y direction and 3×P in the X direction.

In the element group 241b, the distances between the light-emitting element 67b and the light-emitting element 67c are P in the Y direction and 3×P in the X direction. In the element group 241b, the distances between the light-emitting element 67c and the light-emitting element 67d are P in the Y direction and 3×P in the X direction.

In each element region 91, the distances between the light-emitting element 67a and the light-emitting element 67d are 5×P in the Y direction and 9×P in the X direction.

Thus, in the structure (6), the distances between the element group 241a and the element group 241b are 3×P in the Y direction and 3×P in the X direction.

In the structure (6), as compared with the structure (4) (see FIG. 18), the gap W can be increased, and the distance between the element group 241a and the element group 241b can be decreased in the direction perpendicular to the F direction. Consequently, the print quality and printing resolution of the printer 1 can be improved more easily in the structure (6) than in the structure (4).

In the structure (6), the two element groups 241a and 241b in the element region 91 are moved relative to each other in the X direction by a distance of 3×P. Although the distance between the element groups 241a and 241b is not limited to 3×P, a distance of 9×P or more results in the length of the element region 91 in the F direction greater than that in the structure (5). Thus, the distance is preferably less than 9×P.

Figure 21:
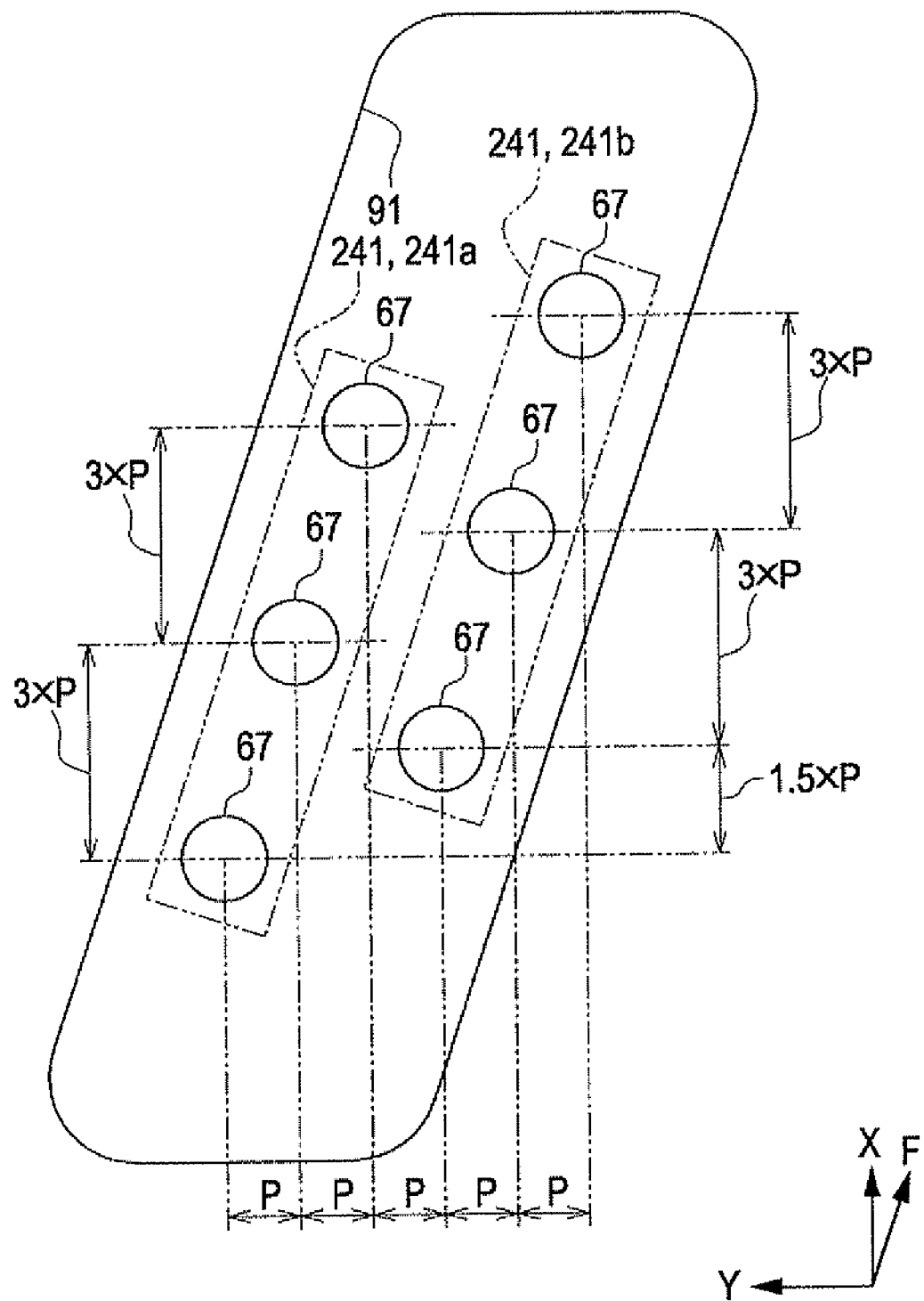
FIG. 21 is a plan view of element regions and light-emitting elements in the structure (7) of a light-emitting panel according to a first embodiment of the invention.

For example, as illustrated in FIG. 21, the distance between the element groups 241a and 241b may be more than zero but less than 3×P.

A structure in which the distance between the element groups 241a and 241b is more than zero but less than 3×P is referred to as a structure (7). In the structure illustrated in FIG. 21, the distance between the element groups 241a and 241b is 1.5×P.

Although three light-emitting elements 67 constitute one element group 241 in the structure (7), the number of light-emitting elements 67 constituting one element group 241 is not limited to three.

Figure 22:
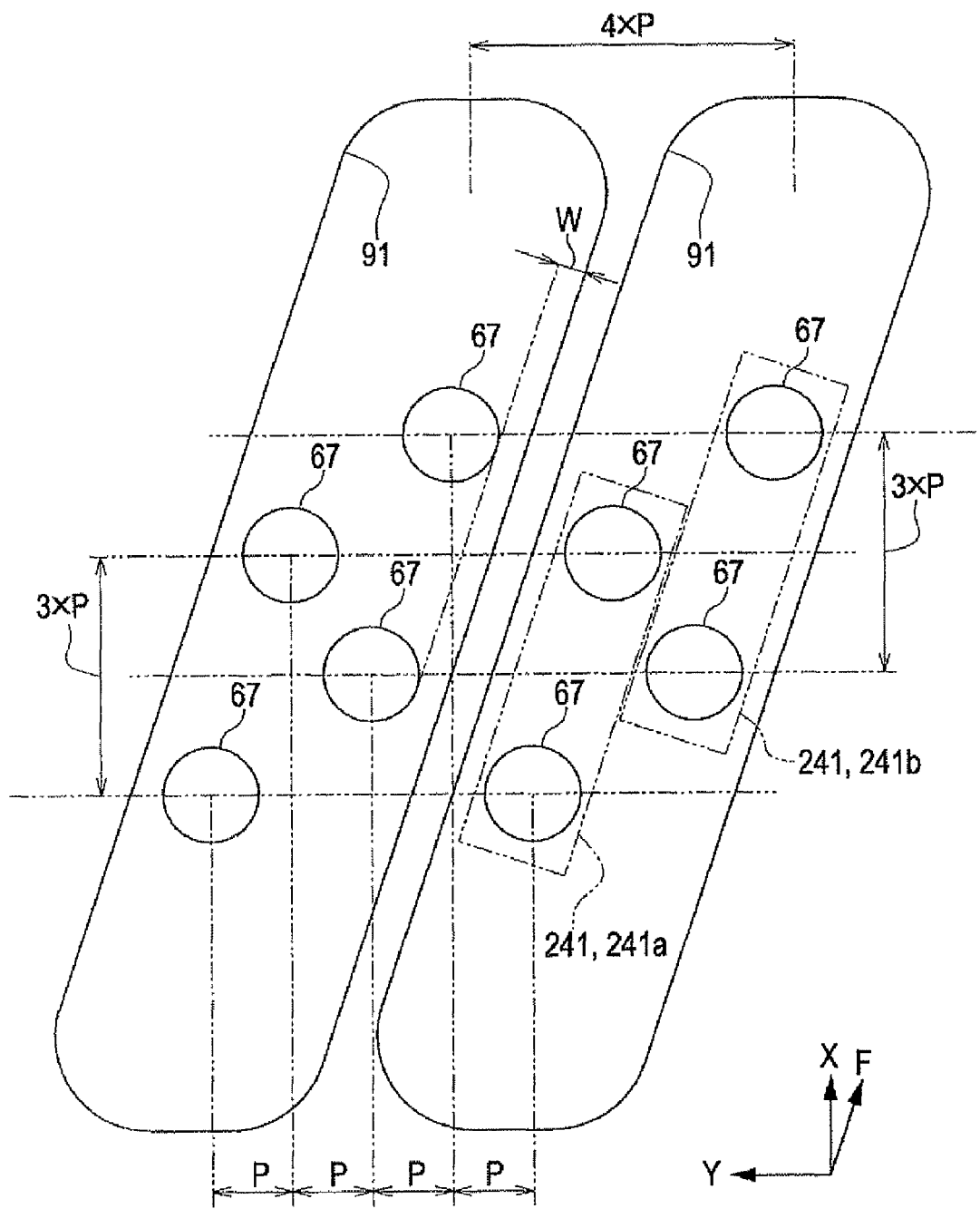
FIG. 22 is a plan view of element regions and light-emitting elements in the structure (8) of a light-emitting panel according to a first embodiment of the invention.

As illustrated in FIG. 22, one element group 241 may include two light-emitting elements 67 (hereinafter referred to as a structure (8)). In the structure (8), a plurality of element regions 91 are disposed in the Y direction at intervals of 4×P.

The structure (8) can have the same advantages as the structure (7). The number of light-emitting elements 67 constituting one element group 241 may be any value of two or more.

The intervals between the element regions 91 in the Y direction are 6×P in the structure (6) and (7) (see FIGS. 20 and 21) and 4×P in the structure (8). The interval between the element regions 91 in the Y direction is smaller in the structure (8) than in the structure (6) or (7). The gap W of the structure (8) in FIG. 22 is therefore smaller than the gap W of the structure (6) illustrated in FIG. 20. Thus, an increase in the density of light-emitting elements 67 in the Y direction, that is, an improvement in the printing resolution of the printer 1 is more difficult to achieve with the structure (8) than with the structures (6) and (7). Thus, the number of light-emitting elements 67 constituting one element group 241 is more preferably at least three.

Figure 23:
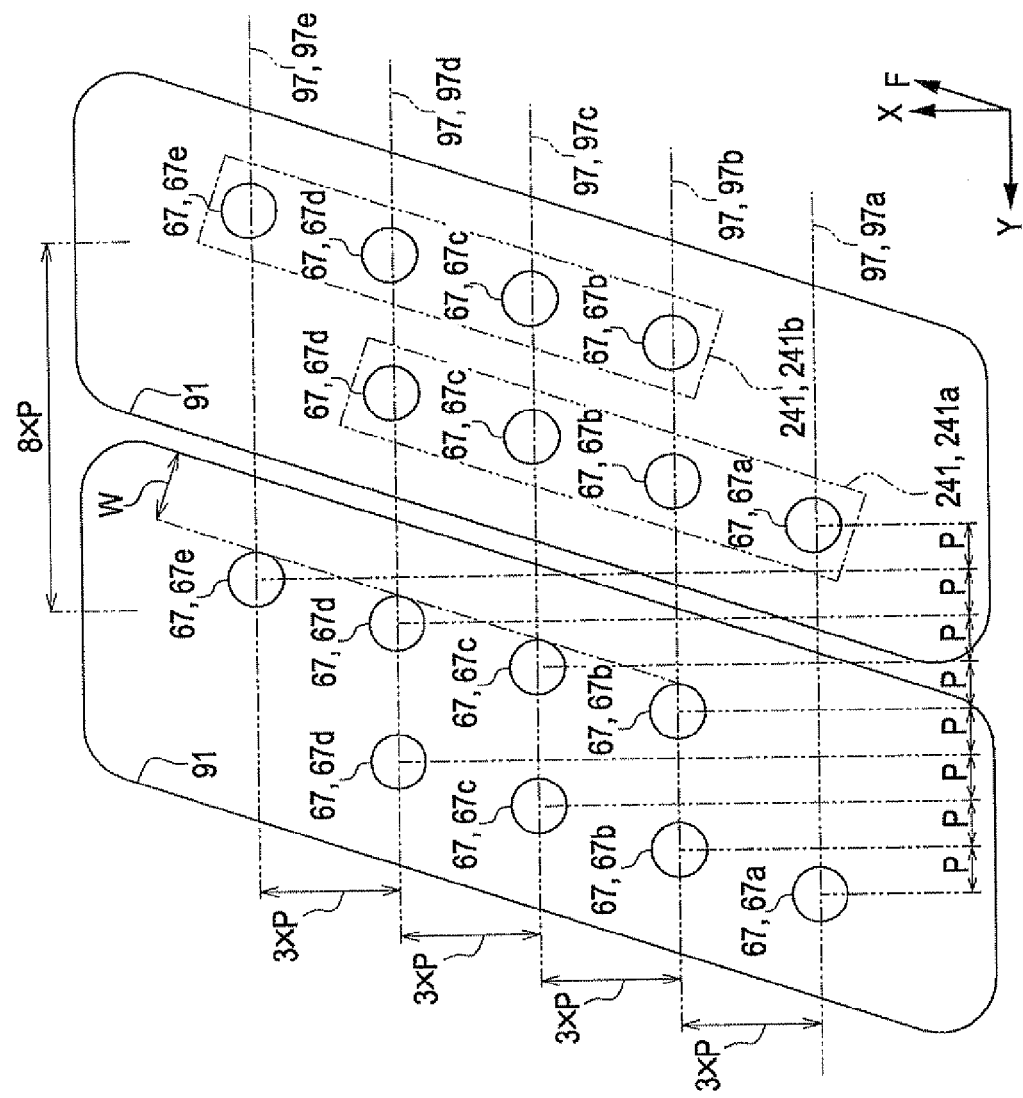
FIG. 23 is a plan view of element regions and light-emitting elements in the structure (9) of a light-emitting panel according to a first embodiment of the invention.

For example, as illustrated in FIG. 23, in a structure in which four light-emitting elements 67 constitute one element group 241 (hereinafter referred to as a structure (9)), the interval between the element regions 91 in the Y direction can be 8×P. Thus, the gap W can be greater in the structure (9) than in the structure (6) or (7) (see FIG. 20 or 21). Consequently, the printing resolution of the printer 1 can be improved more easily in the structure (9) than in the structure (6) or (7).

In the structures (6), (7), (8), and (9) (see FIGS. 20, 21, 22, and 23), the number of element groups 241 in each element region 91 is not limited to two and may be any value of three or more.

Figure 24:
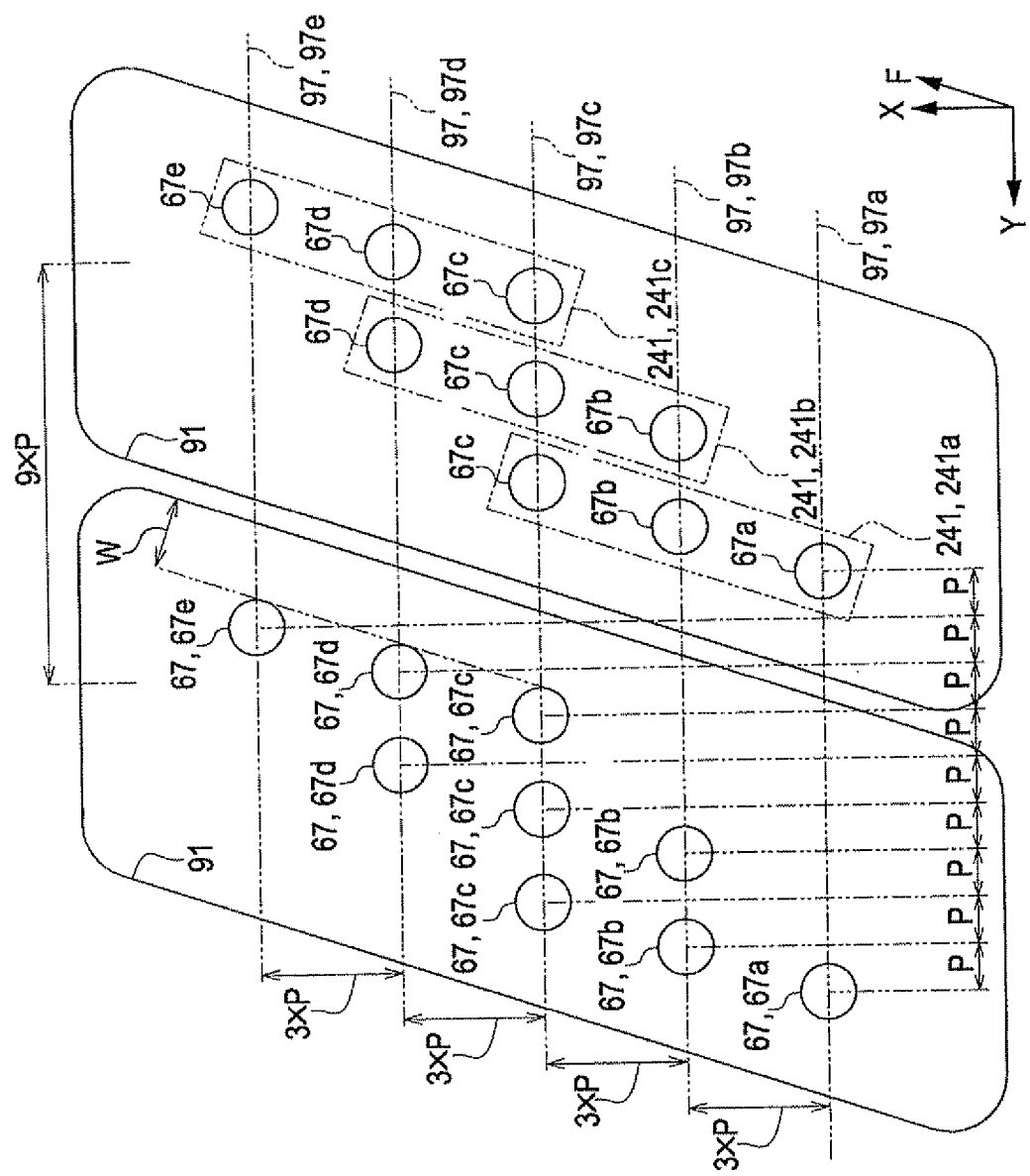
FIG. 24 is a plan view of element regions and light-emitting elements in the structure (10) of a light-emitting panel according to a first embodiment of the invention.

For example, as illustrated in FIG. 24, in a structure in which one element group 241 (241c) is added to the structure (6) (hereinafter referred to as a structure (10)), the gap W can be greater than the gap W in the structure (6).

In the structure (10), the element group 241c includes a line of three light-emitting elements 67c, 67d, and 67e in the F direction. The distance between the light-emitting element 67b in the element group 241b and the light-emitting element 67c in the element group 241c is 3×P in the X direction. Thus, the distance between the element group 241b and the element group 241c is considered as 3×P in the X direction.

The distance between the light-emitting element 67b in the element group 241b and the light-emitting element 67c in the element group 241c is 3×P in the Y direction. Thus, the distance between the element group 241b and the element group 241c is considered as 3×P in the Y direction.

The structure (6) (see FIG. 20) includes four element arrays 97 (97a, 97b, 97c, and 97d), whereas the structure (10) includes five element arrays 97 (97a, 97b, 97c, 97d, and 97e), as illustrated in FIG. 24.

The element array 97a in the structure (10) includes a plurality of light-emitting elements 67a in the Y direction at intervals of 9×P.

The element array 97b includes two light-emitting elements 67b in the Y direction at intervals of 2×P in each element region 91. In the element array 97b, a pair of light-emitting elements 67b in the Y direction in each element region 91 are aligned in the Y direction at intervals of 9×P.

In the element array 97c, three light-emitting elements 67c are aligned in the Y direction at intervals of 2×P in each element region 91. In the element array 97c, a triplet of light-emitting elements 67c in the Y direction in each element region 91 are aligned in the Y direction at intervals of 9×P.

The element array 97d includes two light-emitting elements 67d in the Y direction at intervals of 2×P in each element region 91. In the element array 97d, a pair of light-emitting elements 67d in the Y direction in each element region 91 are aligned in the Y direction at intervals of 9×P.

The element array 97e includes a plurality of light-emitting elements 67e in the Y direction at intervals of 9×P.

In each element region 91, the distances between the light-emitting element 67a and the light-emitting element 67e are 8×P in the Y direction and 12×P in the X direction.

As described above, the gap W can be greater in the structure (10) than in the structure (6). Consequently, the printing resolution of the printer 1 can be improved more easily in the structure (10) than in the structure (6).

The element region 91 can have a greater width in the structure (10) than in the structure (6). From various perspectives, an increase in the width of the element region 91 is advantageous to an increase in the density of light-emitting elements 67. Examples of the perspectives include the three perspectives described above. That is, a first perspective is to achieve desired thicknesses of the sublayers of the organic layer 87. A second perspective is to shorten the time to apply the fluids 161a, 163a, and 165a. A third perspective is to increase the proportions of solvents in the fluids 161a, 163a, and 165a.

Also in the structure (7), (8), and (9) (see FIGS. 21, 22, and 23), the addition of one element group 241 (241c) can have the same advantages.

More specifically, in a structure in which one element group 241 (241c) is added to the structure (7), the gap W and the width of the element region 91 can be greater than the gap W and the width of the element region 91 in the structure (7).

Also in a structure in which one element group 241 (241c) is added to the structure (8), the gap W and the width of the element region 91 can be greater than the gap W and the width of the element region 91 in the structure (8).

Also in a structure in which one element group 241 (241c) is added to the structure (9), the gap W and the width of the element region 91 can be greater than the gap W and the width of the element region 91 in the structure (9).

In the structure (10) (see FIG. 24), the direction in which the light-emitting element 67a in the element group 241a, the light-emitting element 67b in the element group 241b, and the light-emitting elements 67c in the element group 241c are aligned is defined as a fifth direction. The fifth direction is also the direction in which the light-emitting element 67b of the element group 241a, the light-emitting element 67c of the element group 241b, and the light-emitting element 67d of the element group 241c are aligned. The fifth direction is also the direction in which the light-emitting element 67c of the element group 241a, the light-emitting element 67d of the element group 241b, and the light-emitting element 67e of the element group 241c are aligned.

Figure 25:
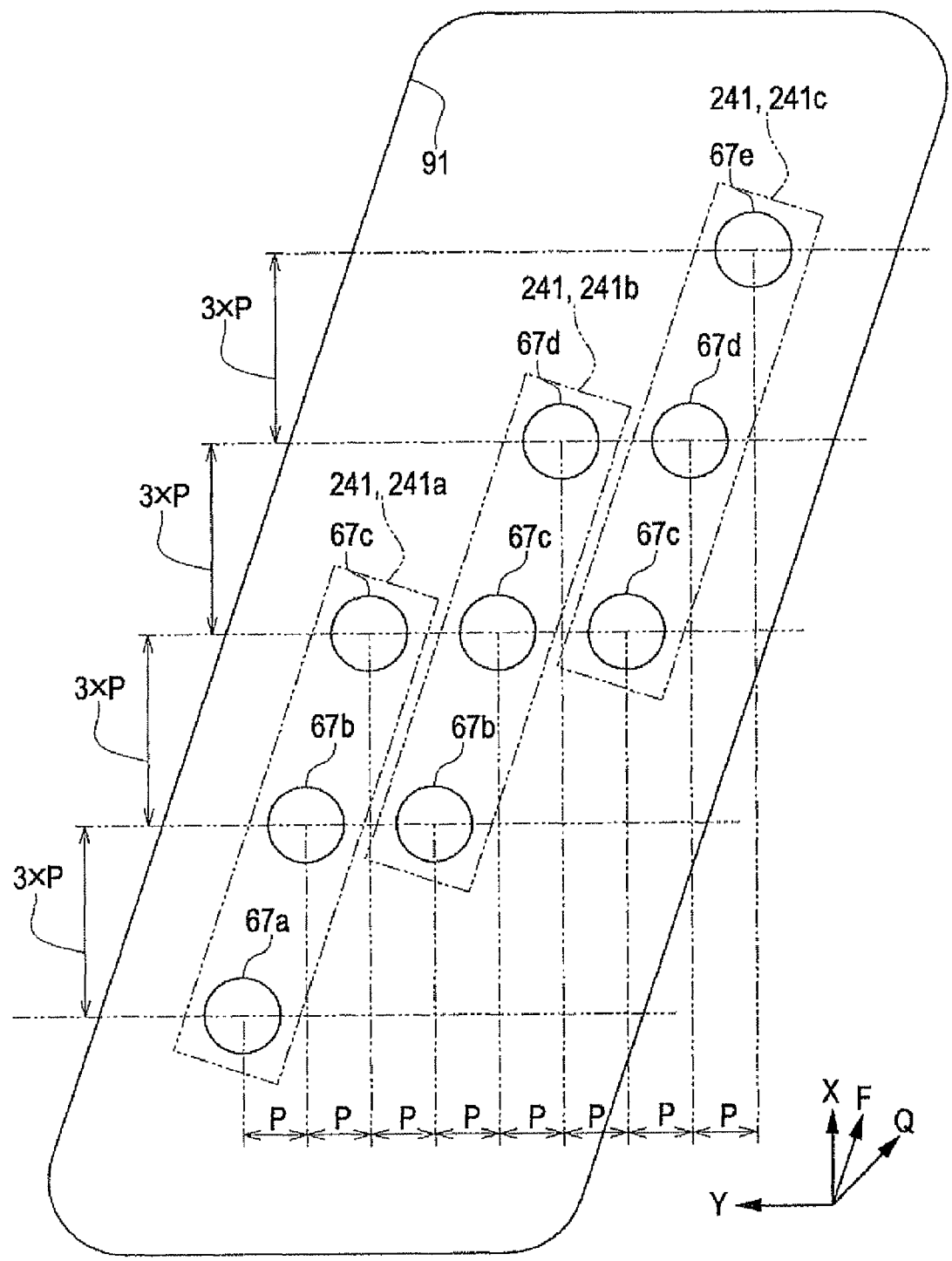
FIG. 25 is a plan view of element regions and light-emitting elements in the structure (10) of a light-emitting panel according to a first embodiment of the invention.

As illustrated in FIG. 25, the fifth direction in the structure (10) is referred to as a Q direction. Thus, the element groups 241a, 241b, and 241c in FIG. 25 are also arranged in the Q direction. In other words, the fifth direction is also the direction in which a plurality of element groups 241 are arranged.

Focusing on the direction in which the element groups 241 are arranged, the present inventor created the structure in which each element region 91 extends in the direction in which the element groups 241 are arranged, that is, the Q direction (hereinafter referred to as a structure (11)).

Figure 26:
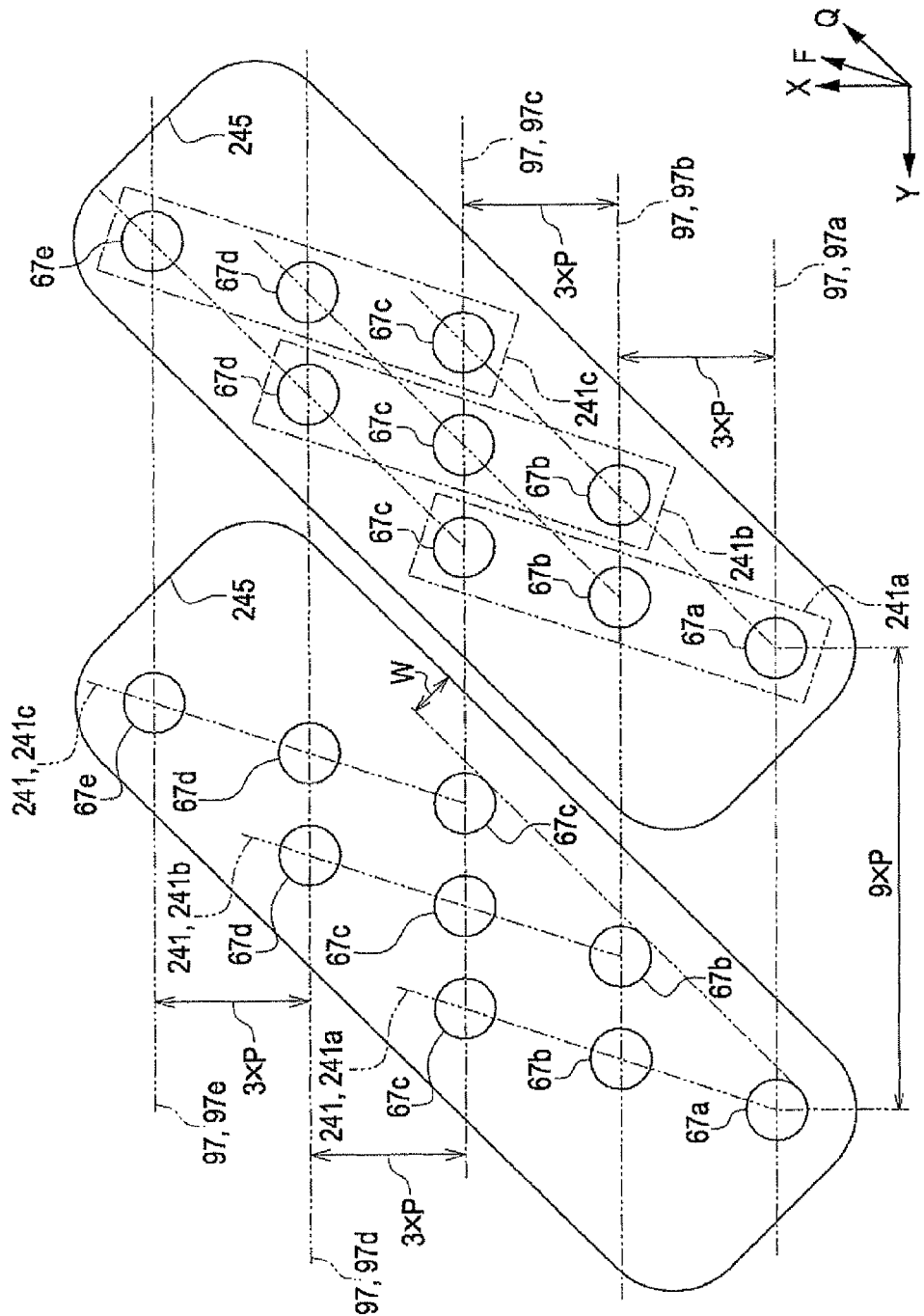
FIG. 26 is a plan view of element regions and light-emitting elements in the structure (11) of a light-emitting panel according to a first embodiment of the invention.

As illustrated in FIG. 26, the longitudinal direction of each element region 245 in the structure (11) is the Q direction. In the structure (11), the Q direction in which the element region 245 extends corresponds to the fifth direction.

Each element region 245 includes three element groups 241 (241a, 241b, and 241c) arranged in the Q direction. The element region 245 covers (overlaps as viewed from the top) the three element groups 241 (241a, 241b, and 241c) arranged in the Q direction.

The structure (11) also includes a plurality of element regions 245 in the Y direction at intervals of 9×P. Two adjacent element regions 245 in the Y direction are separated by a gap (the insulating film 157). The structure (11) has the gap W between the light-emitting elements 67 and an edge of the element region 245.

The element region 245 in the structure (11) can be efficiently narrower than the element region 91 in the structure (10) (see FIG. 24).

In particular, the length of the element region 245 in the Q direction can be smaller than the length of the element region 91 in the F direction.

Shortening the length of the element region 245 in the Q direction is preferred because the sublayers of the organic layer 87 in the element region 245 can easily have the same thicknesses.

Drying of the fluids 161a, 163a, and 165a in the element region 245 proceeds from the outer portion to the inside of the element region 245. In the drying of the fluids 161a, 163a, and 165a, there is a time lag with respect to the start and end of drying (drying timing) between the outer portion and the central portion of the element region 245.

A lag with respect to drying timing between the outer portion and the central portion of the element region 245 in the Q direction increases with the length of the element region 245 in the Q direction.

An increase in drying timing lag in the element region 245 tends to result in larger variations in the thicknesses of the sublayers after drying between the outer portion and the central portion of the element region 245 in the Q direction. This tends to result in variations in luminance between the light-emitting elements 67 at the outer portion and the light-emitting elements 67 at the central portion of the element region 245 in the Q direction.

In this respect, in the structure (11), the length of the element region 245 in the Q direction can be smaller than the length of the element region 91 in the F direction. This can reduce the lag with respect to drying timing between the outer portion and the central portion of the element region 245 in the Q direction. A decrease in drying timing lag can result in smaller variations in the thicknesses of the hole-injection sublayer 161, the hole-transport sublayer 163, and the light-emitting sublayer 165 in the element region 245. This can reduce variations in luminance between the light-emitting elements 67 in the element region 245. Consequently, the structure (11) can improve the print quality of the printer 1.

In the structures (10) and (11), the third direction in which the element region 245 extends and the fifth direction in which a plurality of element groups 241 are arranged are the same as the Q direction. In the structures (4) to (9), the third direction in which the element region 91 extends is different from the fifth direction in which a plurality of element groups 241 are arranged. The third direction is the same as the second direction in which the light-emitting elements 67 are aligned in one element groups 241. The third direction and the second direction are the same as the F direction.

In the present embodiment, the dummy arrangement region 75 surrounds the element arrangement region 73 (see FIG. 4). The dummy arrangement region 75 includes a plurality of dummy regions (see FIG. 6).

The dummy regions can further decrease the drying timing lag of the fluids 161a, 163a, and 165a in the element regions 91 and the element regions 245. In the present embodiment, therefore, the print quality of the printer 1 can be further improved.

In the first embodiment (the structures (1) to (11)), although the light-emitting panel 61 includes the light-emitting elements 67 aligned in the Y direction at intervals of P, the light-emitting panel 61 may have another structure. The light-emitting panel 61 may have a structure in which a plurality of light-emitting elements 67 overlapping one another in the X direction are repeatedly arranged in the Y direction at intervals of P.

A light-emitting panel 100 having a structure in which a plurality of light-emitting elements 67 overlapping one another in the X direction are repeatedly arranged in the Y direction at intervals of P will be described below as a second embodiment.

The light-emitting panel 100 according to the second embodiment has the same structure as the light-emitting panel 61 except that a plurality of light-emitting elements 67 overlapping one another in the X direction are repeatedly arranged in the Y direction at intervals of P. The same components in the light-emitting panel 100 as in the light-emitting panel 61 are denoted by the same reference numerals and will not be further described.

A printer 1 according to the second embodiment has the same structure as the printer 1 according to the first embodiment except that the light-emitting panel 100 substitutes for the light-emitting panel 61. The printer 1 and the structure of the printer 1 will not be further described.

Figure 27:
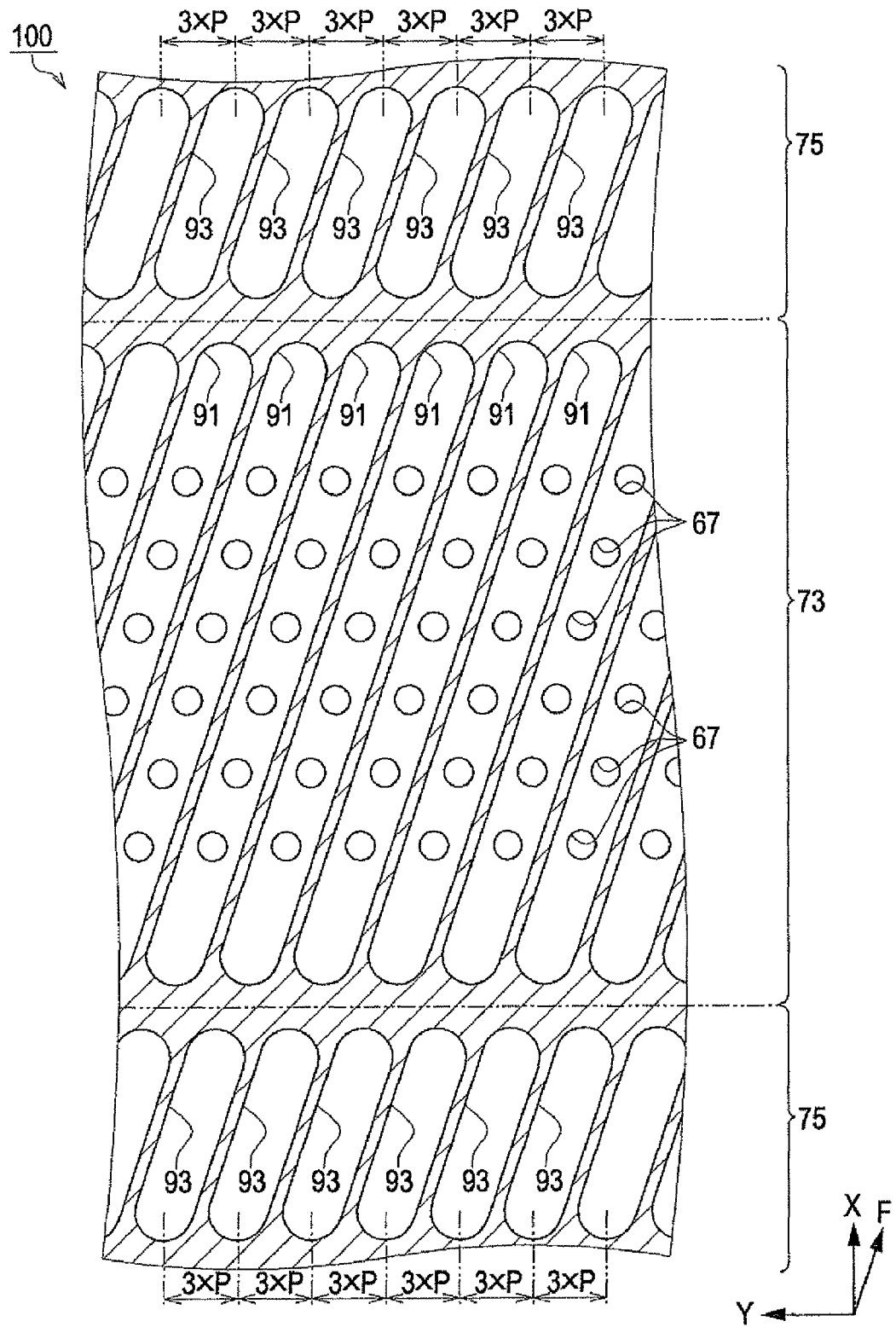
FIG. 27 is an enlarged view of a portion VI of a light-emitting panel according to a second embodiment of the invention illustrated in FIG. 4.

As illustrated in FIG. 27, the light-emitting panel 100 also includes a plurality of element regions 91 in the element arrangement region 73. Each of the element regions 91 includes a plurality of light-emitting elements 67. In the present embodiment, each of the element regions 91 includes six light-emitting elements 67.

Figure 28:
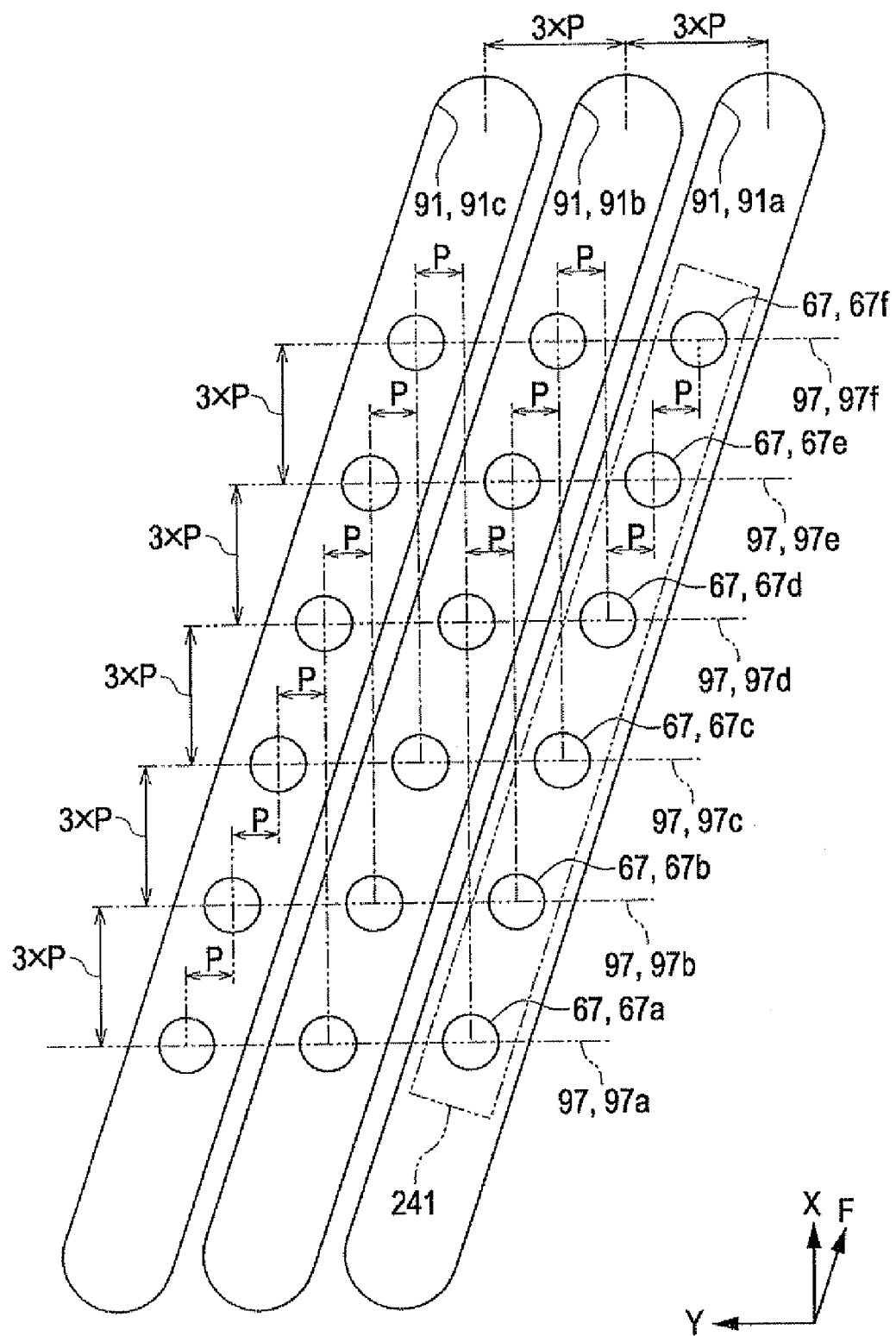
FIG. 28 is a plan view of element regions and light-emitting elements in the structure (12) of a light-emitting panel according to a second embodiment of the invention.

As illustrated in FIG. 28, the six light-emitting elements 67 are referred to as light-emitting elements 67a, 67b, 67c, 67d, 67e, and 67f. A plurality of light-emitting elements 67a constitute an element array 97a. Likewise, a plurality of light-emitting elements 67b constitute an element array 97b, a plurality of light-emitting elements 67c constitute an element array 97c, a plurality of light-emitting elements 67d constitute an element array 97d, a plurality of light-emitting elements 67e constitute an element array 97e, and a plurality of light-emitting elements 67f constitute an element array 97f.

Each of the element arrays 97 includes a plurality of light-emitting elements 67 in the Y direction at intervals of 3×P. The six element arrays 97 are arranged in the X direction at intervals of 3×P.

In each of the element regions 91, the light-emitting elements 67a, 67b, 67c, 67d, 67e, and 67f are aligned in the F direction. The light-emitting elements 67 aligned in the F direction constitute an element group 241. A plurality of element groups 241 are arranged in the Y direction at intervals of 3×P.

In the present embodiment, each of the element regions 91 includes one element group 241.

In the structure illustrated in FIG. 28 (hereinafter referred to as a structure (12)), two light-emitting elements 67 are aligned in the X direction. Thus, a plurality of light-emitting elements 67 overlap one another in the X direction in the present embodiment.

In the structure (12), two light-emitting elements 67 overlapping each other in the X direction are repeatedly arranged in the Y direction at intervals of P. In the structure (12), two light-emitting elements 67 overlapping each other in the X direction are disposed across two adjacent element groups 241. In other words, two adjacent element groups 241 include light-emitting elements 67 aligned in the X direction across two element groups 241.

In the structure (12), focusing on a sequence of three element regions 91 (91a, 91b, and 91c), light-emitting elements 67a, 67b, and 67c in the element region 91b overlap light-emitting elements 67d, 67e, and 67f in the element region 91c, respectively.

Light-emitting elements 67d, 67e, and 67f in the element region 91b overlap light-emitting elements 67a, 67b, and 67c in the element region 91a, respectively.

The light-emitting panel 100 has the same structure as the light-emitting panel 61 except that the arrangement of light-emitting elements 67 is different. The light-emitting panel 100 can be manufactured in the same way as the light-emitting panel 61. Thus, a method for manufacturing the light-emitting panel 100 will not be further described.

In the present embodiment, the light-emitting panel 100 corresponds to a light-emitting device serving as an exposure apparatus, a substrate 182 corresponds to a substrate, an insulating film 157 (a second partition) corresponds to a partition, the Y direction corresponds to the first direction, the F direction corresponds to the second direction and the third direction, and the X direction corresponds to the fourth direction.

In the present embodiment, the light-emitting panel 100 includes the light-emitting elements 67 overlapping each other in the X direction. The light-emitting panel 100 can therefore perform a light-emitting function repeatedly in the X direction.

If the light-emitting function of one light-emitting element 67 in an exposure head 39 deteriorates, the other overlapping light-emitting element 67 can compensate for the light-emitting function.

In the exposure head 39, the light-emitting elements 67 overlapping each other in the X direction can be used alternately.

In such a way, the exposure head 39 can maintain its exposure characteristics for a long period of time.

Figure 29:
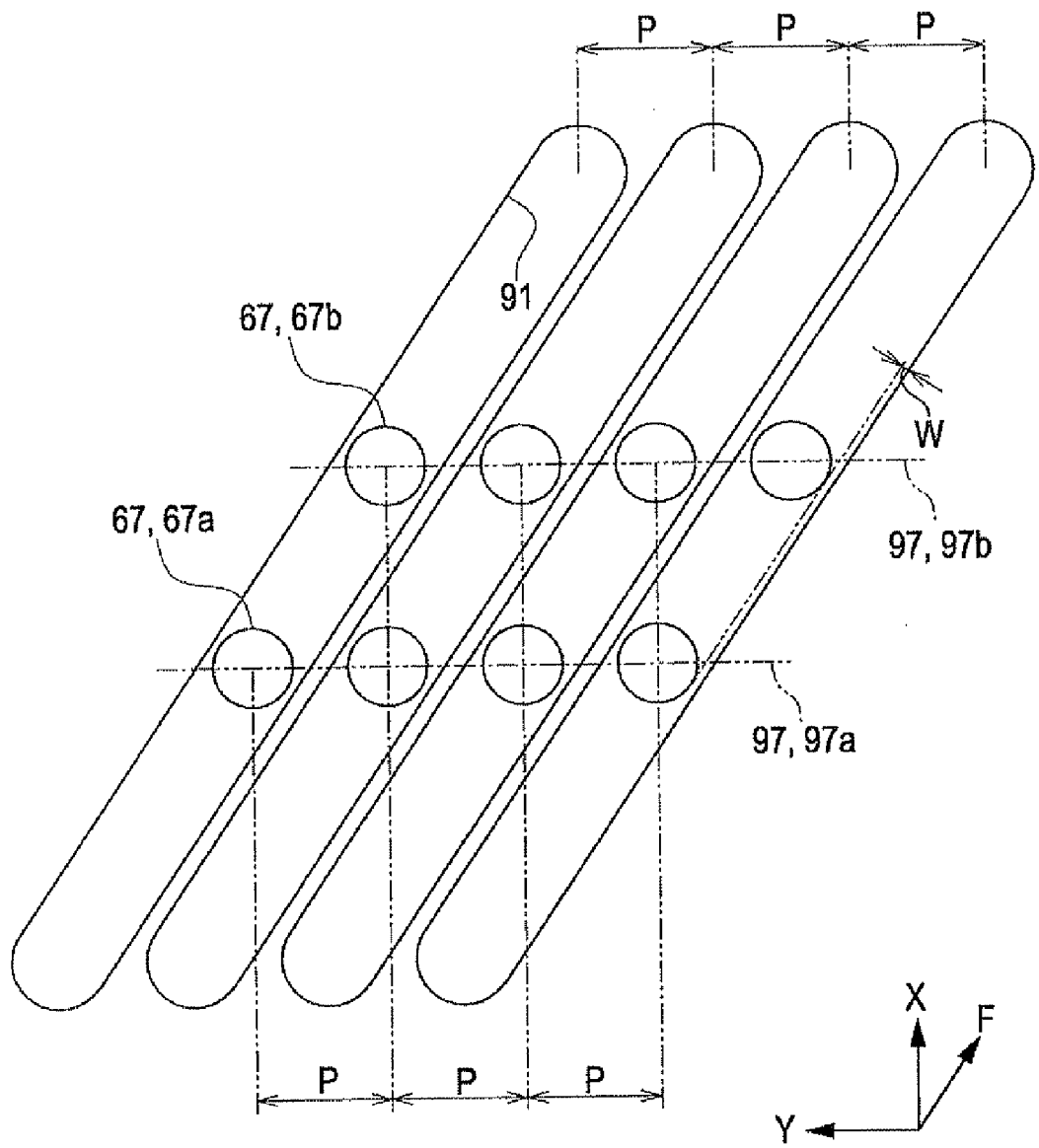
FIG. 29 is a plan view of element regions and light-emitting elements in the structure (13) of a light-emitting panel according to a second embodiment of the invention.

Although each of the element regions 91 includes six light-emitting elements 67 in the structure (12), the light-emitting panel 100 may have another structure. As illustrated in FIG. 29, each of the element regions 91 may include two light-emitting elements 67 (67a and 67b) (hereinafter referred to as a structure (13)). The structure (13) includes two element arrays 97 (97a and 97b). In the structure (13), a plurality of element regions 91 are disposed in the Y direction at intervals of P.

The structure (13) can have the same advantages as the structure (12). The number of light-emitting elements 67 in each element region 91 may be any value of two or more. However, in the case that the number of light-emitting elements 67 in each element region 91 is an odd number, there is a light-emitting element 67 not overlapping another light-emitting element 67 in the X direction. It is therefore desirable that the number of light-emitting elements 67 in each element region 91 be an even number.

The intervals between the element regions 91 in the Y direction are 3×P in the structure (12) and P in the structure (13). The interval between the element regions 91 in the Y direction is smaller in the structure (13) than in the structure (12). The gap W between the light-emitting elements 67 and the insulating film 157 (see FIG. 9) is smaller in the structure (13) than in the structure (12). Thus, an increase in the density of light-emitting elements 67 in the Y direction, that is, an improvement in the printing resolution of the printer 1 is more difficult to achieve with the structure (13) than with the structure (12).

Figure 30:
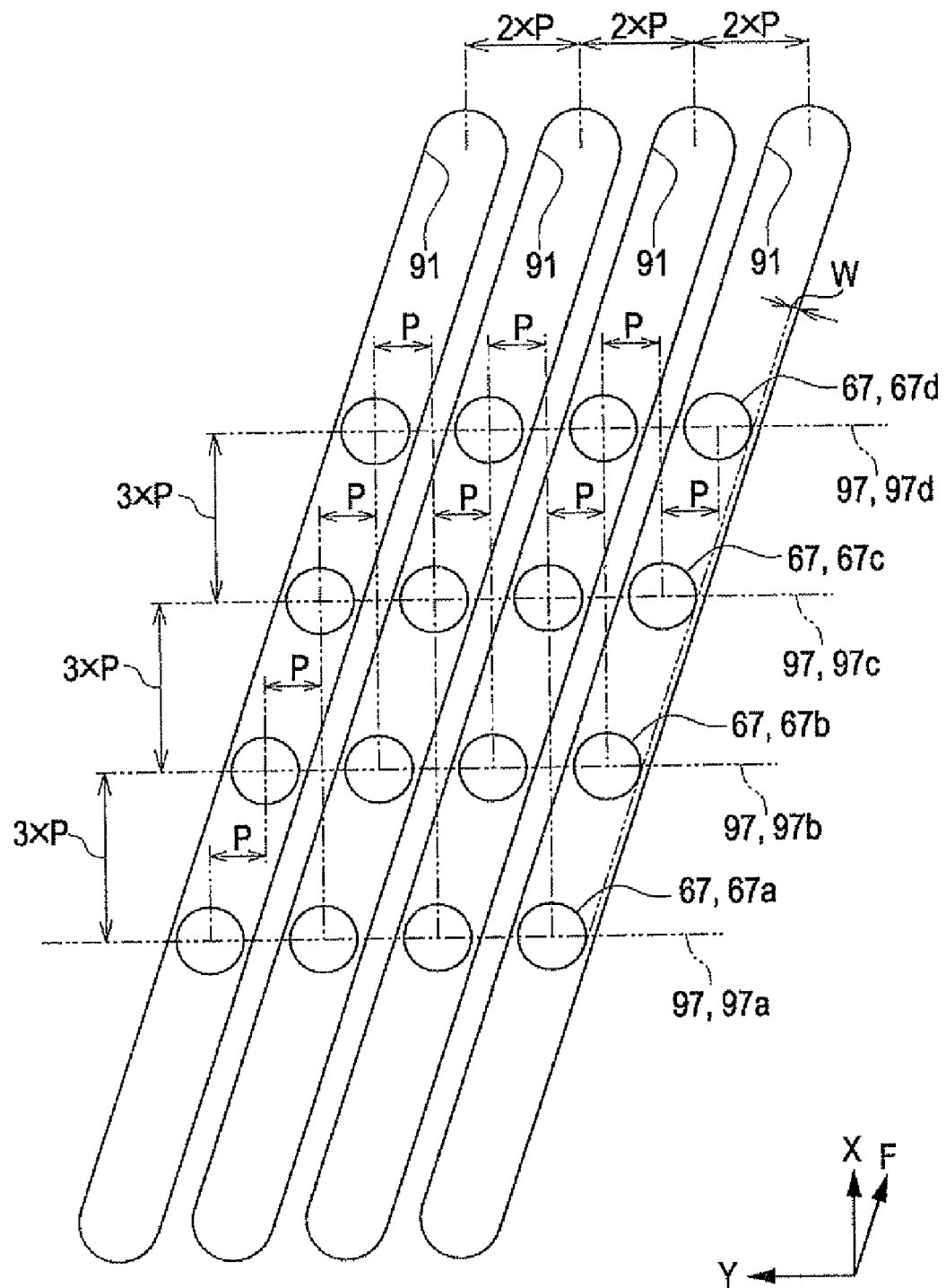
FIG. 30 is a plan view of element regions and light-emitting elements in the structure (14) of a light-emitting panel according to a second embodiment of the invention.

As illustrated in FIG. 30, the light-emitting panel 100 may include four light-emitting elements 67 in each element region 91 (hereinafter referred to as a structure (14)).

In the structure (14), each element array 97 includes a plurality of light-emitting elements 67 in the Y direction at intervals of 2×P. The interval between the element regions 91 in the Y direction is 2×P. Thus, the gap W can be greater in the structure (14) than in the structure (13) (see FIG. 29).

In the structures (12), (13), and (14), the number of light-emitting elements 67 constituting each element group 241 is preferably increased to improve the printing resolution of the printer 1.

Figure 31:
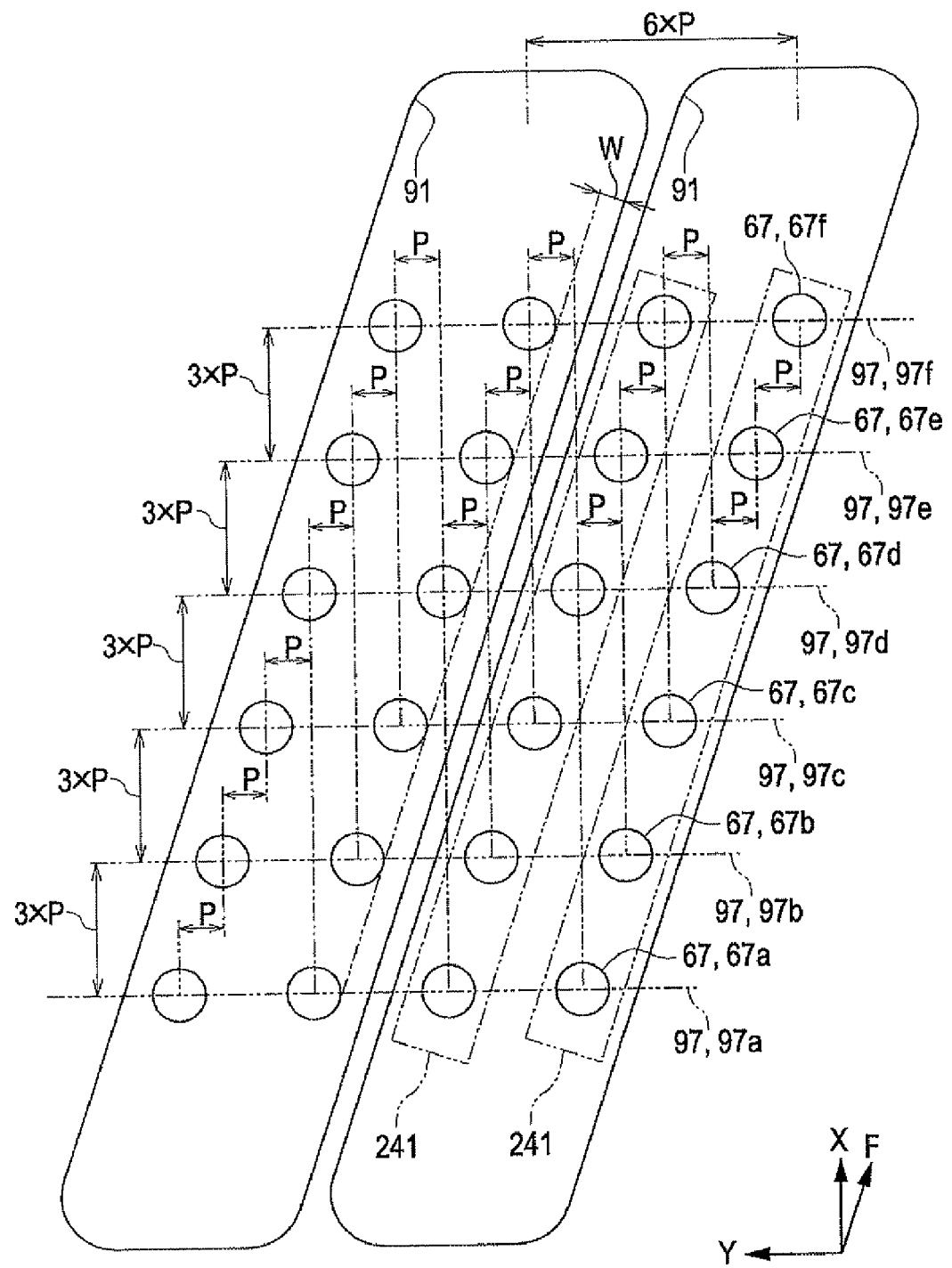
FIG. 31 is a plan view of element regions and light-emitting elements in the structure (15) of a light-emitting panel according to a second embodiment of the invention.

Although each of the element regions 91 includes one element group 241 in the structure (12), the light-emitting panel 100 may have another structure. As illustrated in FIG. 31, each of the element regions 91 may include two element groups 241 (hereinafter referred to as a structure (15)).

The structure (15) can have the same advantages as the structure (12). The structure (15) can have substantially the same gap W as the structure (12).

The element region 91 can have a greater width in the structure (15) than in the structure (12). From various perspectives, an increase in the width of the element region 91 is advantageous to an increase in the density of light-emitting elements 67. Examples of the perspectives include the three perspectives described above. That is, a first perspective is to achieve desired thicknesses of the sublayers of the organic layer 87. A second perspective is to shorten the time to apply the fluids 161a, 163a, and 165a. A third perspective is to increase the proportions of solvents in the fluids 161a, 163a, and 165a.

Although six light-emitting elements 67 constitute one element group 241 in the structure (15), the number of light-emitting elements 67 constituting one element group 241 is not limited to six and may be any even number of at least two.

The number of element groups 241 in each element region 91 is not limited to two and may be any value of three or more.

Figure 32:
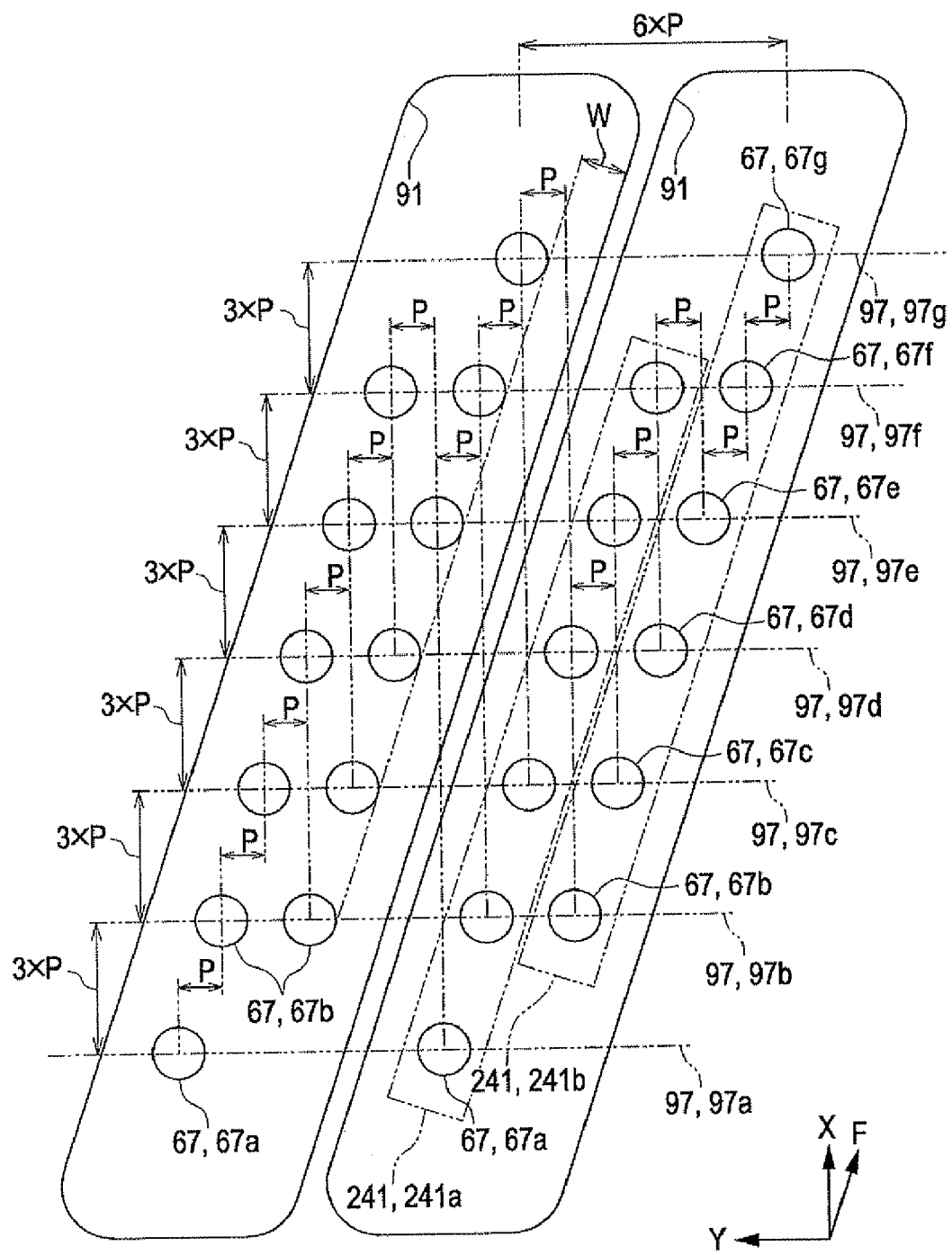
FIG. 32 is a plan view of element regions and light-emitting elements in the structure (16) of a light-emitting panel according to a second embodiment of the invention.

As described above, although the structure (15) can have substantially the same gap W as the structure (12), a plurality of element groups 241 in the element region 91 can be moved relative to each other in the X direction to increase the gap W in the structure (15), as illustrated in FIG. 32 (hereinafter referred to as a structure (16)).

The structure (16) includes two element groups 241 (241a and 241b) in each element region 91. One element group 241a includes six light-emitting elements 67a, 67b, 67c, 67d, 67e, and 67f aligned in the F direction. The other element group 241b includes six light-emitting elements 67b, 67c, 67d, 67e, 67f, and 67g aligned in the F direction.

The distance between the light-emitting element 67a in the element group 241a and the light-emitting element 67b in the element group 241b is 3×P in the X direction. Thus, the distance between the element group 241a and the element group 241b is considered as 3×P in the X direction.

The distance between the light-emitting element 67a in the element group 241a and the light-emitting element 67b in the element group 241b is 3×P in the Y direction. Thus, the distance between the element group 241a and the element group 241b is considered as 3×P in the Y direction.

The structure (15) (see FIG. 31) includes six element arrays 97 (97*a*, 97*b*, 97*c*, 97*d*, 97*e*, and 97*f*). The structure (16) includes seven element arrays 97 (97*a*, 97*b*, 97*c*, 97*d*, 97*e*, 97*f*, and 97*g*).

The element array 97*a* in the structure (16) includes a plurality of light-emitting elements 67*a* in the Y direction at intervals of 6×P.

The element array 97*b* includes two light-emitting elements 67*b* in the Y direction at intervals of 2×P in each element region 91. In the element array 97*b*, a pair of light-emitting elements 67*b* in the Y direction in each element region 91 are aligned in the Y direction at intervals of 6×P.

As in the element array 97*b*, each of the element arrays 97*c*, 97*d*, 97*e*, and 97*f* includes a plurality of light-emitting elements 67 aligned in the Y direction.

The element array 97*g* includes a plurality of light-emitting elements 67*g* in the Y direction at intervals of 6×P.

In each element region 91, the distances between the light-emitting element 67*a* and the light-emitting element 67*g* are 8×P in the Y direction and 18×P in the X direction.

In the structure (16), the distances between the element group 241*a* and the element group 241*b* are 3×P in the Y direction and 3×P in the X direction.

In the structure (16), the distance between two light-emitting elements 67 overlapping each other in the X direction in each element region 91 are 6×P in the X direction. On the other hand, the distance between two light-emitting elements 67 overlapping each other in the X direction across two adjacent element regions 91 is 12×P in the X direction. Thus, in the structure (16), the distance between two light-emitting elements 67 overlapping each other in the X direction across two adjacent element regions 91 can be greater than the distance between two light-emitting elements 67 overlapping each other in the X direction in each element region 91.

Thus, the gap W can be greater in the structure (16) than in the structure (15) (see FIG. 31). Consequently, the printing resolution of the printer 1 can be improved more easily in the structure (16) than in the structure (15).

Although the longitudinal direction of the element region 91 is the F direction in the structure (16), the longitudinal direction of the element region 91 may be the fifth direction in which a plurality of element groups 241 are arranged, as in the structure (11).

In the structure (16), the two element groups 241*a* and 241*b* in the element region 91 are moved relative to each other in the X direction by a distance of 3×P. However, the distance between the element groups 241*a* and 241*b* is not limited to 3×P and may be any distance less than 9×P.

Figure 33:
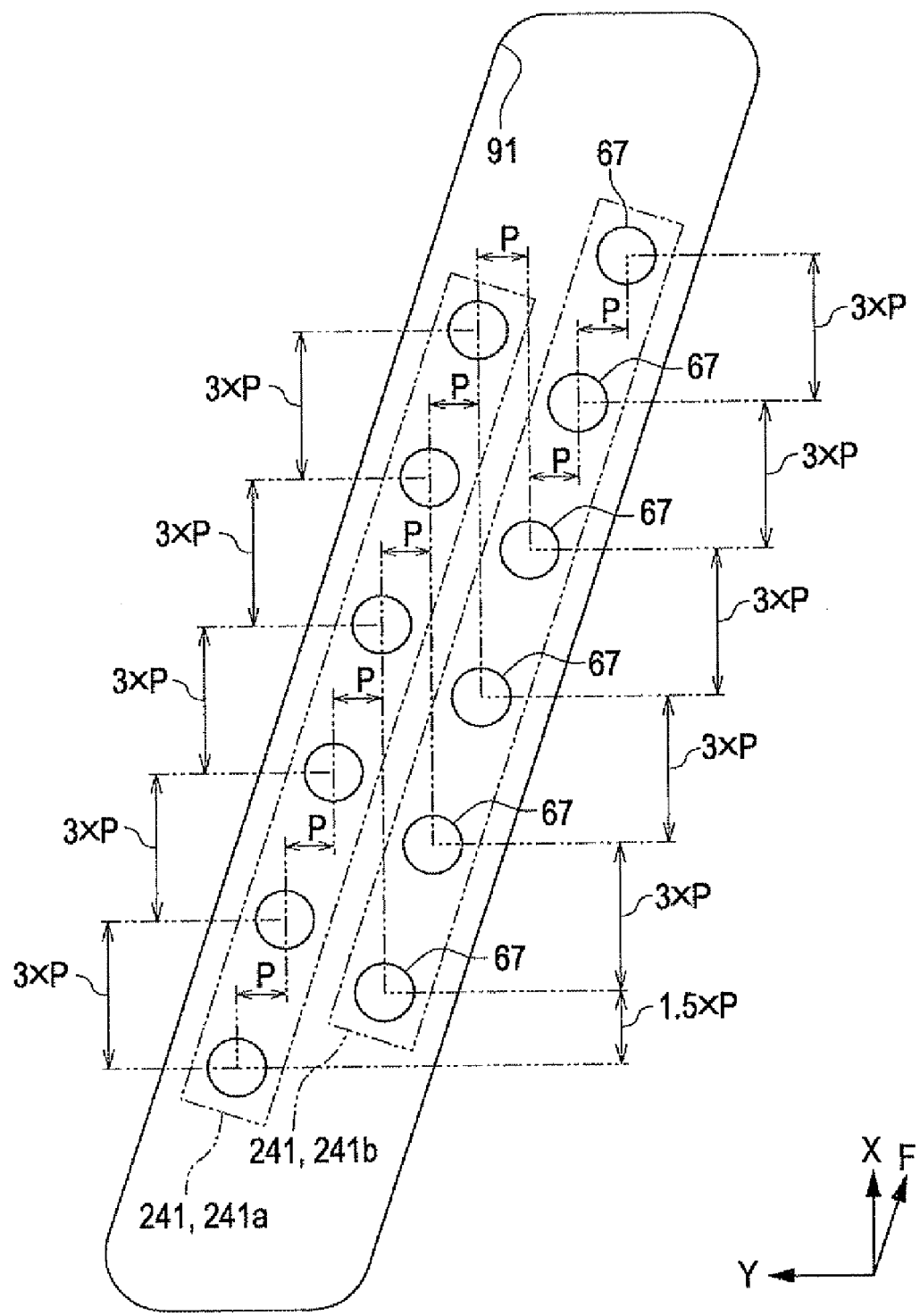
FIG. 33 is a plan view of element regions and light-emitting elements in the structure (17) of a light-emitting panel according to a second embodiment of the invention.

For example, as illustrated in FIG. 33, the distance between the element groups 241*a* and 241*b* may be more than zero but less than 3×P.

A structure in which the distance between the element groups 241*a* and 241*b* is more than zero but less than 3×P is referred to as a structure (17). In the structure illustrated in FIG. 33, the distance between the element groups 241*a* and 241*b* is 1.5×P.

Although six light-emitting elements 67 constitute one element group 241 in the structure (17), the number of light-emitting elements 67 constituting one element group 241 is not limited to six and may be any even number of at least two.

Figure 34:
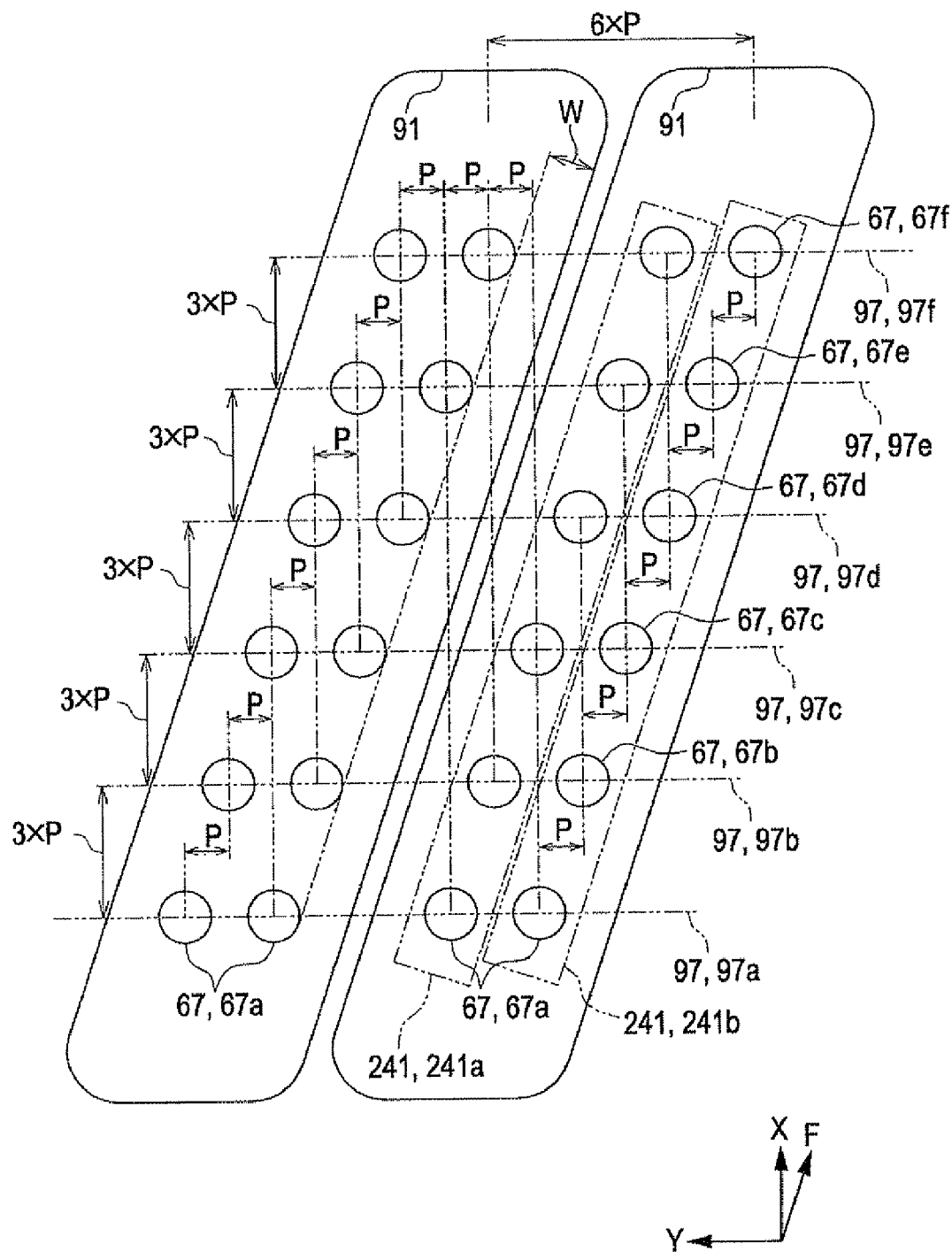
FIG. 34 is a plan view of element regions and light-emitting elements in the structure (18) of a light-emitting panel according to a second embodiment of the invention.

As illustrated in FIG. 34, in a structure in which the light-emitting element 67*g* in the structure (16) (see FIG. 32) is incorporated into the element array 97*a* (hereinafter referred to as a structure (18)), the number of element arrays 97 can be decreased to six. Thus, the length of the element region 91 in the F direction is smaller in the structure (18) than in the structure (16).

In the element array 97*a* in the structure (18), two light-emitting elements 67*a* are aligned in the Y direction at intervals of 2×P in each element region 91. In the element array 97*a*, a pair of light-emitting elements 67*a* in the Y direction in each element region 91 are aligned in the Y direction at intervals of 6×P. Thus, the structure (18) includes the element groups 241*a* and 241*b* in the Y direction at intervals of 2×P.

As in the structure (16), in the structure (18), the distance between two light-emitting elements 67 overlapping each other in the X direction across two adjacent element regions 91 can be greater than the distance between two light-emitting elements 67 overlapping each other in the X direction in each element region 91.

Thus, the gap W can be greater in the structure (18) than in the structure (15) (see FIG. 31). Consequently, the printing resolution of the printer 1 can be improved more easily in the structure (18) than in the structure (15).

In the structures (16) and (17) (see FIGS. 32 and 33), the number of element groups 241 in each element region 91 is not limited to two and may be any value of three or more.

Figure 35:
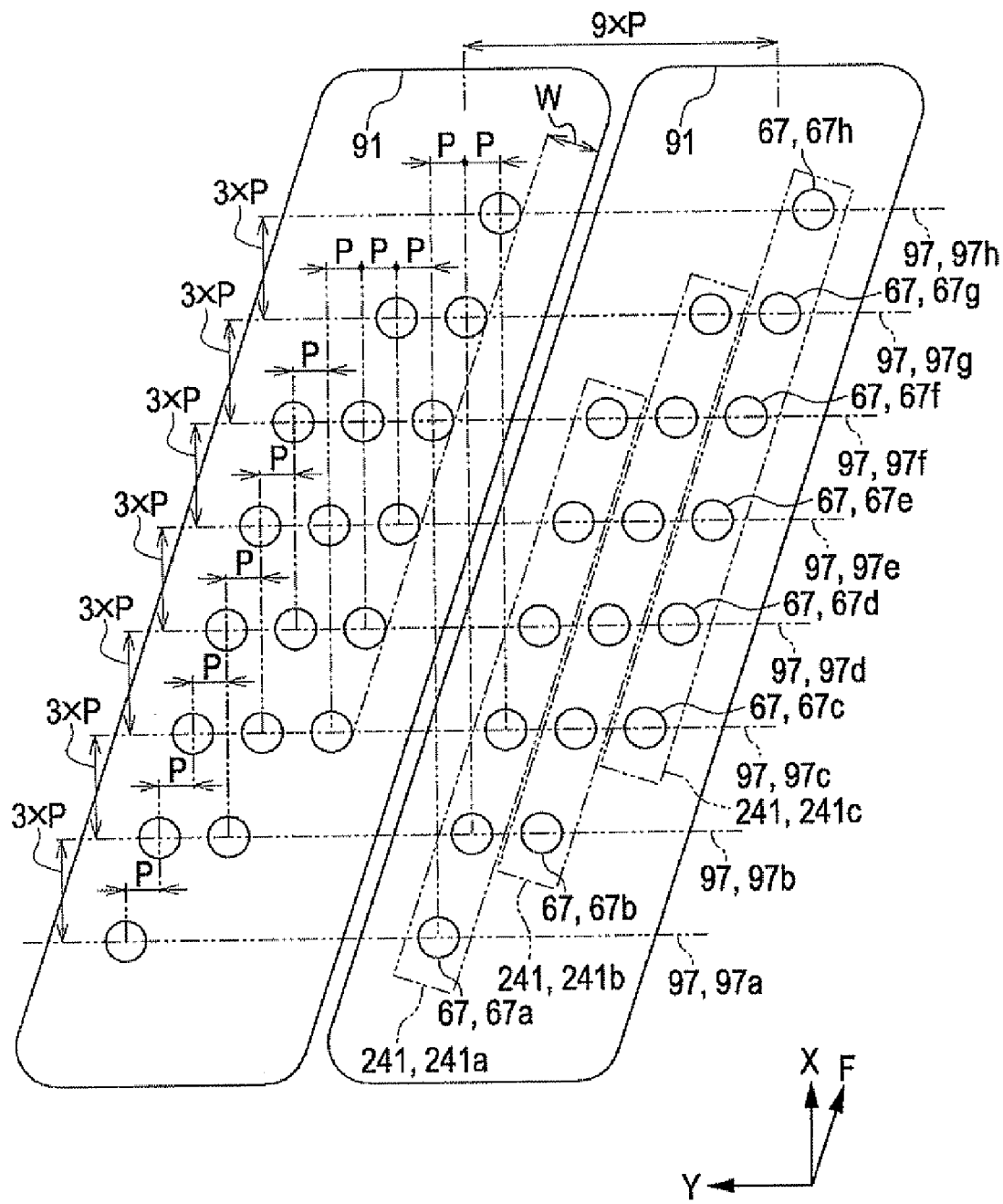
FIG. 35 is a plan view of element regions and light-emitting elements in the structure (19) of a light-emitting panel according to a second embodiment of the invention.

For example, as illustrated in FIG. 35, in a structure in which one element group 241 (241*c*) is added to the structure (16) (hereinafter referred to as a structure (19)), the gap W can be greater than the gap W in the structure (16).

In the structure (19), the element group 241*c* includes six light-emitting elements 67*c*, 67*d*, 67*e*, 67*f*, 67*g*, and 67*h* in the F direction. The distance between the light-emitting element 67*b* in the element group 241*b* and the light-emitting element 67*c* in the element group 241*c* is 3×P in the X direction. Thus, the distance between the element group 241*b* and the element group 241*c* is considered as 3×P in the X direction.

The distance between the light-emitting element 67*b* in the element group 241*b* and the light-emitting element 67*c* in the element group 241*c* is 3×P in the Y direction. Thus, the distance between the element group 241*b* and the element group 241*c* is considered as 3×P in the Y direction.

The structure (16) (see FIG. 32) includes seven element arrays 97 (97*a*, 97*b*, 97*c*, 97*d*, 97*e*, 97*f*, and 97*g*). As illustrated in FIG. 35, the structure (19) includes eight element arrays 97 (97*a*, 97*b*, 97*c*, 97*d*, 97*e*, 97*f*, 97*g*, and 97*h*).

The element array 97*a* in the structure (19) includes a plurality of light-emitting elements 67*a* in the Y direction at intervals of 9×P.

The element array 97*b* includes two light-emitting elements 67*b* in the Y direction at intervals of 2×P in each element region 91. In the element array 97*b*, a pair of light-emitting elements 67*b* in the Y direction in each element region 91 are aligned in the Y direction at intervals of 9×P.

In the element arrays 97*c*, 97*d*, 97*e*, and 97*f*, three light-emitting elements 67 are aligned in the Y direction at intervals of 2×P in each element region 91. In each element array 97, a triplet of light-emitting elements 67 in the Y direction in each element region 91 are aligned in the Y direction at intervals of 9×P.

In the element array 97*g*, two light-emitting elements 67*g* are aligned in the Y direction at intervals of 2×P in each element region 91. In the element array 97*g*, a pair of light-emitting elements 67*g* in the Y direction in each element region 91 are aligned in the Y direction at intervals of 9×P.

The element array 97*h* includes a plurality of light-emitting elements 67*h* in the Y direction at intervals of 9×P.

In each element region 91, the distances between the light-emitting element 67*a* and the light-emitting element 67*h* are 11×P in the Y direction and 21×P in the X direction.

As described above, the gap W can be greater in the structure (19) than in the structure (16). Consequently, the printing resolution of the printer 1 can be improved more easily in the structure (19) than in the structure (16).

The element region 91 can have a greater width in the structure (19) than in the structure (16). From various perspectives, an increase in the width of the element region 91 is advantageous to an increase in the density of light-emitting elements 67. Examples of the perspectives include the three perspectives described above. That is, a first perspective is to achieve desired thicknesses of the sublayers of the organic layer 87. A second perspective is to shorten the time to apply the fluids 161a, 163a, and 165a. A third perspective is to increase the proportions of solvents in the fluids 161a, 163a, and 165a.

Also in the structure (17) (see FIG. 33), the addition of one element group 241 (241c) can have the same advantages.

More specifically, in a structure in which one element group 241 (241c) is added to the structure (17), the gap W and the width of the element region 91 can be greater than the gap W and the width of the element region 91 in the structure (17).

In the structures (12) to (19), although two light-emitting elements 67 overlap each other in the X direction, the number of light-emitting elements 67 overlapping each other in the X direction is not limited to two. The number of light-emitting elements 67 overlapping each other in the X direction may be an integer of three or more.

Figure 36:
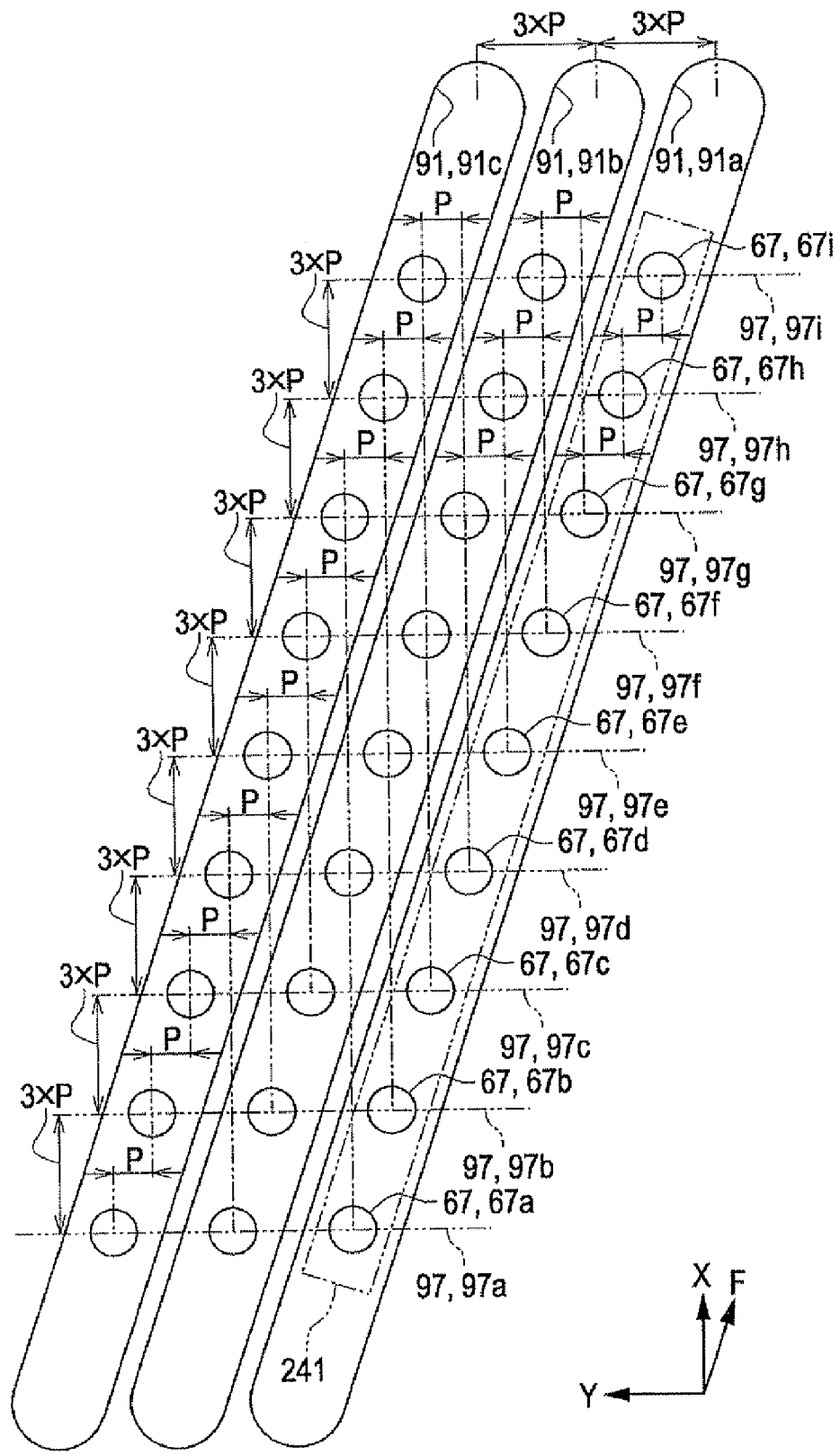
FIG. 36 is a plan view of element regions and light-emitting elements in the structure (20) of a light-emitting panel according to a second embodiment of the invention.

As illustrated in FIG. 36, in a structure in which three light-emitting elements 67 overlap one another in the X direction, the structure may include nine element arrays 97 (97a, 97b, 97c, 97d, 97e, 97f, 97g, 97h, and 97i) (hereinafter referred to as a structure (20)).

In the structure (20), a light-emitting element 67a of the element region 91a, a light-emitting element 67d of the element region 91b, and a light-emitting element 67g of the element region 91c overlap one another in the X direction. A light-emitting element 67b of the element region 91a, a light-emitting element 67e of the element region 91b, and a light-emitting element 67h of the element region 91c overlap one another in the X direction. Likewise, a light-emitting element 67c of the element region 91a, a light-emitting element 67f of the element region 91b, and a light-emitting element 67i of the element region 91c overlap one another in the X direction.

This allows an exposure head 39 to maintain its exposure characteristics for a longer period of time.

In the structure (20), each element array 97 includes a plurality of light-emitting elements 67 in the Y direction at intervals of 3×P. The nine element arrays 97 are disposed in the X direction at intervals of 3×P.

Each element region 91 includes one element group 241. The element group 241 includes nine light-emitting elements 67 in the F direction.

Although the element group 241 includes nine light-emitting elements 67 in the structure (20), the light-emitting panel 100 may have another structure. The element group 241 may include 3×n (n is an integer of two or more) light-emitting elements 67. Depending on the number of light-emitting elements 67 in the element group 241, the distance between the light-emitting elements 67 in the Y direction may be adjusted.

Although each of the element regions 91 includes one element group 241 in the structure (20), the light-emitting panel 100 may have another structure. Each of the element regions 91 may include two or more element groups 241.

Figure 37:
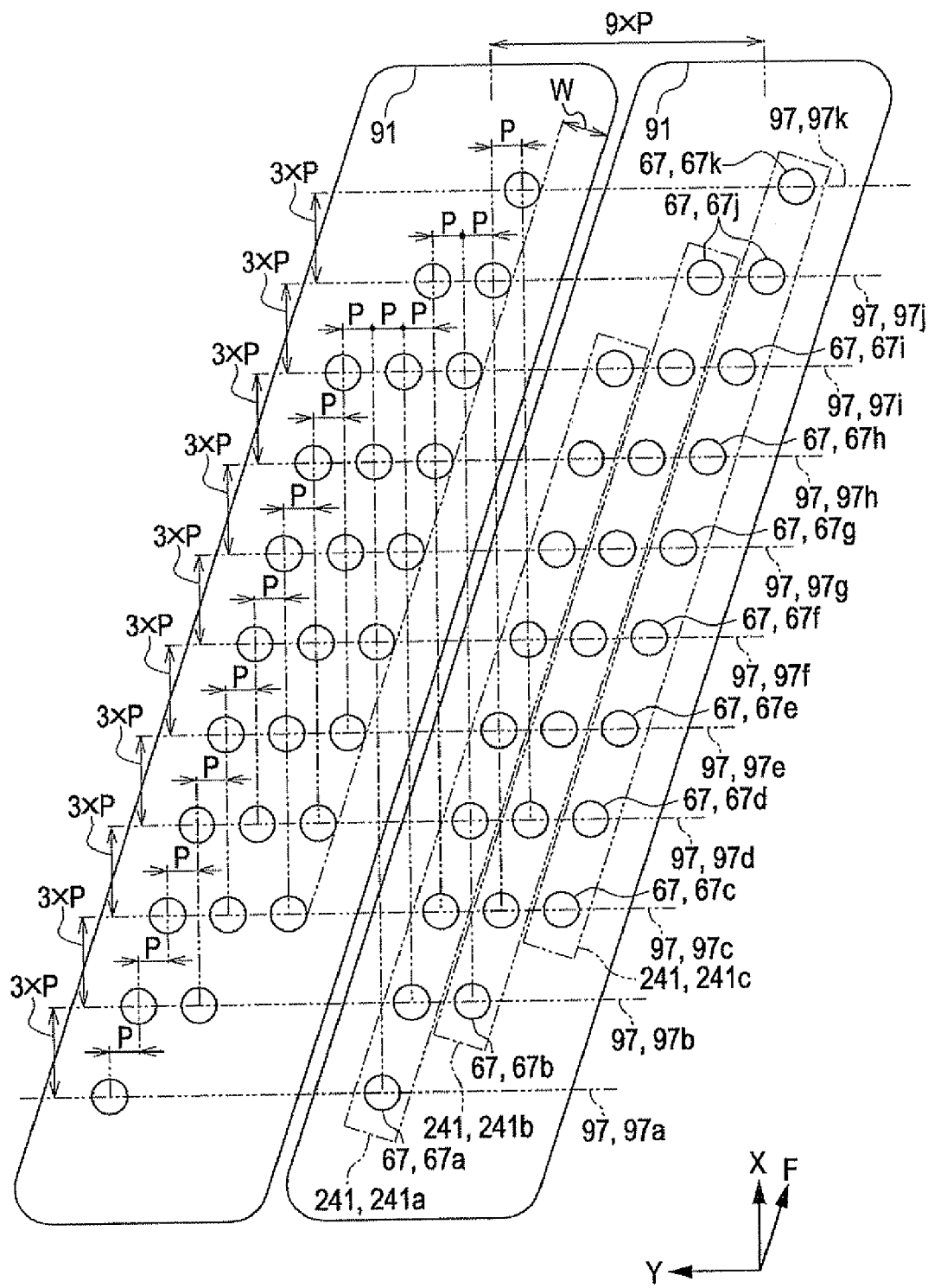
FIG. 37 is a plan view of element regions and light-emitting elements in the structure (21) of a light-emitting panel according to a second embodiment of the invention.

As illustrated in FIG. 37, in a structure in which each element region 91 includes three element groups 241, the three element groups 241 (241a, 241b, and 241c) may be moved relative to each other in the X direction (hereinafter referred to as a structure (21)). Thus, the gap W can be greater in the structure (21) than in the structure (20). The element region 91 can have a greater width in the structure (21) than in the structure (20).

Figure 38:
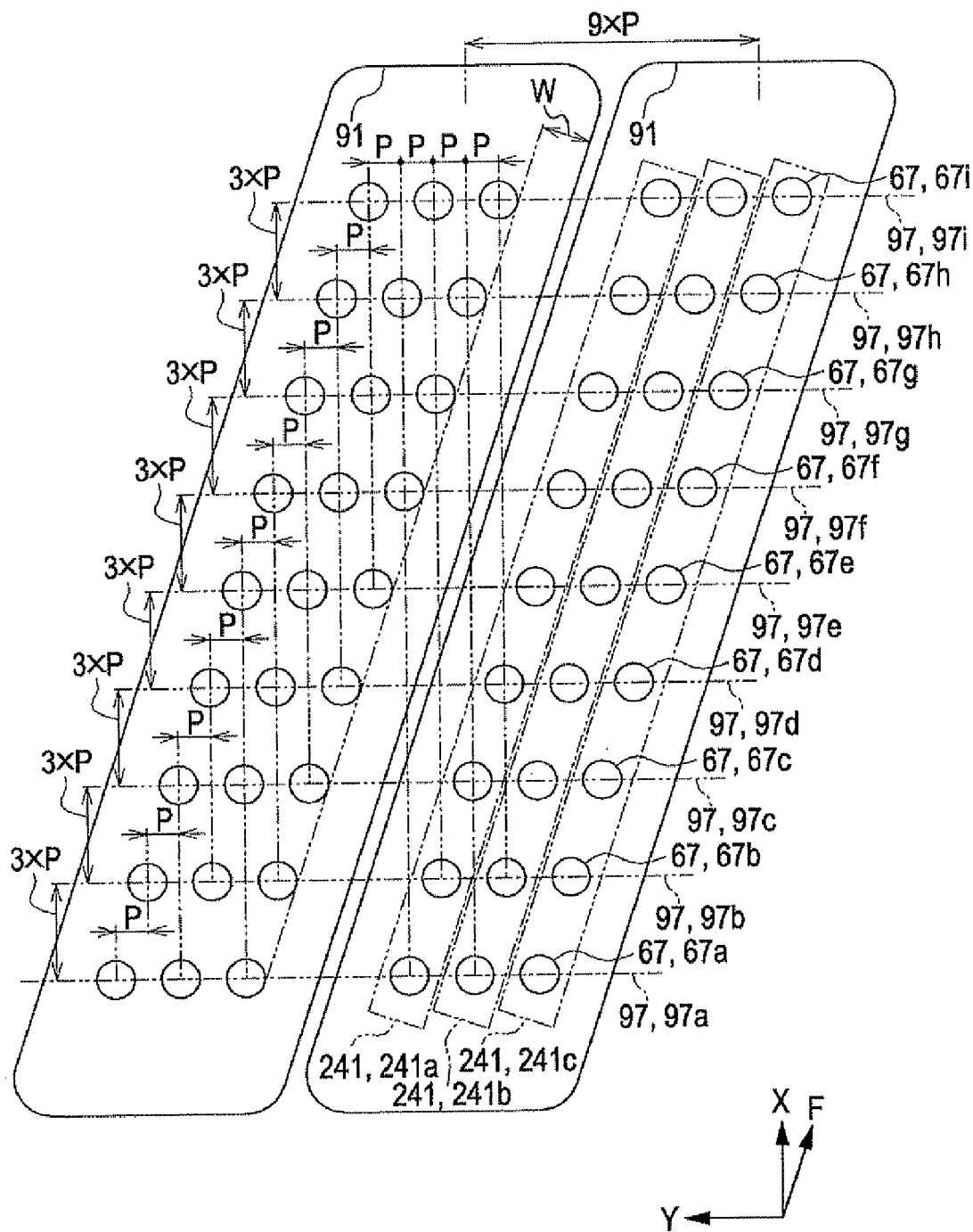
FIG. 38 is a plan view of element regions and light-emitting elements in the structure (22) of a light-emitting panel according to a second embodiment of the invention.

In the structure (21), a light-emitting element 67j of the element group 241b may be incorporated into the element array 97a, and light-emitting elements 67j and 67k of the element group 241c may be incorporated into the element arrays 97a and 97b (hereinafter referred to as a structure (22)). As illustrated in FIG. 38, the number of element arrays 97 can be decreased from 11 in the structure (21) to nine in the structure (22). Thus, the length of the element region 91 in the F direction is smaller in the structure (22) than in the structure (21).

As in the structure (16), in the structures (21) and (22), the distance between two light-emitting elements 67 overlapping each other in the X direction across two adjacent element regions 91 can be greater than the distance between two light-emitting elements 67 overlapping each other in the X direction in each element region 91.

Thus, the gap W can be greater in the structures (21) and (22) than in the structure (20) (see FIG. 36). Consequently, the printing resolution of the printer 1 can be improved more easily in the structures (21) and (22) than in the structure (20).

In the structures (16), (17), (19), and (21), the direction in which the element groups 241 in the element region 91 are arranged corresponds to the fifth direction.

Figure 39:
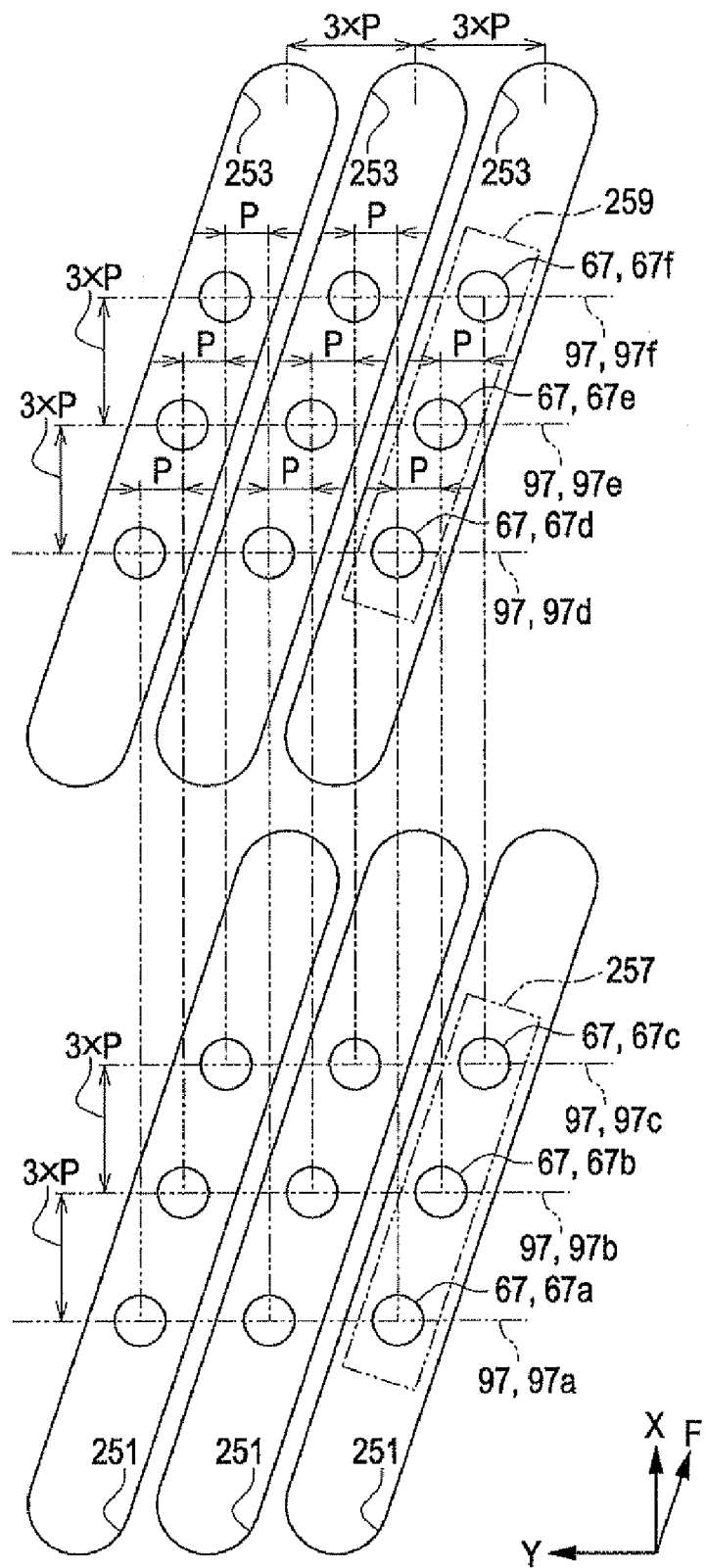
FIG. 39 is a plan view of element regions and light-emitting elements in the structure (23) of a light-emitting panel according to a second embodiment of the invention.

In the second embodiment, the element regions 91 may be divided in the X direction. For example, as illustrated in FIG. 39, the element regions 91 are divided into element regions 251 and element regions 253 in the X direction (hereinafter referred to as a structure (23)).

In the structure (23), each of the element regions 251 includes three light-emitting elements 67 (67a, 67b, and 67c), and each of the element regions 253 includes three light-emitting elements 67 (67d, 67e, and 67f). The structure (23) includes six element arrays 97 (97a, 97b, 97c, 97d, 97e, and 97f).

Each of the element arrays 97 includes a plurality of light-emitting elements 67 in the Y direction at intervals of 3×P. The element arrays 97a, 97b, and 97c are disposed in the X direction at intervals of 3×P. Likewise, the element arrays 97d, 97e, and 97f are disposed in the X direction at intervals of 3×P. The distance between the element array 97c and the element array 97d is not particularly limited.

The three light-emitting elements 67a, 67b, and 67c aligned in the F direction constitute an element group 257. The three light-emitting elements 67d, 67e, and 67f aligned in the F direction constitute an element group 259.

Each element region 251 includes one element group 257. Each element region 253 includes one element group 259.

In the structure (23), the light-emitting element 67a and the light-emitting element 67d overlap each other in the X direction. The light-emitting element 67b and the light-emitting element 67e overlap each other in the X direction. The light-emitting element 67c and the light-emitting element 67f overlap each other in the X direction. Thus, the element groups 257 and the element groups 259 are arranged in the X direction. Thus, the element regions 251 and the element regions 253 are arranged in the X direction.

The structure (23) can have the same advantages as the structure (12).

In the structure (23), the distance between the element array 97c and the element array 97d in the X direction is preferably 12×P. This is because the element regions 251 extending in the F direction and the element regions 253 extending in the F direction can be arranged in the F direction. When the element regions 251 and the element regions 253 are arranged in the F direction, the array of nozzles 239 of the droplet discharge head 233 (see FIG. 15) can easily face the element regions 251 and the element regions 253 arranged in the F direction. This allows the droplets 161*b*, 163*b*, and 165*b* to be simultaneously applied to the element regions 251 and the element regions 253 arranged in the F direction.

The element regions 251 and the element regions 253 in the structure (23) may have the same arrangement as the structures (2) to (11).

In the first embodiment and the second embodiment, although the light-emitting panel 61 or the light-emitting panel 100 is an organic EL device having a bottom emission structure, the light-emitting panel 61 or the light-emitting panel 100 may be another organic EL device. For example, the light-emitting panel 61 or the light-emitting panel 100 may be an organic EL device having a top emission structure, in which light is extracted from the side opposite the substrate.

In the first embodiment and the second embodiment, although the light-emitting panel 61 or the light-emitting panel 100 is included in the exposure head 39 of the printer 1, the light-emitting panel 61 and the light-emitting panel 100 may be applied to another device other than the printer 1. For example, the light-emitting panel 61 and the light-emitting panel 100 can be applied to exposure heads of facsimile machines and copying machines.

In the first embodiment and the second embodiment, the light-emitting panel 61 and the light-emitting panel 100 are described as exemplary electro-optical devices, the electro-optical device is not limited to these panels. For example, the electro-optical device may be a photosensor. A photosensor includes a light-receiving element as an electro-optical element. A photosensor includes a plurality of light-receiving elements in place of the light-emitting elements 67 described above. In a photosensor, each of the light-emitting elements 67 described above is replaced by a light-receiving element.

According to the present embodiments, also in an electro-optical device, such as a photosensor, functional layers of electro-optical elements in an element region can easily have the same thickness. Thus, the electro-optical elements can be made to have the same characteristics.

The entire disclosure of Japanese Patent Application No. 2009-064000, filed Mar. 17, 2009, Japanese Patent Application No. 2009-064001, filed Mar. 17, 2009 and Japanese Patent Application No. 2009-064002, filed Mar. 17, 2009 are expressly incorporated by reference herein.

What is claimed is:

1. An electro-optical device comprising:
   a substrate;
   a partition disposed on the substrate, the partition dividing part of a first surface of the substrate into a plurality of element regions; and
   a plurality of electro-optical elements disposed on the substrate,
   wherein each of the plurality of electro-optical elements includes a functional layer having an electro-optic function,
   resolution power of the electro-optic function in a first direction of the substrate corresponds to an interval between the plurality of electro-optical elements in the first direction,
   the plurality of electro-optical elements constitute a plurality of element arrays and are divided into a plurality of element groups,
   each of the element arrays includes the corresponding electro-optical elements aligned in the first direction,
   the plurality of element arrays are arranged in a direction crossing the first direction,
   each of the element groups includes the corresponding electro-optical elements aligned in a second direction crossing the first direction,
   each of the plurality of element regions includes at least one of the element groups and extends in a third direction crossing the first direction as viewed from the top, and
   the second direction is inclined relative to a fourth direction perpendicular to the first direction.

2. The electro-optical device according to claim 1, wherein the second direction is the same as the third direction.

3. The electro-optical device according to claim 1, wherein each of the element regions includes at least two of the plurality of element groups, and
   the at least two element groups are arranged in the first direction.

4. The electro-optical device according to claim 1, wherein the functional layer is provided for each of the element regions.

5. The electro-optical device according to claim 1, wherein each of the electro-optical elements is a light-emitting element, and
   the electro-optic function is a light-emitting function.

6. The electro-optical device according to claim 5, wherein the functional layer includes an organic layer formed of a material containing an organic substance.

7. An electronic device comprising an electro-optical device according to claim 1.

8. An electro-optical device comprising:
   a substrate;
   a partition disposed on the substrate, the partition dividing part of a first surface of the substrate into a plurality of element regions; and
   a plurality of electro-optical elements disposed on the substrate,
   wherein each of the plurality of electro-optical elements includes a functional layer having an electro-optic function,
   resolution power of the electro-optic function in a first direction of the substrate corresponds to an interval between the plurality of electro-optical elements in the first direction,
   the plurality of electro-optical elements constitute a plurality of element arrays and are divided into a plurality of element groups,
   each of the element arrays includes the corresponding electro-optical elements aligned in the first direction,
   the plurality of element arrays are arranged in a direction crossing the first direction,
   each of the element groups includes the corresponding electro-optical elements aligned in a second direction crossing the first direction,
   each of the plurality of element regions includes at least one of the element groups and extends in a third direction crossing the first direction as viewed from the top, and
   each of the element regions has a width smaller in the first direction than in the third direction.

9. An electro-optical device comprising:
   a substrate;
   a partition disposed on the substrate, the partition dividing part of a first surface of the substrate into a plurality of element regions; and
   a plurality of electro-optical elements disposed on the substrate, wherein each of the plurality of electro-optical elements includes a functional layer having an electro-optic function, resolution power of the electro-optic function in a first direction of the substrate corresponds to an interval between the plurality of electro-optical elements in the first direction, the plurality of electro-optical elements constitute a plurality of element arrays and are divided into a plurality of element groups, each of the element arrays includes the corresponding electro-optical elements aligned in the first direction, the plurality of element arrays are arranged in a direction crossing the first direction, each of the element groups includes the corresponding electro-optical elements aligned in a second direction crossing the first direction, each of the plurality of element regions includes at least one of the element groups and extends in a third direction crossing the first direction as viewed from the top, and the second direction is inclined relative to a fourth direction perpendicular to the first direction, and the plurality of element groups are arranged in a fifth direction, the fifth direction crossing the second direction and being inclined relative to the first direction.

10. The electro-optical device according to claim 9, wherein the third direction is the same as the fifth direction.

11. The electro-optical device according to claim 9, wherein the third direction is different from the fifth direction.

12. An electro-optical device comprising:
a substrate;
a partition disposed on the substrate, the partition dividing part of a first surface of the substrate into a plurality of element regions; and
a plurality of electro-optical elements disposed on the substrate,
wherein each of the plurality of electro-optical elements includes a functional layer having an electro-optic function,
resolution power of the electro-optic function in a first direction of the substrate corresponds to an interval between the plurality of electro-optical elements in the first direction, the plurality of electro-optical elements constitute a plurality of element arrays and are divided into a plurality of element groups, each of the element arrays includes the corresponding electro-optical elements aligned in the first direction, the plurality of element arrays are arranged in a direction crossing the first direction, each of the element groups includes the corresponding electro-optical elements aligned in a second direction crossing the first direction, each of the plurality of element regions includes at least one of the element groups and extends in a third direction crossing the first direction as viewed from the top, and the plurality of electro-optical elements include a plurality of electro-optical elements aligned in a fourth direction perpendicular to the first direction across two adjacent element groups of the plurality of element groups.

13. The electro-optical device according to claim 12, wherein each of the element regions includes at least two of the element groups and at least two of the electro-optical elements, the at least two electro-optical elements being aligned across two adjacent element groups of the at least two element groups in the fourth direction.

14. The electro-optical device according to claim 12, wherein the second direction is inclined relative to the fourth direction.

15. The electro-optical device according to claim 14, wherein an interval in the fourth direction between at least two of the electro-optical elements aligned in the fourth direction in each of the element regions is smaller than an interval in the fourth direction between at least two of the electro-optical elements aligned in the fourth direction across two of the element regions adjoining in the first direction.

16. The electro-optical device according to claim 14, wherein at least two of the element groups included in each of the element regions are arranged in a fifth direction, the fifth direction crossing the second direction and being inclined relative to the first direction.

17. The electro-optical device according to claim 16, wherein the third direction is the same as the fifth direction.

18. The electro-optical device according to claim 16, wherein the third direction is different from the fifth direction.

* * * * *